(12) United States Patent
Kim et al.

(10) Patent No.: US 11,342,525 B2
(45) Date of Patent: May 24, 2022

(54) DISPLAY DEVICE

(71) Applicant: Samsung Display Co., Ltd., Yongin-si (KR)

(72) Inventors: Yo Han Kim, Seoul (KR); Yoon Hyeung Cho, Yongin-si (KR); Yong Tack Kim, Yongin-si (KR); Jong Jin Park, Cheonan-si (KR); Seung In Baek, Seongnam-si (KR); Yun Ah Chung, Seoul (KR); Young Cheol Joo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 96 days.

(21) Appl. No.: 16/583,136

(22) Filed: Sep. 25, 2019

(65) Prior Publication Data

US 2020/0161579 A1 May 21, 2020

(30) Foreign Application Priority Data

Nov. 19, 2018 (KR) .......................... 10-2018-0142902

(51) Int. Cl.
*H01L 51/50* (2006.01)
*H01L 27/32* (2006.01)

(52) U.S. Cl.
CPC ........ *H01L 51/5036* (2013.01); *H01L 27/322* (2013.01); *H01L 27/3211* (2013.01); *H01L 27/3272* (2013.01); *H01L 2251/308* (2013.01)

(58) Field of Classification Search
CPC . H01L 27/3241–3297; H01L 51/50–56; H01L 51/0032–0095;

(Continued)

(56) References Cited

U.S. PATENT DOCUMENTS

2014/0306193 A1* 10/2014 Lee .................... H01L 51/5275
257/40
2014/0346535 A1 11/2014 Son
(Continued)

FOREIGN PATENT DOCUMENTS

EP 2731156 A2 5/2014
EP 3232488 A1 10/2017
(Continued)

OTHER PUBLICATIONS

EPO Extended Search Report dated Apr. 7, 2020, for corresponding European Patent Application No. EP 19210139.2, 8 pages.

*Primary Examiner* — Jonathan Han
(74) *Attorney, Agent, or Firm* — Lewis Roca Rothgerber Christie LLP

(57) ABSTRACT

A display device is provided. The display device includes a plurality of pixels; a first base; an organic light emitting element on the first base and in each of the pixels; a second base facing the first base; and a filling pattern layer between the organic light emitting elements and the second base, the filling pattern layer including a first pattern portion and a second pattern portion alternately arranged along a same direction in a plan view, wherein the first pattern portion is in each of the pixels, the second pattern portion is at a boundary of each of the pixels and contacts the first pattern portion, and a refractive index of the second pattern portion is smaller than that of the first pattern portion.

21 Claims, 32 Drawing Sheets

(58) Field of Classification Search
CPC ... H01L 27/3202–3204; H01L 27/3209; H01L 27/3225–3234; H01L 51/5036; H01L 27/3211; H01L 27/322; H01L 27/3272; H01L 2251/308; H01L 27/3244; H01L 51/5284; H01L 51/5271; H01L 27/3246; H01L 27/3262; H01L 51/5275
See application file for complete search history.

(56) References Cited

U.S. PATENT DOCUMENTS

| | | | |
|---|---|---|---|
| 2016/0033823 A1* | 2/2016 | Lee | G02F 1/133617 349/71 |
| 2016/0042702 A1* | 2/2016 | Hirakata | G09G 3/36 345/205 |
| 2016/0079311 A1* | 3/2016 | Lim | H01L 27/3211 257/40 |
| 2016/0087245 A1* | 3/2016 | Park | H01L 51/5275 257/40 |
| 2017/0235191 A1* | 8/2017 | Jang | G02F 1/133504 349/64 |
| 2017/0269435 A1* | 9/2017 | Yoon | G02F 1/133528 |
| 2018/0088404 A1 | 3/2018 | Chae et al. | |

FOREIGN PATENT DOCUMENTS

| | | |
|---|---|---|
| EP | 3343662 A1 | 7/2018 |
| JP | 2015-144107 A | 8/2015 |
| KR | 10-2009-0040321 A | 4/2009 |
| KR | 10-2009-0122022 A | 11/2009 |
| KR | 10-2014-0090911 A | 7/2014 |

* cited by examiner

FIG. 28
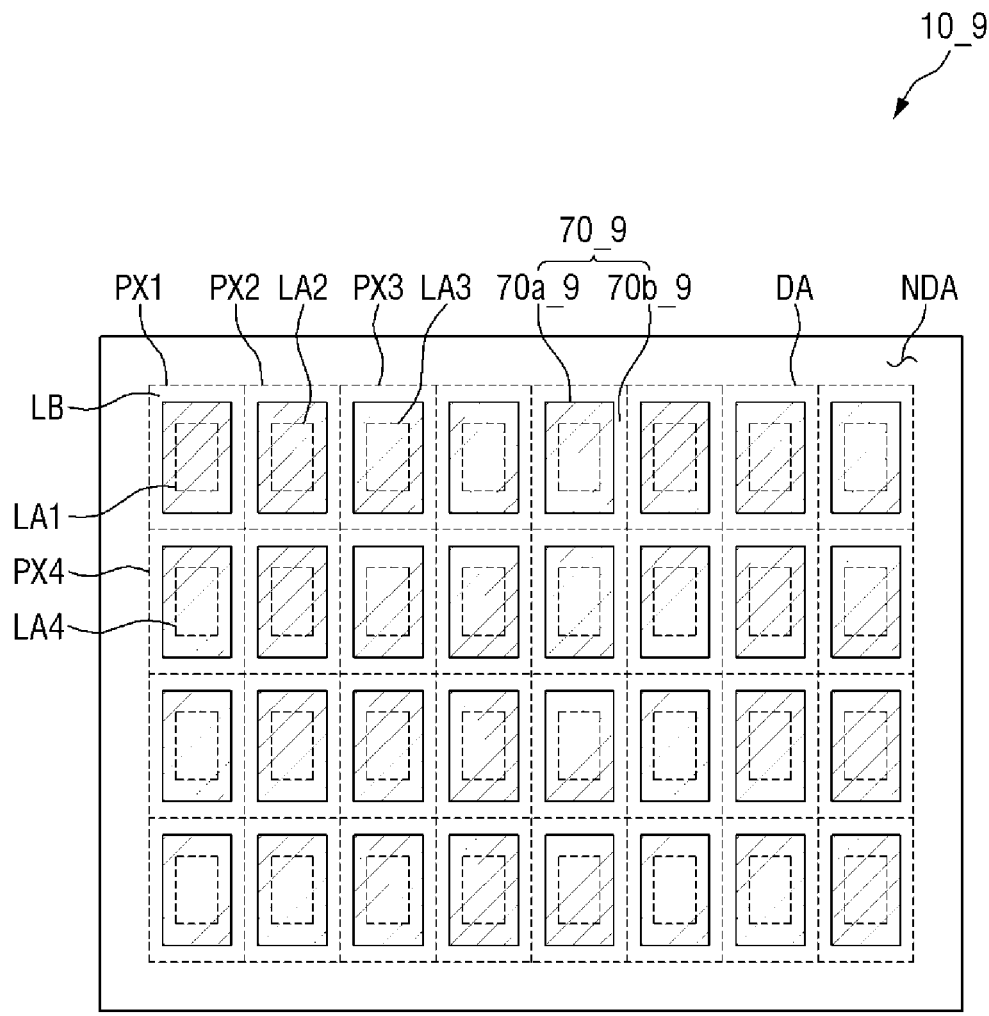
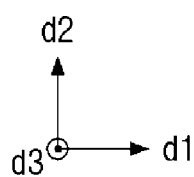

DISPLAY DEVICE

CROSS-REFERENCE TO RELATED APPLICATION

This application claims priority to and the benefit of Korean Patent Application No. 10-2018-0142902, filed on Nov. 19, 2018 in the Korean Intellectual Property Office, the entire content of which is incorporated herein by reference.

BACKGROUND

1. Field

Embodiments of the present disclosure relate to a display device.

2. Description of the Related Art

With the development of multimedia, display devices are becoming increasingly important. Accordingly, various display devices such as, for example, liquid crystal display devices (LCDs) and organic light emitting diode display devices (OLEDs) are being developed.

Of these display devices, OLED devices include an organic light emitting element, which is a self-luminous element. The organic light emitting element may include two electrodes facing each other and an organic light emitting layer interposed between the two electrodes. Electrons and holes provided from the two electrodes may be recombined in the light emitting layer to generate excitons. As the generated excitons change from an excited state to a ground state, light may be emitted.

Since OLEDs do not need a light source, they are low in power consumption, can be made lightweight and thin, and have a wide viewing angle, high luminance and contrast and fast response speed. Due to these high-quality characteristics, OLEDs are drawing attention as next-generation display devices.

SUMMARY

Aspects of embodiments of the present disclosure provide a display device having improved luminance and color reproducibility by preventing or reducing color mixing between subpixels.

However, aspects of embodiments of the present disclosure are not restricted to those set forth herein. The above and other aspects of embodiments of the present disclosure will become more apparent to one of ordinary skill in the art to which the present disclosure pertains by referencing the detailed description of the present disclosure given below.

According to an aspect of embodiments of the present disclosure, a display device includes a plurality of pixels; a first base; an organic light emitting element on the first base and in each of the pixels; a second base facing the first base; and a filling pattern layer between the organic light emitting elements and the second base, the filling pattern layer including a first pattern portion and a second pattern portion alternately arranged along a same direction in a plan view, wherein the first pattern portion is in each of the pixels, the second pattern portion is at a boundary of each of the pixels and contacts the first pattern portion, and a refractive index of the second pattern portion is smaller than that of the first pattern portion.

In an exemplary embodiment, the pixels include a first pixel configured to emit light of a first color, a second pixel configured to emit light of a second color, and a third pixel configured to emit light of a third color.

In an exemplary embodiment, the display device further includes a first wavelength conversion pattern between the second base and the filling pattern layer in the first pixel; a second wavelength conversion pattern between the second base and the filling pattern layer in the second pixel; and a light transmission pattern between the second base and the filling pattern layer in the third pixel.

In an exemplary embodiment, the organic light emitting elements include a first organic light emitting element in the first pixel and configured to emit light of the third color, a second organic light emitting element in the second pixel and configured to emit light of the third color, and a third organic light emitting element in the third pixel and configured to emit light of the third color.

In an exemplary embodiment, the light of the first color has a peak wavelength in a range of 610 nm to 670 nm, the light of the second color has a peak wavelength in a range of 510 nm to 550 nm, and the light of the third color has a peak wavelength in a range of 440 nm to 470 nm.

In an exemplary embodiment, the display device further includes a first color filter between the first base and the first wavelength conversion pattern and configured to transmit the light of the first color while blocking the other light; a second color filter between the first base and the second wavelength conversion pattern and configured to transmit the light of the second color while blocking the other light; and a third color filter between the first base and the light transmission pattern and configured to transmit the light of the third color while blocking the other light.

In an exemplary embodiment, each of the first wavelength conversion pattern, the second wavelength conversion pattern, and the light transmission pattern includes a base resin and a scatterer dispersed in the base resin, the first wavelength conversion pattern includes a first wavelength conversion material, and the second wavelength conversion pattern includes a second wavelength conversion material.

In an exemplary embodiment, the scatterer includes at least one of titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$).

In an exemplary embodiment, a difference in refractive index between the first pattern portion and the second pattern portion is 0.3 or more.

In an exemplary embodiment, the second pattern portion includes a layer including air.

In an exemplary embodiment, the display device further includes a light shielding member which is on the second base, wherein the light shielding member is at the boundary of each of the pixels, and at least partially overlaps the second pattern portion, and wherein the light shielding member includes an organic material.

In an exemplary embodiment, the light shielding member includes a color filter portion and a light shielding portion on the color filter portion, and wherein the color filter portion is configured to transmit blue light while blocking the other light, and the light shielding portion blocks all light.

In an exemplary embodiment, the first pattern portion includes a first attachment surface attached to the first base and a second attachment surface parallel (e.g., substantially parallel) to the first attachment surface and attached to the second base.

In an exemplary embodiment, the area of the first attachment surface is equal to that of the second attachment surface.

In an exemplary embodiment, at least a portion of the first pattern portion overlaps the light shielding member, and side surfaces of the first pattern portion are curved.

In an exemplary embodiment, the area of the first attachment surface is larger than that of the second attachment surface, a cross section of the first pattern portion is trapezoidal, and an angle formed by the first attachment surface and each side surface of the first pattern portion in cross section is an acute angle.

In an exemplary embodiment, at least one of the side surfaces of the first pattern portion is curved. According to another aspect of embodiments of the present disclosure, a display device includes a first substrate including an organic light emitting element; a second substrate facing the first substrate and having a first light outputting region and a non-light outputting region; and a filling pattern layer between the first substrate and the second substrate, wherein the second substrate includes a first wavelength conversion pattern in the first light outputting region that is configured to wavelength-convert light of a first color into light of a second color, and the filling pattern layer includes a first pattern portion overlapping the first wavelength conversion pattern and a second pattern portion that surrounds the first pattern portion and is in the non-light outputting region.

In an exemplary embodiment, a second light outputting region is defined in a first direction of the first light outputting region, the second substrate includes a second wavelength conversion pattern configured to wavelength-convert the light of the first color into light of a third color, the first pattern portion overlaps the second wavelength conversion pattern, a third light outputting region is defined in the first direction of the second light outputting region, the second substrate includes a light transmission pattern in the third light outputting region, and the first pattern portion overlaps the light transmission pattern.

In an exemplary embodiment, a fourth light outputting region is defined in a second direction of the first light outputting region, the second substrate includes a third wavelength conversion pattern in the fourth light outputting region, the third wavelength conversion pattern is configured to wavelength-convert the light of the first color into the light of the second color, and the first pattern portion is in the non-light outputting region between the first light outputting region and the fourth light outputting region, and wherein the second direction is perpendicular (e.g., substantially perpendicular) to the first direction in a plan view.

BRIEF DESCRIPTION OF THE DRAWINGS

These and/or other aspects will become apparent and more readily appreciated from the following description of the embodiments, taken in conjunction with the accompanying drawings in which:

FIGS. 28-32 are plan views of first substrates and filling pattern layers formed on the first substrates according to various embodiments;

DETAILED DESCRIPTION

The subject matter of the present disclosure will now be described more fully hereinafter with reference to the accompanying drawings, in which embodiments of the disclosure are shown. The subject matter of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. In addition, it will also be understood that when an element or layer is referred to as being "between" two elements or layers, it can be the only element or layer between the two elements or layers, or one or more intervening elements or layers may also be present. The same reference numbers indicate the same components throughout the specification.

Hereinafter, embodiments of the present disclosure will be described with reference to the accompanying drawings.

Figure 1:
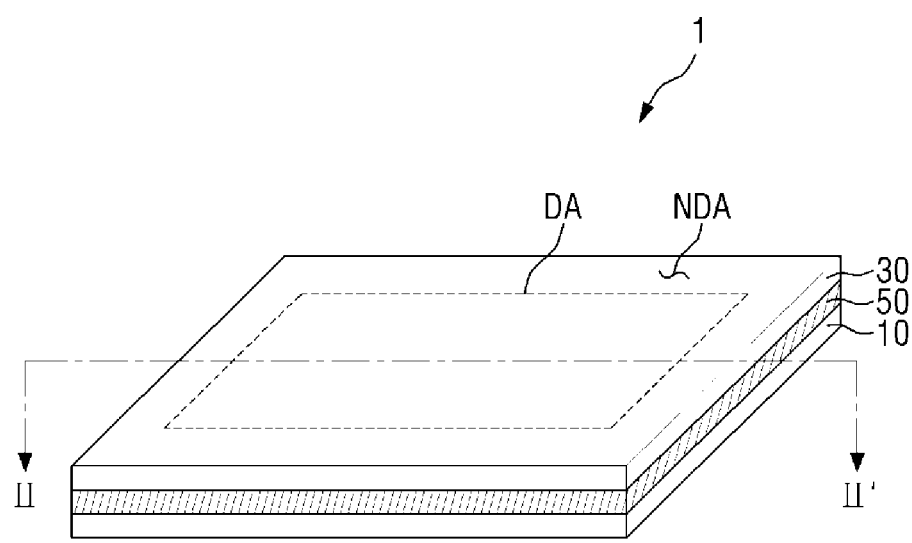
FIG. 1 is a perspective view of a display device according to an embodiment.
Figure 2:
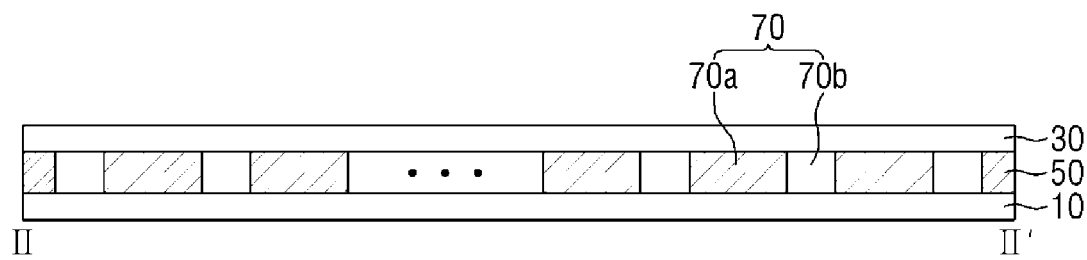
FIG. 2 is a schematic cross-sectional view of the display device, taken along line II-II' of FIG. 1.
Figure 3:
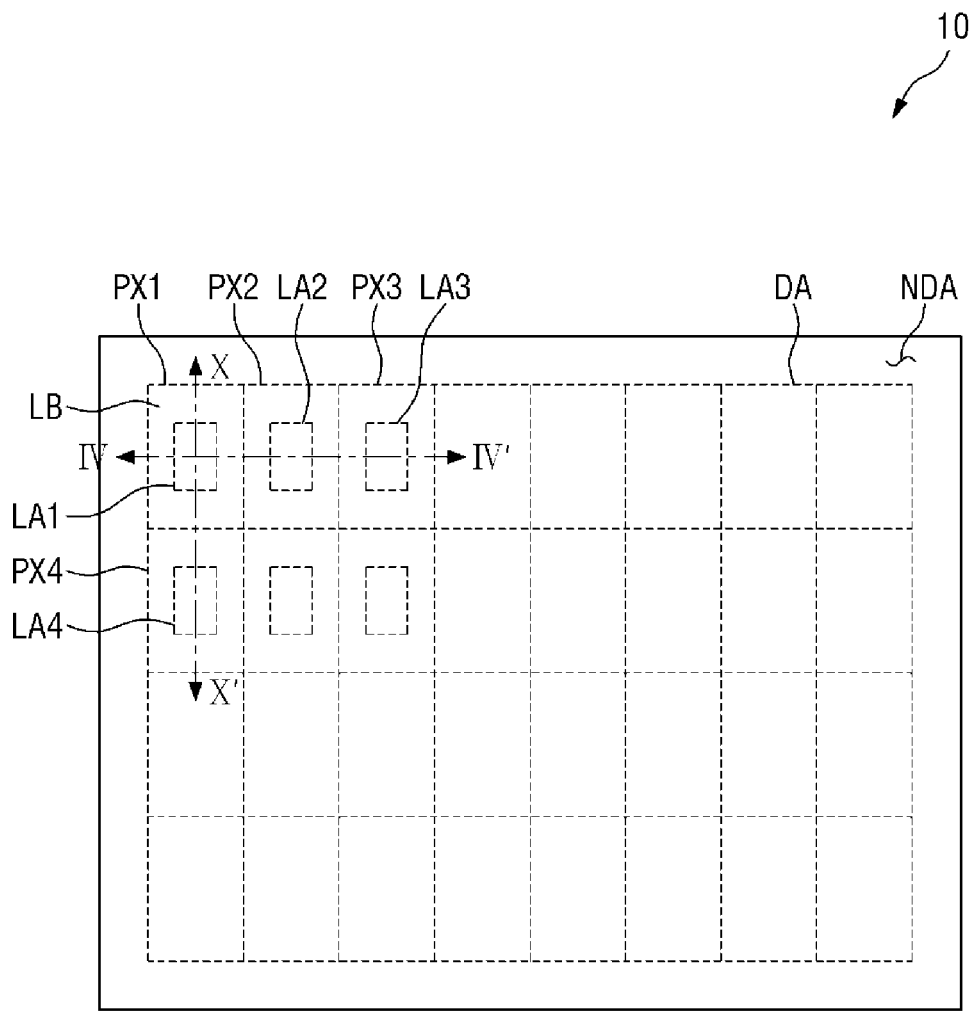
FIG. 3 is a schematic plan view of the display device illustrated in FIGS. 1 and 2.

FIG. 1 is a perspective view of a display device 1 according to an embodiment. FIG. 2 is a schematic cross-sectional view of the display device 1, taken along line II-II' of FIG. 1. FIG. 3 is a schematic plan view of the display device 1 illustrated in FIGS. 1 and 2.

Referring to FIGS. 1-3, the display device 1 is applicable to various suitable electronic devices including small and medium-sized electronic devices such as, for example, a tablet personal computer (PC), a smartphone, a car navigation unit, a camera, a center information display (CID)

provided in a car, a wristwatch-type electronic device, a personal digital assistant (PDA), a portable multimedia player (PMP) and a game machine and medium and large-sized electronic devices such as, for example, a television, an external billboard, a monitor, a PC and a notebook computer. However, these are just examples, and the display device 1 is also applicable to other electronic devices without departing from the spirit and scope of the present disclosure.

In some embodiments, the display device 1 may be rectangular in a plan view. The display device 1 may include both short sides extending in a direction and both long sides extending in another direction different from the above direction. In a plan view, corners at which the long and short sides of the display device 1 meet may be right-angled, but may also be rounded. The planar shape of the display device 1 is not limited to the above examples and may also be a square, a circle, an ellipse, or other shapes.

The display device 1 may include a display area DA which displays an image and a non-display area NDA which does not display an image.

The display area DA may be located in a central portion of the display device 1. The display area DA may include a plurality of pixels. The pixels may include a first pixel PX1 which emits light of a first color (e.g., red light having a peak wavelength in the range of about 610 nm to about 650 nm), a second pixel PX2 which emits light of a second color (e.g., green light having a peak wavelength in the range of about 510 nm to about 550 nm), and a third pixel PX3 which emits light of a third color (e.g., blue light having a peak wavelength in the range of about 430 nm to about 470 nm). The first pixel PX1, the second pixel PX2, and the third pixel PX3 may be alternately arranged along a matrix direction. The first pixel PX1, the second pixel PX2, and the third pixel PX3 may be arranged in various suitable patterns such as, for example, a stripe pattern and a pentile pattern.

The first pixel PX1, the second pixel PX2, and the third pixel PX3 may respectively include a first light emitting region LA1, a second light emitting region LA2, and a third light emitting region LA3, and each include a non-light emitting region LB. Each of the first light emitting region LA1, the second light emitting region LA2, and the third light emitting region LA3 is defined as a region where light is emitted from an organic layer, and the non-light emitting region LB is defined as a region where light emission of an organic layer does not occur. The non-light emitting region LB may surround each of the first light emitting region LA1, the second light emitting region LA2, and the third light emitting region LA3. Each of the first light emitting region LA1, the second light emitting region LA2, and the third light emitting region LA3 may be separated from the non-light emitting region LB by a bank layer which will be described herein below.

The wavelength of light output from each of the first pixel PX1, the second pixel PX2, and the third pixel PX3 may be adjusted not only by light emitted from the first light emitting region LA1, the second light emitting region LA2, and the third light emitting region LA3, respectively, but also by a wavelength conversion pattern or a color filter overlapping the first light emitting region LA1, the second light emitting region LA2, and the third light emitting region LA3, respectively. For example, the first light emitting region LA1 of the first pixel PX1, the second light emitting region PA2 of the second pixel PX2, and the third light emitting region LA3 of the third pixel PX3 may all emit light of the same (e.g., substantially the same) wavelength (e.g., blue light). However, the color of the emitted light may be changed to the output color of a corresponding pixel by a wavelength conversion pattern and/or a color filter in the corresponding pixel.

The non-display area NDA may be outside the display area DA and surround the display area DA. The non-display area NDA may not include a light emitting region or may include a dummy light emitting region having substantially the same structure as a light emitting region but controlled not to emit light. In some embodiments, the non-display area NDA may include a light emitting region, but light emitted from the light emitting region in a display direction may be blocked by a light shielding member.

As for the schematic stacked structure of the display device 1, the display device 1 may include a first substrate 10, a second substrate 30 facing the first substrate 10, a filling pattern layer 70 interposed between the first substrate 10 and the second substrate 30, and a sealing portion 50 at edges of the first substrate 10 and the second substrate 30 to bond the first substrate 10 and the second substrate 30 together.

The first substrate 10 may include elements and circuits (e.g., pixel circuits such as, for example, switching elements) for displaying an image, a bank layer defining the first light emitting region LA1, the second light emitting region LA2, the third light emitting region LA3, and the non-light emitting region LB in the display area DA, and organic light emitting elements. The first substrate 10 may be a display substrate.

The second substrate 30 is located above the first substrate 10 and faces the first substrate 10. The second substrate 30 may be, but is not limited to, a color conversion substrate including color conversion patterns that convert the color of incident light.

The sealing portion 50 may be located between the first substrate 10 and the second substrate 30 in the non-display area NDA. The sealing portion 50 may be in the non-display area NDA along the edges of the first substrate 10 and the second substrate 30 to surround the display area DA in a plan view. The first substrate 10 and the second substrate 30 may be bonded to each other by the sealing portion 50. The sealing portion 50 may include, but is not limited to, an organic material such as, for example, epoxy resin.

The filling pattern layer 70 may be located in a space between the first substrate 10 and the second substrate 30 surrounded by the sealing portion 50. The filling pattern layer 70 may fill the space between the first substrate 10 and the second substrate 30. The filling pattern layer 70 may be made of a light transmitting material.

The filling pattern layer 70 may include a first pattern portion 70a and a second pattern portion 70b. The first pattern portion 70a and the second pattern portion 70b may be alternately arranged along a first direction d1 and a second direction d2. The first pattern portion 70a and the second pattern portion 70b may be made of materials having different refractive indices. The second pattern portion 70b may surround the first pattern portion 70a in a plan view.

For example, the first pattern portion 70a may be a high refractive pattern having a higher refractive index than the second pattern portion 70b, and the second pattern portion 70b may be a low refractive pattern having a lower refractive index than the first pattern portion 70a. The first pattern portion 70a may include a high refractive organic material such as, but not limited to, a silicon-based organic material, an epoxy-based organic material, and/or an epoxy-acrylic based organic material. In some embodiments, the first pattern portion 70a may include silicone rubber. In addition, the second pattern portion 70b may be an air layer (e.g., a layer including atmospheric air) or may be a gas layer containing an inert gas (e.g., nitrogen or argon) or various kinds of gas mixtures. The shape and manufacturing method of the filling pattern layer 70 will be described herein below.

The structure of the display device 1 will now be described in more detail with reference to FIGS. 4-8.

Figure 4:
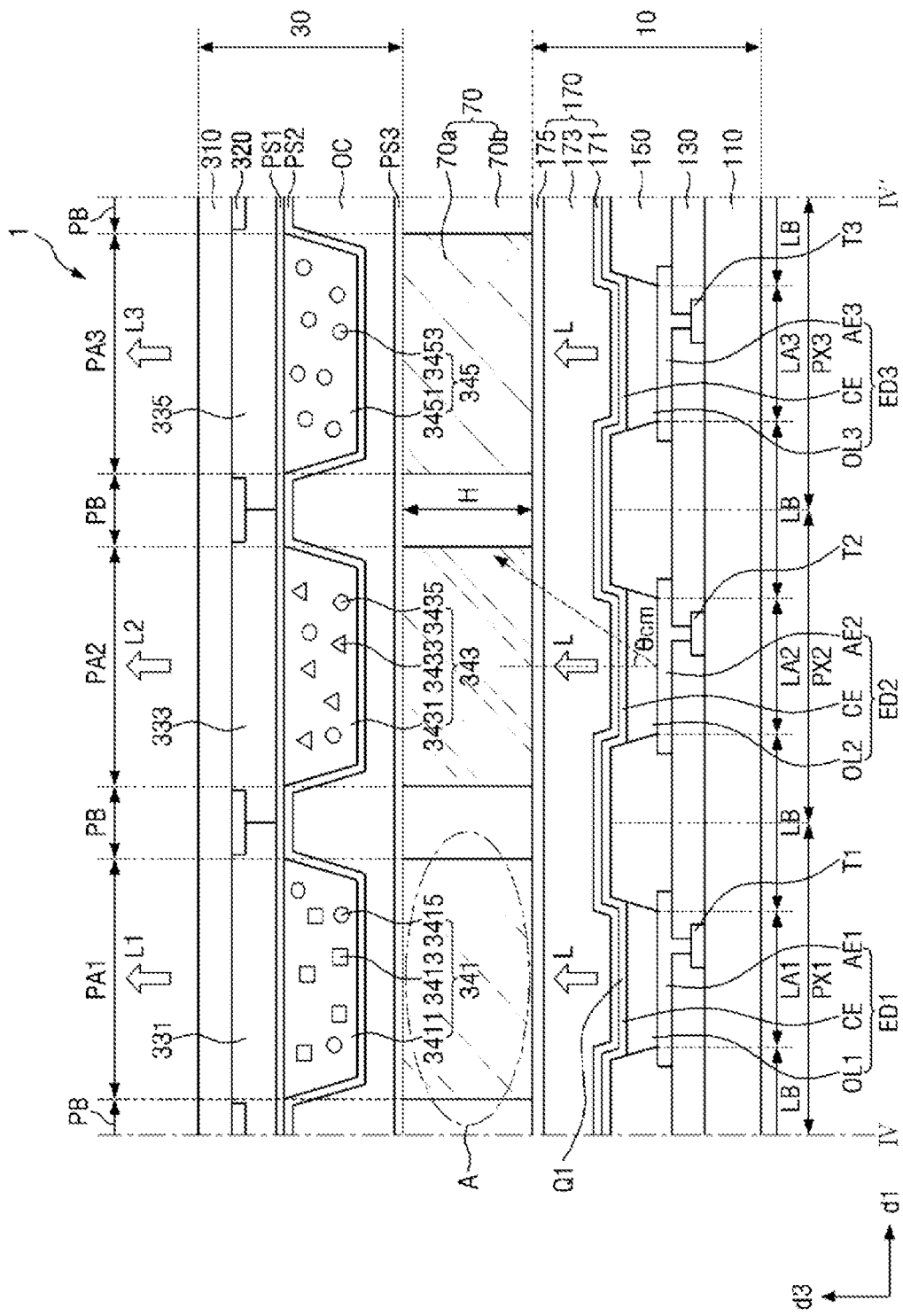
FIG. 4 is a cross-sectional view of the display device according to the embodiment, taken along line IV-IV' of FIG. 3.
Figure 5:
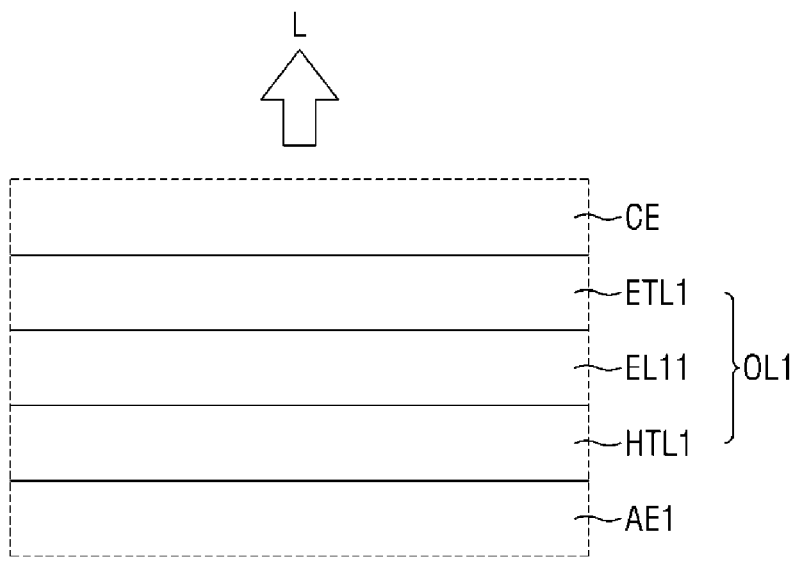
FIG. 5 is an enlarged cross-sectional view of portion Q1 of FIG. 4.
Figure 6:
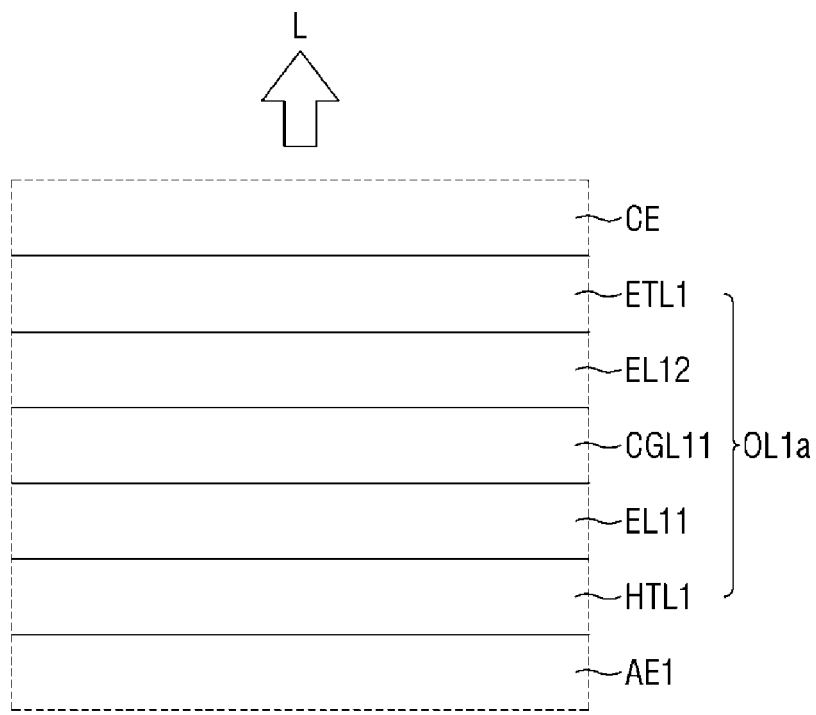
FIG. 6 is a cross-sectional view of a modified example of the structure illustrated in FIG. 5.
Figure 7:
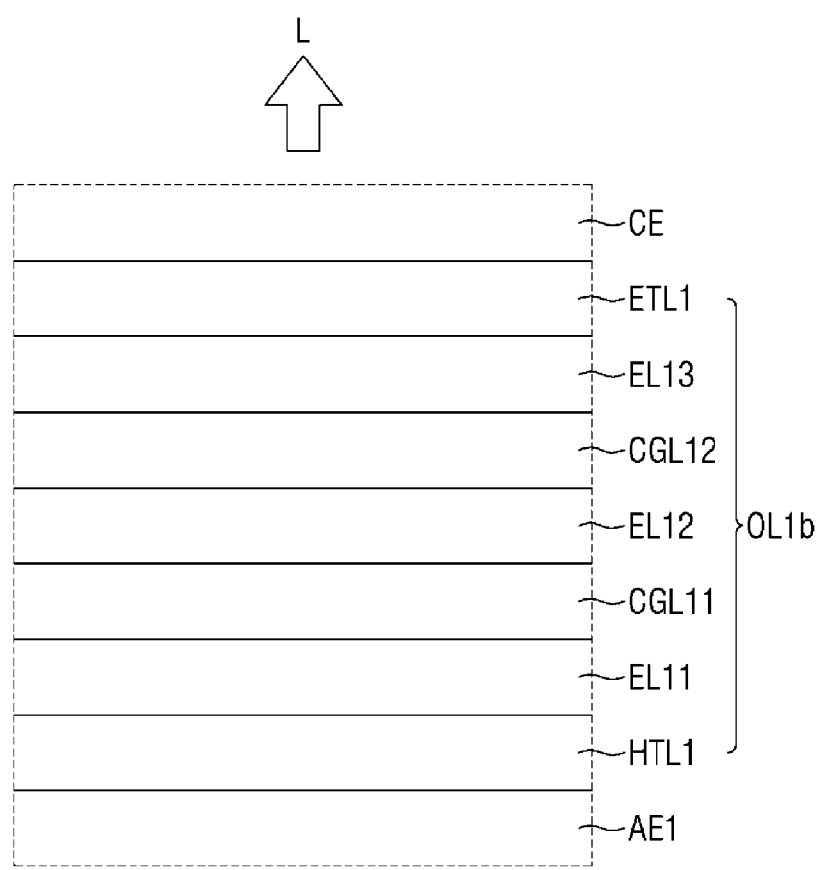
FIG. 7 is a cross-sectional view of a modified example of the structure illustrated in FIG. 5.
Figure 8:
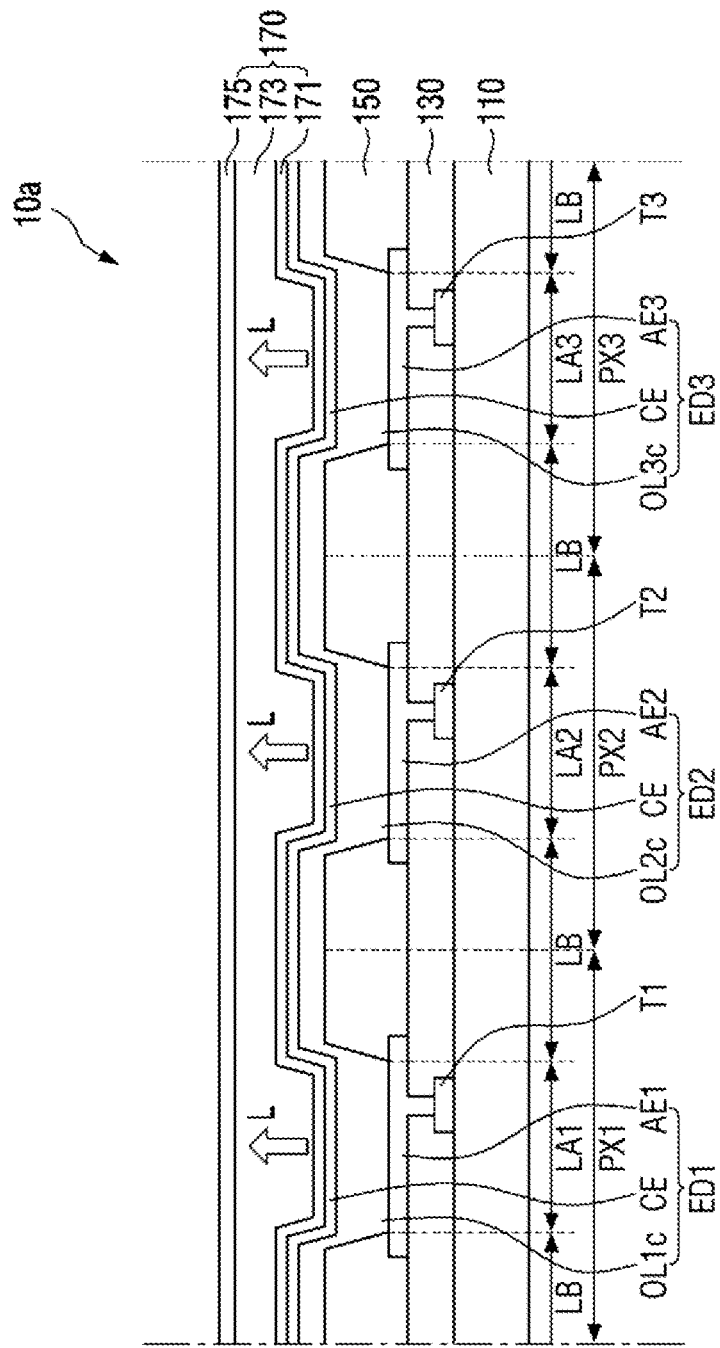
FIG. 8 is a cross-sectional view of a first substrate according to an embodiment.

FIG. 4 is a cross-sectional view of the display device 1 according to the embodiment, taken along line IV-IV' of FIG. 3. FIG. 5 is an enlarged cross-sectional view of portion Q1 of FIG. 4. FIG. 6 is a cross-sectional view of a modified example of the structure illustrated in FIG. 5. FIG. 7 is a cross-sectional view of a modified example of the structure illustrated in FIG. 5. FIG. 8 is a cross-sectional view of a first substrate 10a according to an embodiment.

First, referring to FIG. 4, the display device 1 may include the first substrate 10 and the second substrate 30 and may further include the filling pattern layer 70 located between the first substrate 10 and the second substrate 30 as described above.

The first substrate 10 will now be described in more detail.

The first substrate 10 may include a first base 110, a first switching element T1, a second switching element T2, and a third switching element T3, an insulating layer 130, a bank layer 150, a first organic light emitting element ED1, a second organic light emitting element ED2, and a third organic light emitting element ED3, and an encapsulation layer 170.

The first base 110 may be made of a light transmitting material. The first base 110 may be a glass substrate or a plastic substrate.

At least one selected from a first switching element T1, a second switching element T2, and a third switching element T3 may be on the first base 110 in the first pixel PX1, the second pixel PX2, the third pixel PX3, respectively. In some embodiments, a plurality of signal lines (e.g., a gate line, a data line, a power supply line, etc.) for transmitting signals to the first switching element T1, the second switching element T2, or the third switching element T3 may be further on the first base 110.

The insulating layer 130 may be on the first switching element T1, the second switching element T2, and the third switching element T3. The insulating layer 130 may be made of an organic layer. For example, the insulating layer 130 may include acrylic resin, epoxy resin, imide resin, and/or ester resin.

A first pixel electrode AE1, a second pixel electrode AE2, and a third pixel electrode AE3 may be on the insulating layer 130 in the first pixel PX1, the second pixel PX2, and the third pixel PX3, respectively. The first pixel electrode AE1, the second pixel electrode AE2, and the third pixel electrode AE3 may be located within the first light emitting region LA1, the second light emitting region LA2, and the third light emitting region LA3, respectively, but at least a portion of each of the first pixel electrode AE1, the second pixel electrode AE2, and the third pixel electrode AE3 may extend to a non-light emitting region LB. The first pixel electrode AE1, the second pixel electrode AE2, and the third pixel electrode AE3 may be coupled to the first switching element T1, the second switching element T2, and the third switching element T3, respectively, through via holes passing through the insulating layer 130, respectively.

In an embodiment, each of the first pixel electrode AE1, the second pixel electrode AE2, and the third pixel electrode AE3 may be an anode of an organic light emitting element. The first pixel electrode AE1, the second pixel electrode AE2, and the third pixel electrode AE3 may be made of a high work function material into which holes can be easily injected, such as, for example, indium tin oxide (ITO), indium zinc oxide (IZO), zinc oxide (ZnO), and/or indium oxide ($In_2O_3$). If the display device 1 is a top emission display device, the first pixel electrode AE1, the second pixel electrode AE2, and the third pixel electrode AE3 may further include a reflective metal layer. The reflective metal layer may include, for example, silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), and/or a mixture of the same. In some embodiments, the first pixel electrode AE1, the second pixel electrode AE2, and the third pixel electrode AE3 may have a multilayer structure such as, for example, a two-layer structure of ITO/Ag, Ag/ITO, ITO/Mg or ITO/MgF or a three-layer structure of ITO/Ag/ITO.

The bank layer 150 may be located on the first pixel electrode AE1, the second pixel electrode AE2, and the third pixel electrode AE3. The bank layer 150 is located along the boundaries of the first pixel PX1, the second pixel PX2, and the third pixel PX3. The bank layer 150 may be formed in a lattice shape and include openings, each at least partially exposing the first pixel electrode AE1, the second pixel electrode AE2, and/or the third pixel electrode AE3. As described above, each of the first light emitting region LA1, the second light emitting region LA2, and the third light emitting region LA3 may be separated from the non-light emitting region LB by the bank layer 150. For example, the first pixel electrode AE1, the second pixel electrode AE2, and the third pixel electrode AE3, a region not covered by the bank layer 150 may be the first light emitting region LA1, the second light emitting region LA2, and the third light emitting region LA3, respectively, and a region covered by the bank layer 150 may be the non-light emitting region LB.

The sizes of regions exposed by the openings may be different from each other. For example, the areas of the first light emitting region LA1, the second light emitting region LA2, and the third light emitting region LA3 may be different from each other. In an embodiment, the area of the first light emitting region LA1 may be the largest, the area of the second light emitting region LA2 may be the second largest, and the area of the third light emitting region LA3 may be the smallest. In an embodiment, the areas of the first light emitting region LA1 and the second light emitting region LA2 may be equal to each other, and the area of the third light emitting region LA3 may be the smallest. In some embodiments, the areas of the first light emitting region LA1, the second light emitting region LA2, and the third light emitting region LA3 may be equal to each other.

In some embodiments, the bank layer 150 may include an organic insulating material such as, for example, polyacrylates resin, epoxy resin, phenolic resin, polyamides resin, polyimides resin, unsaturated polyesters resin, polyphenylenethers resin, polyphenylenesulfides resin, and/or benzocyclobutene (BCB).

A first organic layer OL1, a second organic layer OL2, and a third organic layer OL3 may be on the first pixel electrode AE1, the second pixel electrode AE2, and the third pixel electrode AE3, respectively, exposed by the openings of the bank layer 150. The first organic layer OL1, the second organic layer OL2, and the third organic layer OL3 will now be described in more detail with reference to FIGS. 5-7.

Although the stacked structure of only a first organic layer OL1 is illustrated in FIGS. 5-7, other organic layers (e.g., a second organic layer and/or a third organic layer) may also have the same stacked structure as the first organic layer OL1.

Referring to FIG. 5, in an embodiment, the first organic layer OL1 may include a first hole transport layer HTL1 located on the first pixel electrode AE1, a first light emitting layer EL11 located on the first hole transport layer HTL1, and a first electron transport layer ETL1 located on the first light emitting layer EL11. In the current embodiment, the first organic layer OL1 may include one light emitting layer, for example, the first light emitting layer EL11, and the first light emitting layer EL11 may be a blue light emitting layer. However, the stacked structure of the first organic layer OL1 is not limited to the structure of FIG. 5 and can be modified as illustrated in FIGS. 6 and 7.

Referring to FIG. 6, a first organic layer OL1a may further include a first charge generation layer CFL11 located on a first light emitting layer EL11 and a second light emitting layer EL12 located on the first charge generation layer CGL11, and a first charge transport layer ETL1 may be located on the second light emitting layer EL12.

The first charge generation layer CGL11 may inject electric charges into each adjacent light emitting layer. The first charge generation layer CGL11 may adjust the charge balance between the first light emitting layer EL11 and the second light emitting layer EL12. In some embodiments, the first charge generation layer CGL11 may include an n-type charge generation layer and a p-type charge generation layer. The p-type charge generation layer may be on the n-type charge generation layer.

The second light emitting layer EL12 may, but not necessarily, emit blue light, like the first light emitting layer EL11. The second light emitting layer EL12 may emit blue light having the same or different peak wavelength as blue light emitted from the first light emitting layer EL11. In an embodiment, the first light emitting layer EL11 and the second light emitting layer EL12 may emit light of different colors. For example, the second light emitting layer EL12 may emit green light, whereas the first light emitting layer EL11 emits blue light.

Since the first organic layer OL1a structured as described above includes two light emitting layers, it may have better luminous efficiency and a longer life than the structure of FIG. 5.

FIG. 7 shows that a first organic layer OL1b can include a first light emitting layer EL11, a second light emitting layer EL12, and a third light emitting layer EL13 and a first charge generation layer CGL11 and a second charge generation layer CGL12 interposed between the first light emitting layer EL11, the second light emitting layer EL12, and the third light emitting layer EL13. Referring to FIG. 7, the first organic layer OL1b may further include a first charge generation layer CGL11 located on a first light emitting layer EL11, a second light emitting layer EL12 located on the first charge generation layer CGL11, a second charge generation layer CGL12 located on the second light emitting layer EL12, and a third light emitting layer EL13 located on the second charge generation layer CGL12. A first charge transport layer ETL1 may be located on the third light emitting layer EL13.

The third light emitting layer EL13 may emit blue light, like the first light emitting layer EL11 and the second light emitting layer EL12. In an embodiment, each of the first light emitting layer EL11, the second light emitting layer EL12, and the third light emitting layer EL13 may emit blue light. Here, peak wavelengths of the blue light emitted from the first light emitting layer EL11, the second light emitting layer EL12, and the third light emitting layer EL13 may all be the same, or some of the peak wavelengths may be different. In an embodiment, the first light emitting layer EL11, the second light emitting layer EL12, and the third light emitting layer EL13 may emit light of different colors. For example, each light emitting layer may emit blue light or green light. In some embodiments, the light emitting layers may respectively emit red light, green light and blue light, thereby providing white light as a whole.

Referring again to FIG. 4, the first organic layer OL1, the second organic layer OL2, and the third organic layer OL3 may be provided separately in the pixels, respectively. For example, the first organic layer OL1, the second organic layer OL2, and the third organic layer OL3 may respectively be located on the first pixel electrode AE1, the second pixel electrode AE2, and the third pixel electrode AE3 exposed by the openings of the bank layer 150 and may, thus, be separated from each other by the bank layer 150.

For another example, referring to FIG. 8, a first organic layer OL1c, a second organic layer OL2c, and a third organic layer OL3c may be coupled to each other. Even if the first organic layer OL1c, the second organic layer OL2c and the third organic layer OL3c are coupled to each other, since only an organic layer in a region that contacts each of the first pixel electrode AE1, the second pixel electrode AE2, and the third pixel electrode AE3 emits light, there may be no difference (or substantially no difference) in the light emitting region as compared with the embodiment of FIG. 4. However, the embodiment of FIG. 8 can improve process efficiency because a process of separating an organic layer for each pixel is not required.

In some embodiments, some of the stacked layers of each of the first organic layer OL1, the second organic layer OL2, and/or the third organic layer OL3 may be formed separately in each pixel as illustrated in FIG. 4, and the other or others may be formed over the whole surface regardless of the pixels as illustrated in FIG. 8. For example, while a light emitting layer of each organic layer is provided separately in each pixel, a hole transport layer and/or an electron transport layer may be formed as a common layer.

Referring again to FIG. 4, a common electrode CE is on the first organic layer OL1, the second organic layer OL2, and the third organic layer OL3. The common electrode CE may be over the whole surface regardless of the location of the first pixel PX1, the second pixel PX2, and/or the third pixel PX3.

When each of the first pixel electrode AE1, the second pixel electrode AE2, and the third pixel electrode AE3 is an anode of an organic light emitting element, the common electrode CE may be a cathode of the organic light emitting element. The common electrode CE may include a low work function material into which electrons can be easily injected, such as, for example, Li, Ca, LiF/Ca, LiF/Al, Al, Mg, Ag, Pt, Pd, Ni, Au, Nd, Ir, Cr, BaF, Ba, and/or a compound or mixture of the same (e.g., a mixture of Ag and Mg).

When the display device 1 is a top emission display device, the common electrode CE may have transparency or translucency. If the above low work function material is formed to a thickness as small as tens to hundreds of angstroms, the common electrode CE may have transparency or translucency. When a thin metal layer having a low work function is used, the common electrode CE may further include a transparent conductive material stacked on the thin metal layer in order to secure transparency and reduce resistance. The transparent conductive material layer may be tungsten oxide ($W_xO_x$), titanium oxide ($TiO_2$), indium tin oxide (ITO), indium zinc oxide (IZO), zinc oxide (ZnO), indium tin zinc oxide (ITZO), magnesium oxide (MgO), and/or the like.

The first pixel electrode AE1, the first organic layer OL1 and the common electrode CE may constitute a first organic light emitting element ED1, the second pixel electrode AE2, the second organic layer OL2 and the common electrode CE may constitute a second organic light emitting element ED2, and the third pixel electrode AE3, the third organic layer OL3 and the common electrode CE may constitute a third organic light emitting element ED3.

The encapsulation layer 170 is on the common electrode CE. The encapsulation layer 170 may prevent or reduce the introduction of impurities or moisture from the outside. To this end, the encapsulation layer 170 may be on the first organic light emitting element ED1, the second organic light emitting element ED2, and the third organic light emitting element ED3 to encapsulate the first substrate 10.

The encapsulation layer 170 may be over the whole surface regardless of the location of the first pixel PX1, the second pixel PX2, and/or the third pixel PX3. In an embodiment, the encapsulation layer 170 may directly cover the common electrode CE. In an embodiment, a capping layer for covering the common electrode CE may be further between the encapsulation layer 170 and the common electrode CE. In this case, the encapsulation layer 170 may directly cover the capping layer.

The encapsulation layer 170 may include a first encapsulating inorganic layer 171, an encapsulating organic layer 173, and a second encapsulating inorganic layer 175 sequentially stacked on the common electrode CE.

Each of the first encapsulating inorganic layer 171 and the second encapsulating inorganic layer 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), and/or lithium fluoride.

The encapsulating organic layer 173 may be made of acrylic resin, methacrylic resin, polyisoprene, vinyl resin, epoxy resin, urethane resin, cellulose resin, perylene resin, and/or the like.

The stacked structure of the encapsulation layer 170 is not limited to the above example and can be variously changed.

The second substrate 30 will now be described in more detail.

The second substrate 30 may include a second base 310, a light shielding member 320, a first color filter 331, a second color filter 333, a third color filter 335, a first wavelength conversion pattern 341, a second wavelength conversion pattern 343, a light transmission pattern 345, a planarization layer OC, a first capping layer PS1, a second capping layer, and a third capping layer PS3.

A first light outputting region PA1, a second light outputting region PA2, a third light outputting region PA3, and the non-light outputting region PB may be defined on the second substrate 30. Each of the first light outputting region PA1, the second light outputting region PA2, and the third light outputting region PA3 is defined as a region where light is output to the outside, and the non-light outputting region PB is defined as a region where light is not output to the outside, but is blocked. The non-light outputting region PB may surround each of the first light outputting region PA1, the second light outputting region PA2, and the third light outputting region PA3. Each of the first light outputting region PA1, the second light outputting region PA2, and the third light outputting region PA3 may include the above-described first light emitting region LA1, second light emitting region L2, third light emitting LA3, respectively, and at least a portion of the non-light emitting region LB. The non-light outputting region PB may be within the non-light emitting region LB. For example, the areas of the first light outputting region PA1, the second light outputting region PA2, and the third light outputting region PA3 may be larger than those of the first light emitting region LA1, the second light emitting region LA2, and the third light emitting region LA3, respectively, and the area of the non-light outputting region PB may be smaller than that of the non-light emitting region LB.

The areas of the first light outputting region PA1, the second light outputting region PA2, and the third light outputting region PA3 may be different from each other. In an embodiment, the area of the first light outputting region PA1 may be the largest, the area of a second light outputting region PA2 may be the second largest, and the area of a third light outputting region PA3 may be the smallest. In an embodiment, the areas of the first light outputting region PA1 and the second light outputting region PA2 may be equal to each other, and the area of the third light outputting region PA3 may be the smallest. In some embodiments, the areas of the first light outputting region PA1, the second light outputting region PA2, and the third light outputting region PA3 may be equal to each other.

The second base 310 may be made of a light transmitting material. The second base 310 may be a glass substrate or a plastic substrate.

The light shielding member 320 may be on the second base 310. The light shielding member 320 may be located along the boundaries of the first pixel PX1, the second pixel PX2, and the third PX3 and block transmission of light. For example, the light shielding member 320 may be formed in a lattice shape in a plan view and prevent or reduce color mixing due to invasion of light between adjacent ones of the first light outputting region PA1, the second light outputting region PA2, and the third light outputting region PA3. The first light outputting region PA1, the second light outputting region PA2, and the third light outputting region PA3 may be separated from the non-light outputting region PB by the light shielding member 320. For example, regions of the second base 310 which do not overlap the light shielding member 320 may be the first light outputting region PA1, the second light outputting region PA2, and the third light outputting region PA3, and a region of the second base 310 which overlaps the light shielding member 320 may be the non-light outputting region PB.

The light shielding member 320 may be made of an organic material or a metal material including chromium. In some embodiments, the light shielding member 320 may be carbon black and/or an organic black matrix.

The first color filter 331, the second color filter 333, and the third color filter 335 may be on the second base 310 and the light shielding member 320. The first color filter 331 may overlap the first light outputting region PA1, the second color filter 333 may overlap the second light outputting region PA2, and the third color filter 335 may overlap the third light outputting region PA3.

Each of the first color filter 331, the second color filter 333, and the third color filter 335 may transmit light of a set or specific color only and block transmission of light of other colors by absorbing the light. For example, the first color filter 331 may transmit light of the first color but may absorb light of the second color and light of the third color to block the transmission of the light of the second color and the light of the third color. As described above, the light of the first color may be red light, the light of the second color may be green light, and the light of the third color may be blue light. For example, the first color filter 331 may be a red color filter that transmits red light but blocks green light and blue light by absorbing the green light and the blue light and may contain a red colorant.

The second color filter 333 may transmit light of the second color but may absorb light of the first color and light of the third color to block the transmission of the light of the first color and the light of the third color. For example, the second color filter 333 may be a green color filter that transmits green light but blocks red light and blue light by absorbing the red light and the blue light and may contain a green colorant.

The third color filter 335 may transmit light of the third color but may absorb light of the first color and light of the second color to block the transmission of the light of the first color and the light of the second color. For example, the third color filter 335 may be a blue color filter that transmits blue light but blocks red light and green light by absorbing the red light and the green light and may contain a blue colorant.

In some embodiments, a boundary portion between the first color filter 331, the second color filter 333, and the third color filter 335 may be located in the non-light outputting region PB. In addition, the light shielding member 320 may be between the second base 310 and the boundary portion between the first color filter 331, the second color filter 333, and the third color filter 335.

The first capping layer PS1 may be located on the first color filter 331, the second color filter 333, and the third color filter 335. The first capping layer PS1 may prevent or reduce the introduction of impurities such as, for example, moisture or air from the outside and may prevent or reduce damage to or contamination of the first color filter 331, the second color filter 333, and the third color filter 335. In addition, the first capping layer PS1 may prevent or reduce diffusion of a colorant contained in each of the first color filter 331, the second color filter 333, and the third color filter 335 to other elements. In some embodiments, the first capping layer PS1 may be made of an inorganic material. For example, the first capping layer PS1 may be made of silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride.

The first wavelength conversion pattern 341, the second wavelength conversion pattern 343 and the light transmission pattern 345 may be on the first capping layer PS1.

The first wavelength conversion pattern 341 may be in the first light outputting region PA1 and may not be in the second light outputting region PA2 and the third light outputting region PA3. The first wavelength conversion pattern 341 may convert a peak wavelength of incident light into another set or specific peak wavelength and output light having the set or specific peak wavelength. For example, the first wavelength conversion pattern 341 may convert blue light into red light in the range of about 610 nm to about 650 nm and output the red light.

The first wavelength conversion pattern 341 may include a first base resin 3411 and a first wavelength conversion material 3413 dispersed in the first base resin 3411 and may further include a first scatterer 3415 dispersed in the first base resin 3411.

The first base resin 3411 may be any suitable material having high light transmittance and superior dispersion characteristics for the first wavelength conversion material 3413 and the first scatterer 3415. For example, the first base resin 3411 may include an organic material such as, for example, epoxy resin, acrylic resin, cardo resin, and/or imide resin.

The first wavelength conversion material 3413 may convert a peak wavelength of incident light to another set or specific peak wavelength. Examples of the first wavelength conversion material 3413 may include quantum dots, quantum rods, and/or phosphors. For example, a quantum dot may be a particulate material that emits light of a set or specific color when an electron transits from a conduction band to a valence band.

The quantum dot may be a semiconductor nanocrystalline material. The quantum dot may have a set or specific band gap according to its composition and size. Thus, the quantum dot may absorb light and then emit light having a unique wavelength. Examples of a semiconductor nanocrystal of the quantum dot include a group IV nanocrystal, a group II-VI compound nanocrystal, a group III-V compound nanocrystal, a group IV-VI nanocrystal, and combinations of the same.

The group IV nanocrystal may be, but is not limited to, silicon (Si), germanium (Ge), or a binary compound such as, for example, silicon carbide (SiC) and/or silicon germanium (SiGe).

In addition, the group II-VI compound nanocrystal may be, but is not limited to, a binary compound such as, for example, CdSe, CdTe, ZnS, ZnSe, ZnTe, ZnO, HgS, HgSe, HgTe, MgSe, MgS, and/or a combination of the same, a ternary compound such as, for example, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and/or a combination of the same, and/or a quaternary compound such as, for example, HgZnTeS, CdZnSeS, CdZnSeTe, CdZnSTe, CdHgSeS, CdHgSeTe, CdHgSTe, HgZnSeS, HgZnSeTe, HgZnSTe, and/or a combination of the same.

In addition, the group III-V compound nanocrystal may be, but is not limited to, a binary compound such as, for example, GaN, GaP, GaAs, GaSb, AlN, AlP, AlAs, AlSb, InN, InP, InAs, InSb, and/or a combination of the same, a ternary compound such as, for example, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and/or a combination of the same, and/or a quaternary compound such as, for example, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or a combination of the same.

The group IV-VI nanocrystal may be, but is not limited to, a binary compound such as, for example, SnS, SnSe, SnTe, PbS, PbSe, PbTe, and/or a combination of the same, a ternary compound such as, for example, SnSeS, SnSeTe, SnSTe, PbSeS, PbSeTe, PbSTe, SnPbS, SnPbSe, SnPbTe, and/or a combination of the same, and/or a quaternary compound such as, for example, SnPbSSe, SnPbSeTe, SnPbSTe, and/or a combination of the same.

The quantum dot may have a core-shell structure including a core containing the above-described nanocrystal and a shell surrounding the core. The shell of the quantum dot may serve as a protective layer for maintaining semiconductor characteristics by preventing or reducing chemical denaturation of the core and/or as a charging layer for giving electrophoretic characteristics to the quantum dot. The shell may be a single layer or a multilayer. Examples of the shell of the quantum dot include a metal or non-metal oxide, a semiconductor compound, and a combination of the same.

For example, the metal or non-metal oxide may be, but is not limited to, a binary compound such as, for example, $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound such as, for example, $MgAl_2O_4$, $CoFe_2O_4$, $NiFe_2O_4$ and/or $CoMn_2O_4$.

In addition, the semiconductor compound may be, but is not limited to, CdS, CdSe, CdTe, ZnS, ZnSe, ZnTe, GaAs, GaP, GaSb, HgS, HgSe, HgTe, InAs, InP, InSb, AlAs, AlP, and/or AlSb.

Light emitted from the first wavelength conversion material 3413 may have a full width at half maximum (FWHM) of about 45 nm or less, about 40 nm or less, or about 30 nm or less. Therefore, the color purity and color reproducibility of the display device 1 can be improved. In addition, the light emitted from the first wavelength conversion material 3413 may be radiated in various suitable directions regardless of the incident direction of incident light. This can improve the lateral visibility of the display device 1.

A portion of light L emitted from the first organic light emitting element ED1 may be transmitted through the first wavelength conversion pattern 341 without being converted into red light by the first wavelength conversion material 3413. A component incident on the first color filter 331 without being converted by the first wavelength conversion pattern 341 may be blocked by the first color filter 331. On the other hand, red light output from the first wavelength conversion pattern 341 may be transmitted to the outside through the first color filter 331. Accordingly, first light L1 output from the first light outputting region PA1 may be red light.

The first scatterer 3415 may have a refractive index different from that of the first base resin 3411 and form an optical interface with the first base resin 3411. For example, the first scatterer 3415 may be light scattering particles. The first scatterer 3415 may be any suitable material that can scatter at least a portion of transmitted light. For example, the first scatterer 3415 may be metal oxide particles or organic particles. Examples of the metal oxide include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). Examples of the organic particle material include acrylic resin and urethane resin. The first scatterer 3415 may scatter incident light in various suitable directions regardless of the incident direction of the light without substantially changing the wavelength of the light transmitted through the first wavelength conversion pattern 341. Accordingly, this can increase the length of the path of the light transmitted through the first wavelength conversion pattern 341 and increase the color conversion efficiency of the first wavelength conversion material 3413.

In some embodiments, the thickness of the first wavelength conversion pattern 341 may be 3 μm to 15 μm. The content of the first wavelength conversion material 3413 in the first wavelength conversion pattern 341 may be 10% to 60%. In addition, the content of the first scatterer 3415 in the first wavelength conversion pattern 341 may be 2% to 15%.

The second wavelength conversion pattern 343 may be in the second light outputting region PA2 and may not be in the first light outputting region PA1 and the third light outputting region PA3. The second wavelength conversion pattern 343 may convert a peak wavelength of incident light into another set or specific peak wavelength and output light having the set or specific peak wavelength. For example, the second wavelength conversion pattern 343 may convert blue light into green light in the range of about 610 nm to about 650 nm and output the green light.

The second wavelength conversion pattern 343 may include a second base resin 3431 and a second wavelength conversion material 3433 dispersed in the second base resin 3431 and may further include a second scatterer 3435 dispersed in the second base resin 3431.

The second base resin 3431 may be any suitable material having high light transmittance and superior dispersion characteristics for the second wavelength conversion material 3433 and the second scatterer 3435. For example, the second base resin 3431 may include an organic material such as, for example, epoxy resin, acrylic resin, cardo resin, and/or imide resin.

The second wavelength conversion material 3433 may convert a peak wavelength of incident light into another set or specific peak wavelength as described above. For example, the second wavelength conversion material 3433 may convert blue light having a peak wavelength in the range of 430 nm to 470 nm into green light having a peak wavelength in the range of 510 nm to 550 nm.

Examples of the second wavelength conversion material 3433 may include quantum dots, quantum rods, and phosphors. The second wavelength conversion material 3433 is substantially the same or similar to the first wavelength conversion material 3413 described above, and thus, a duplicative description thereof is not repeated here.

The first wavelength conversion material 3413 and the second wavelength conversion material 3433 may all be composed of quantum dots. In this case, the diameter of quantum dots constituting the first wavelength conversion material 3413 may be greater than that of quantum dots constituting the second wavelength conversion material 3433. For example, the quantum dot size of the first wavelength conversion material 3413 may be about 55 angstroms (Å) to about 65 Å. In addition, the quantum dot size of the second wavelength conversion material 3433 may be about 40 Å to about 50 Å.

Light that passed through the first wavelength conversion pattern 341 and the second wavelength conversion pattern 343 may be in an unpolarized state through depolarization. As used herein, the term "unpolarized light" refers to light that is not composed only of polarization components in a set or specific direction, for example, light that is not polarized only in a set or specific direction, in other words, light that is composed of random polarization components. An example of the unpolarized light is natural light.

The second scatterer 3435 may have a refractive index different from that of the second base resin 3431 and form an optical interface with the second base resin 3431. For example, the second scatterer 3435 may be light scattering particles. The second scatterer 3435 is substantially the same or similar to the first scatterer 3415 described above, and thus, a duplicative description thereof is not repeated here.

In some embodiments, the thickness of the second wavelength conversion pattern 343 may be 3 μm to 15 μm. The content of the second wavelength conversion material 3433 in the second wavelength conversion pattern 343 may be 10% to 60%. In addition, the content of the second scatterer 3435 in the second wavelength conversion pattern 343 may be 2% to 15%.

Light L emitted from the second organic light emitting element ED2 may be provided to the second wavelength conversion pattern 343, and the second wavelength conversion material 3433 may convert the light L emitted from the second organic light emitting element ED2 into green light having a single peak wavelength in the range of about 510 nm to about 550 nm and output the green light.

A portion of the light L emitted from the second organic light emitting element ED2 may be transmitted through the second wavelength conversion pattern 343 without being converted into green light by the second wavelength conversion material 3433 and may be blocked by the second color filter 333. On the other hand, of the emitted light L, green light output from the second wavelength conversion pattern 343 may be transmitted to the outside through the second color filter 333. Accordingly, second light L2 output from the second light outputting region PA2 may be green light.

The light transmission pattern 345 may be located in the third light outputting region PA3 and may not be located in the first light outputting region PA1 and the second light outputting region PA2. The light transmission pattern 345 may transmit incident light.

The light transmission pattern 345 may include a third base resin 3451 and a third scatterer 3455 dispersed in the third base resin 3451.

The third base resin 3451 may be made of an organic material having high light transmittance. The third base resin 3451 may be made of the same (e.g., substantially the same) material as the first base resin 3411 or may include at least one of the materials mentioned as examples of the material of the first base resin 3411.

The third scatterer 3455 may have a refractive index different from that of the third base resin 3451 and form an optical interface with the third base resin 3451. For example, the third scatterer 3455 may be light scattering particles. The third scatterer 3455 may be any suitable material that can scatter at least a portion of transmitted light. For example, the third scatterer 3455 may be metal oxide particles or organic particles. Examples of the metal oxide include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). Examples of the organic particle material include acrylic resin and urethane resin. The third scatterer 3455 may scatter incident light in various suitable directions regardless of the incident direction of the light without substantially changing the wavelength of the light transmitted through the light transmission pattern 345. Accordingly, this can improve the lateral visibility of the light transmitted through the light transmission pattern 345.

Light L emitted from the third organic light emitting element ED3 is transmitted to the outside through the light transmission pattern 345 and the third color filter 335. For example, third light L3 output from the third light outputting region PA3 may have the same (e.g., substantially the same) wavelength as the light L, e.g., blue light emitted from the third organic light emitting element ED3.

The areas of the first wavelength conversion pattern 341, the second wavelength conversion pattern 343 and the light transmission pattern 345 respectively corresponding to the first light outputting region PA1, the second light outputting region PA2, and the third light outputting region PA3 may be different from each other. In an embodiment, the area of the first wavelength conversion pattern 341 may be the largest, the area of the second wavelength conversion pattern 343 may be the second largest, and the area of the light transmission pattern 345 may be the smallest. In an embodiment, the areas of the first wavelength conversion pattern 341 and the second wavelength conversion pattern 343 may be equal to each other, and the area of the light transmission pattern 345 may be the smallest. In some embodiments, the areas of the first wavelength conversion pattern 341, the second wavelength conversion pattern 343, and the light transmission pattern 345 may be equal to each other.

In some embodiments, a first low refractive layer may be further between the first capping layer PS1 and the first wavelength conversion pattern 341, the second wavelength conversion pattern 343 and the light transmission pattern 345. The first low refractive layer may be over the first light outputting region PA1, the second light outputting region PA2, the third light outputting region PA3, and the non-light outputting region PB. The first low refractive layer may have a lower refractive index than the first wavelength conversion pattern 341, the second wavelength conversion pattern 343, and the light transmission pattern 345. For example, a difference in refractive index between each of the first wavelength conversion pattern 341, the second wavelength conversion pattern 343 and the light transmission pattern 345 and the first refractive layer may be 0.3 or more. The first low refractive layer may include a base resin and particles dispersed in the base resin. The particles included in the first low refractive layer may be at least any one selected from zinc oxide (ZnO) particles, titanium dioxide ($TiO_2$) particles, hollow silica particles, non-hollow silica particles, nano silicate particles, and porogen particles.

The first low refractive layer may reflect a portion of light, which is emitted from the first wavelength conversion pattern 341 and the second wavelength conversion pattern 343 toward the second base 310, back toward the first wavelength conversion pattern 341 and the second wavelength conversion pattern 343. For example, the first low refractive layer can improve light utilization efficiency and optical efficiency of the display device 1 by recycling at least a portion of light emitted toward the second base 310.

The second capping layer PS2 may be located on the first wavelength conversion pattern 341 and the second wavelength conversion pattern 343. The second capping layer PS2 may cover the first wavelength conversion pattern 341 and the second wavelength conversion pattern 343. In some embodiments, the second capping layer PS2 may be further located on the light transmission pattern 345 and may further cover the light transmission pattern 345. The second capping layer PS2 may seal the first wavelength conversion pattern 341 and the second wavelength conversion pattern 343 together with the first capping layer PS1, thereby preventing or reducing introduction of impurities such as, for example, moisture or air from the outside and thereby preventing or reducing damage to or contamination of the first wavelength conversion pattern 341 and the second wavelength conversion pattern 343. In some embodiments, the second capping layer PS2 may be made of an inorganic material. The second capping layer PS2 may be made of the same (e.g., substantially the same) material as the first capping layer PS1 or may include at least one of the materials mentioned in the description of the first capping layer PS1.

In some embodiments, a filter layer may be further on the first wavelength conversion pattern 341, the second wavelength conversion pattern 343 and the light transmission pattern 345. The filter layer may be a reflective filter that transmits light having a set or specific wavelength region and reflects light having other set or specific wavelength regions. For example, the filter layer may transmit light of the third color and reflect light of the first color and light of the second color.

The filter layer may improve light output efficiency by recycling light of the first color and light of the second color, which are emitted from the first wavelength conversion pattern 341 and the second wavelength conversion pattern 343 toward the first substrate 10, back toward the second base 310. In addition, the filter layer may transmit light of the third color emitted from the organic light emitting elements ED1 through ED3, but reflect light having a central wavelength that is longer than that of the light of the third color, thereby improving the color purity of the light of the third color emitted from the first organic light emitting element ED1, the second organic light emitting element ED2, and the third organic light emitting element ED3.

The planarization layer OC may be further on the second capping layer PS2. When the first wavelength conversion pattern 341, the second wavelength conversion pattern 343 and the light transmission pattern 345 are formed to different thicknesses in a process or when there is a gap between these elements, the planarization layer OC may make the heights of the above elements and the gap generally uniform. If the heights of the elements are generally uniform, the planarization layer OC may be omitted.

The planarization layer OC may be made of any suitable material having planarization characteristics. In an embodiment, the planarization layer OC may include an organic material. Examples of the organic material may include cardo resin, polyimide resin, acrylic resin, siloxane resin, and silsesquioxane resin.

The third capping layer PS3 may be further on the planarization layer OC. The third capping layer PS3 may cover the whole of the planarization layer OC. When the planarization layer OC is omitted as described above, the third capping layer PS3 may also be omitted. The third capping layer PS3 may be made of an inorganic material. The third capping layer PS3 may be made of the same (e.g., substantially the same) material as the first capping layer PS1 or may include at least one of the materials mentioned in the description of the first capping layer PS1.

The filling pattern layer 70 may be in the space between the second substrate 30 and the first substrate 10. The filling pattern layer 70 may be made of a light transmitting material. The filling pattern layer 70 may be between the first substrate 10 and the second substrate 30 to serve as a buffer that enables the first substrate 10 and the second substrate 30 to be stably bonded together. In addition, the filling pattern layer 70 may include the first pattern portion 70a and the second pattern portion 70b to form a path along which light L emitted from the first substrate 10 travels to the second substrate 30 in each of the first light outputting region PA1, the second light outputting region PA2, and the third light outputting region PA3.

The first pattern portion 70a and the second pattern portion 70b of the filling pattern layer 70 may be alternately arranged in a cross sectional view. Generally, the first pattern portion 70a may overlap each of the first light outputting region PA1, the second light outputting region PA2, and the third light outputting region PA3, and the second pattern portion 70b may overlap the non-light outputting region PB. In some embodiments, at least a part of the first pattern portion 70a may overlap the non-light outputting region PB, and at least a part of the second pattern portion 70b may overlap each of the first light outputting region PA1, the second light outputting region PA2, and the third light outputting region PA3.

The first pattern portion 70a and the second pattern portion 70b may be made of materials having different refractive indices. For example, the first pattern portion 70a may include a material having a higher refractive index than the second pattern portion 70b, and the second pattern portion 70b may include a material having a lower refractive index than the first pattern portion 70a.

The first pattern portion 70a may be made of, but not limited to, a silicon-based organic material, an epoxy-based organic material, and/or an epoxy-acrylic based organic material. In some embodiments, the first pattern portion 70a may include silicone rubber. In addition, the second pattern portion 70b may be an air layer (e.g., a layer including atmospheric air) or may be a gas layer containing an inert gas (e.g., nitrogen or argon) or various kinds of gas mixtures.

The first pattern portion 70a may be made of a material having a refractive index greater than 1.5 in order to induce effective total reflection at a boundary surface between the first pattern portion 70a and the second pattern portion 70b. However, the first pattern portion 70a can be made of any suitable material as long as its refractive index is different from that of the second pattern portion 70b by 0.3 or more.

When the second pattern portion 70b includes an air layer (e.g., a layer including atmospheric air) or a gas layer, the refractive index of the second pattern portion 70b may be substantially close to 1.0. For example, the difference in refractive index between the first pattern portion 70a and the second pattern portion 70b may be 0.5 or more, in which case total reflection may occur effectively at the boundary surface between the first pattern portion 70a and the second pattern portion 70b.

In an embodiment, the second pattern portion 70b may include a low refractive material layer, instead of an air layer. The low refractive material layer may be made of a material having a higher refractive index than the air layer and a lower refractive index than the first pattern portion 70a. A second pattern portion including the low refractive material layer will be described in more detail herein below with reference to FIG. 15.

For example, the filling pattern layer 70 may prevent or reducing color mixing of the display device 1 by preventing or reducing the entrance of light L emitted from the first light emitting region LA1 to the second light outputting region PA2 or the third light outputting region PA3 other than the first light outputting region PA1. As the filling pattern layer 70 has a smaller thickness H, the color mixing of the display device 1 can be prevented or reduced more effectively.

An optical path at each boundary surface of the filling pattern layer 70 will now be described in more detail with reference to FIG. 9.

Figure 9:
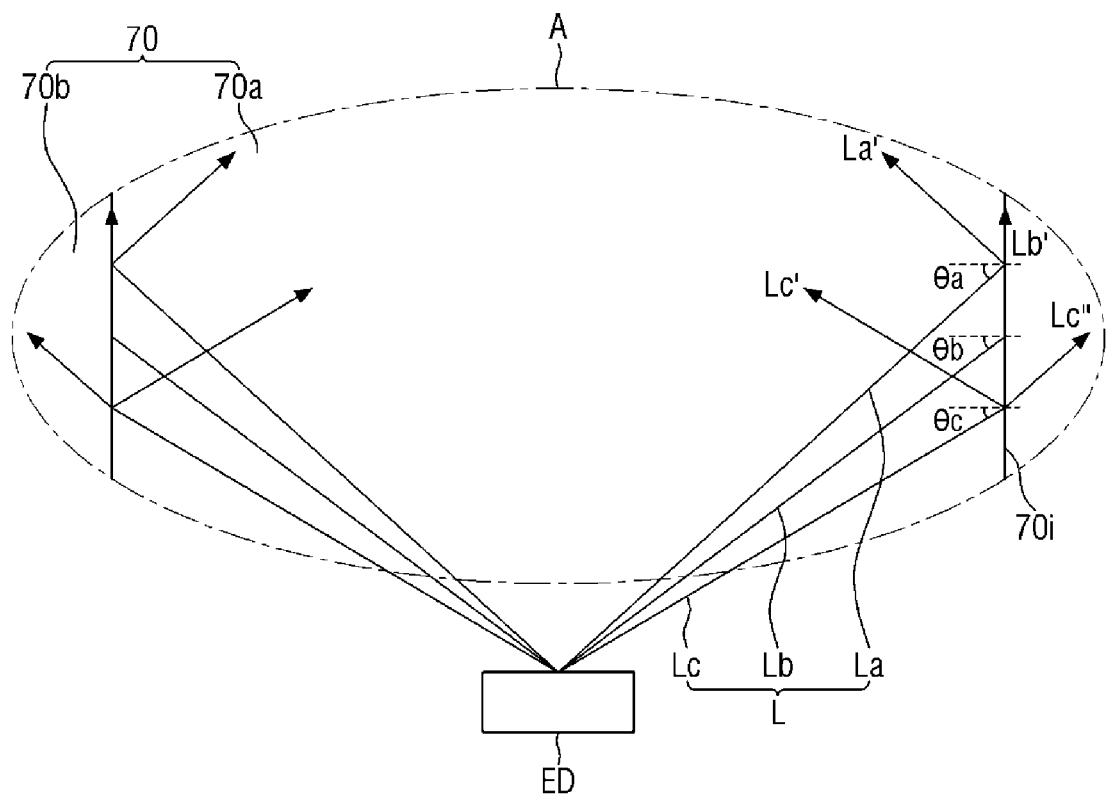
FIG. 9 is a partial enlarged view illustrating an optical path in area A of FIG. 4.

FIG. 9 is a partial enlarged view illustrating an optical path in area A of FIG. 4.

Referring to FIGS. 4 and 9, the first organic light emitting element ED1, the second organic light emitting element ED2, and the third organic light emitting element ED3 may emit blue light L, and the emitted light L may travel toward the second substrate 30. As described above, the filling pattern layer 70 may be between the first substrate 10 and the second substrate 30. In addition, the filling pattern layer 70 may include the first pattern portion 70a and the second pattern portion 70b, and the first pattern portion 70a may overlap each of the first light emitting region LA1, the second light emitting region LA2, and the third light emitting region LA3, and the second pattern portion 70b may overlap the non-light emitting region LB. For example, the light L emitted from each of the first organic light emitting element ED1, the second organic light emitting element ED2, and the third light emitting element ED3 may be incident on the first pattern portion 70a of the filling pattern layer 70.

The light L incident on the first pattern portion 70a may generally travel toward the second substrate 30 within each of the first light outputting region PA1, the second light outputting region PA2, and the third light outputting region PA3. However, some of a first light beam Lc, a second light beam Lb, and/or a third light beam La of the incident light L may travel from the first pattern portion 70a toward the second pattern portion 70b.

The first pattern portion 70a and the second pattern portion 70b may have different refractive indices and may form a boundary surface 70i. If media have different refractive indices on both sides of the boundary surface 70i, an optical interface may be formed, and light incident on the boundary surface 70i may be refracted or reflected. Therefore, the first light beam Lc, the second light beam Lb, and the third light beam La traveling from the first pattern portion 70a having a high refractive index toward the second pattern portion 70b having a low refractive index may be refracted to the second pattern portion 70b or reflected to the first pattern portion 70a.

The directions of the first light beam Lc, the second light beam Lb, and the third light beam La may be respectively determined by first incident angle θc, second incident angle θb, and third incident angle θa of the first light beam Lc, the second light beam Lb, and the third light beam La incident on the boundary surface 70i between the first pattern portion 70a and the second pattern portion 70b. For example, when the first incident angle θc of the first light beam Lc is smaller than a critical angle, first reflected light Lc' may be reflected at the boundary surface 70i, but first transmitted light Lc" may be transmitted to the second pattern portion 70b. When the second incident angle θb of the second light beam Lb is equal to the critical angle, critical light Lb' may travel along the boundary surface 70i without being reflected or refracted. When the third incident angle θa of the third light beam La is greater than the critical angle, third reflected light La' may be totally reflected at the boundary surface 70i to the first pattern portion 70a without being refracted to the second pattern portion 70b. Here, as more light is totally reflected, more light may be concentrated on the first pattern portion 70a.

The critical angle may be determined by the refractive indices of the first pattern portion 70a and the second pattern portion 70b. The critical angle is reduced as the difference between the refractive index of the first pattern portion 70a and the refractive index of the second pattern portion 70b increases. For example, a larger difference in refractive index leads to a smaller critical angle, causing more light to be totally reflected.

Due to the structural or optical characteristics described above, the filling pattern layer 70 can concentrate light on the first pattern portion 70a corresponding to each light emitting region. Thus, an improved light emitting effect can be provided. In addition, since the filling pattern layer 70 minimizes or reduces dispersion of light to the second pattern portion 70b, the color mixing between the first light outputting region PA1, the second light outputting region PA2, and the third light outputting region PA3 can be prevented or reduced.

Figure 33:
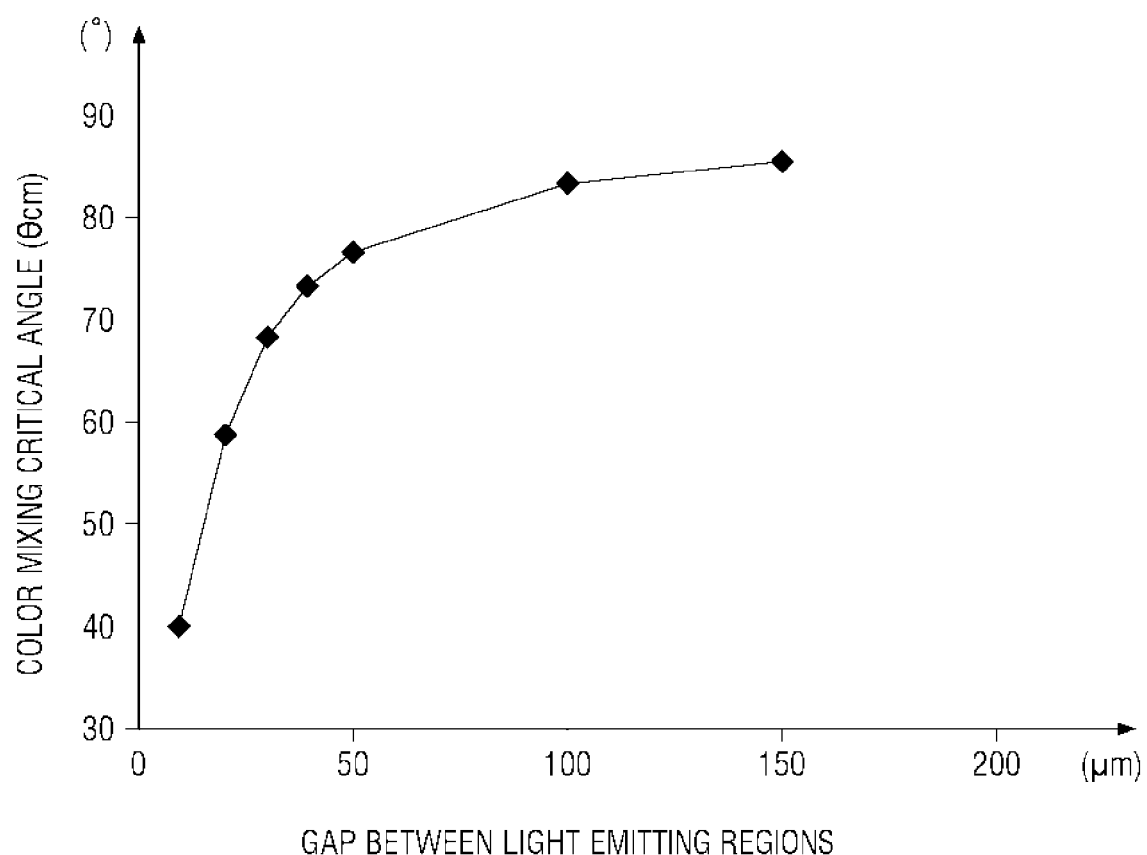
FIG. 33 is a graph schematically illustrating a color mixing critical angle with respect to a gap between light emitting regions.
Figure 34:
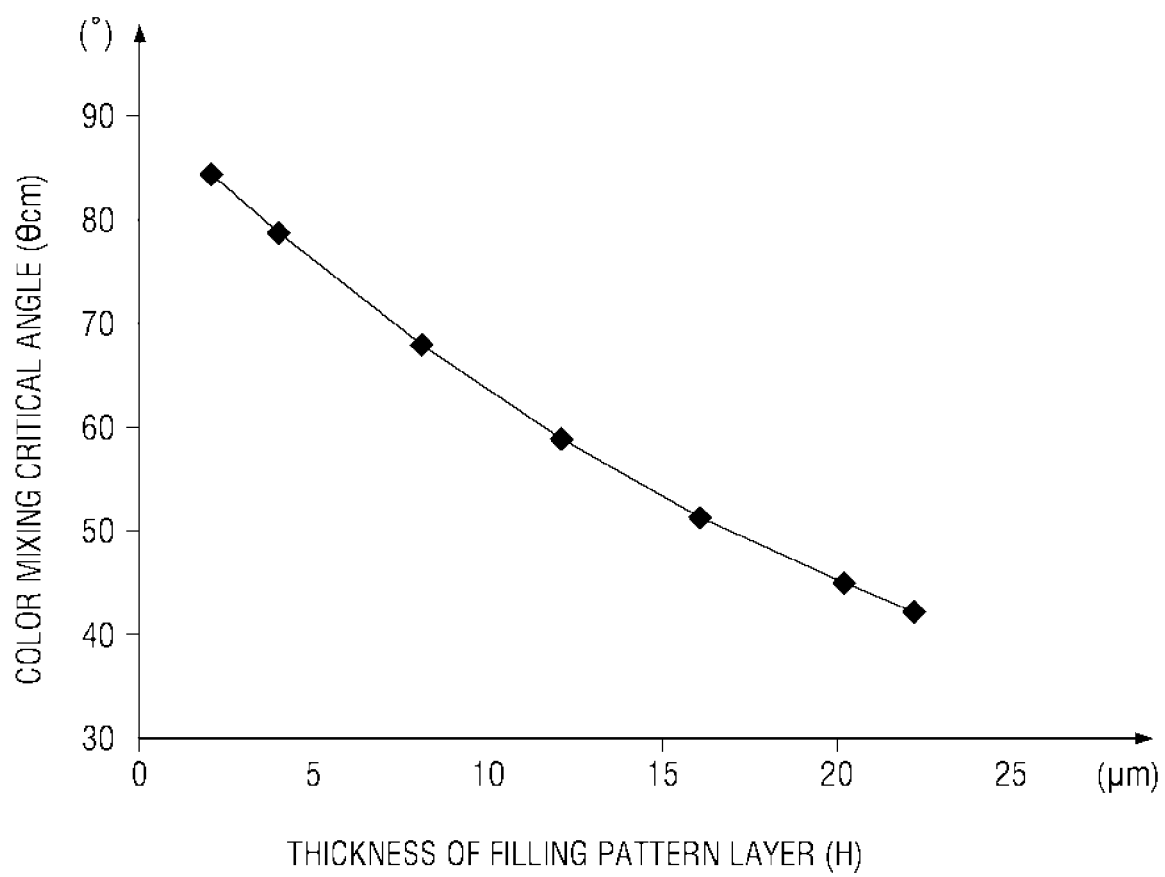
FIG. 34 is a graph schematically illustrating the color mixing critical angle with respect to the thickness of a filling pattern layer.

FIGS. 33 and 34 are graphs illustrating the change in color mixing critical angle with respect to the gap between light emitting regions and the thickness of the filling pattern layer 70. For example, FIG. 33 is a graph schematically illustrating the color mixing critical angle with respect to the gap between light emitting regions. FIG. 34 is a graph schematically illustrating the color mixing critical angle with respect to the thickness of the filling pattern layer 70.

Referring to FIG. 33, the x axis of the graph of FIG. 33 represents a gap between the first light emitting region LA1, the second light emitting region LA2, and the third light emitting region LA3. In other words, the gap between the first light emitting region LA1, the second light emitting region LA2, and the third light emitting region LA3 may be defined as the width of the non-light emitting region LB located between the first light emitting region LA1, the second light emitting region LA2, and the third light emitting region LA3. In the graph of FIG. 33, the y axis represents a color mixing critical angle $\theta_{cm}$ between the first light emitting region LA1, the second light emitting region LA2, and the third light emitting region LA3. Even if the filling pattern layer 70 is patterned, light emitted at an angle larger than the color mixing critical angle $\theta_{cm}$ may travel toward an adjacent light outputting region, causing color mixing.

For example, of the light emitted from the second light emitting region LA2 as illustrated in FIG. 4, light emitted at an angle larger than the color mixing critical angle $\theta_{cm}$ may be output not through the second light outputting region PA2 overlapping the second light emitting region LA2, but through the first light outputting region PA1 or the third light outputting region PA3 adjacent to the second light outputting region PA2. For example, as the value of the color mixing critical angle $\theta_{cm}$ is larger, the color mixing between the first light outputting region PA1, the second light outputting region PA2, and the third light outputting region PA3 may not occur.

The graph of FIG. 33 illustrates the color mixing critical angle $\theta_{cm}$ when the gap between the first light emitting region LA1, the second light emitting region LA2, and the third light emitting region LA3 is gradually increased after the thickness H of the filling pattern layer 70 is set to a certain value. For example, the graph of FIG. 33 illustrates the relationship between the gap between the first light emitting region LA1, the second light emitting region LA2, and the third light emitting region LA3 and the color mixing critical angle $\theta_{cm}$ when the thickness H of the filling pattern layer 70 is 12 μm.

As apparent from the graph of FIG. 33, as the gap between the first light emitting region LA1, the second light emitting region LA2, and the third light emitting region LA3 increases gradually, the value of the color mixing critical angle $\theta_{cm}$ also increases gradually. In addition, the color mixing critical angle $\theta_{cm}$ increases sharply as the gap between the first light emitting region LA1, the second light emitting region LA2, and the third light emitting region LA3 increases, but the increase in the color mixing critical angle $\theta_{cm}$ decreases as the color mixing critical angle $\theta_{cm}$ becomes closer to 90 degrees.

For example, it can be seen from the graph of FIG. 33 that the color mixing between the first light outputting region PA1, the second light outputting region PA2, and the third light outputting region PA3 decreases sharply as the gap between the first light emitting region LA1, the second light emitting region LA2, and the third light emitting region LA3 increases. However, it can be seen that the increase in the color mixing critical angle $\theta_{cm}$ decreases greatly as the color mixing critical angle $\theta_{cm}$ increases, and thus, the color mixing critical angle $\theta_{cm}$ is close to 90 degrees.

Referring to FIG. 34, the x axis of the graph of FIG. 34 represents the thickness H of the filling pattern layer 70. In the graph of FIG. 34, the y axis represents the color mixing critical angle $\theta_{cm}$ between the first light emitting region LA1, the second light emitting region LA2, and the third light emitting region LA3, as in FIG. 33.

The graph of FIG. 34 illustrates the color mixing critical angle $\theta_{cm}$ when the thickness H of the filling pattern layer 70 is gradually increased after the gap between the first light emitting region LA1, the second light emitting region LA2, and the third light emitting region LA3 is set to a certain value. For example, the graph of FIG. 34 illustrates the relationship between the thickness H of the filling pattern layer 70 and the color mixing critical angle $\theta_{cm}$ when the gap between the first light emitting region LA1, the second light emitting region LA2, and the third light emitting region LA3 is 20 μm.

As apparent from the graph of FIG. 34, the value of the color mixing critical angle $\theta_{cm}$ decreases gradually as the thickness H of the filling pattern layer 70 increases gradually. In addition, the value of the color mixing critical angle $\theta_{cm}$ may be reduced by a substantially constant amount according to the thickness H of the filling pattern layer 70. For example, it can be seen that the color mixing between the first light outputting region PA1, the second light outputting region PA2, and the third light outputting region PA3 increases gradually as the thickness H of the filling pattern layer 70 increases.

Figure 10:
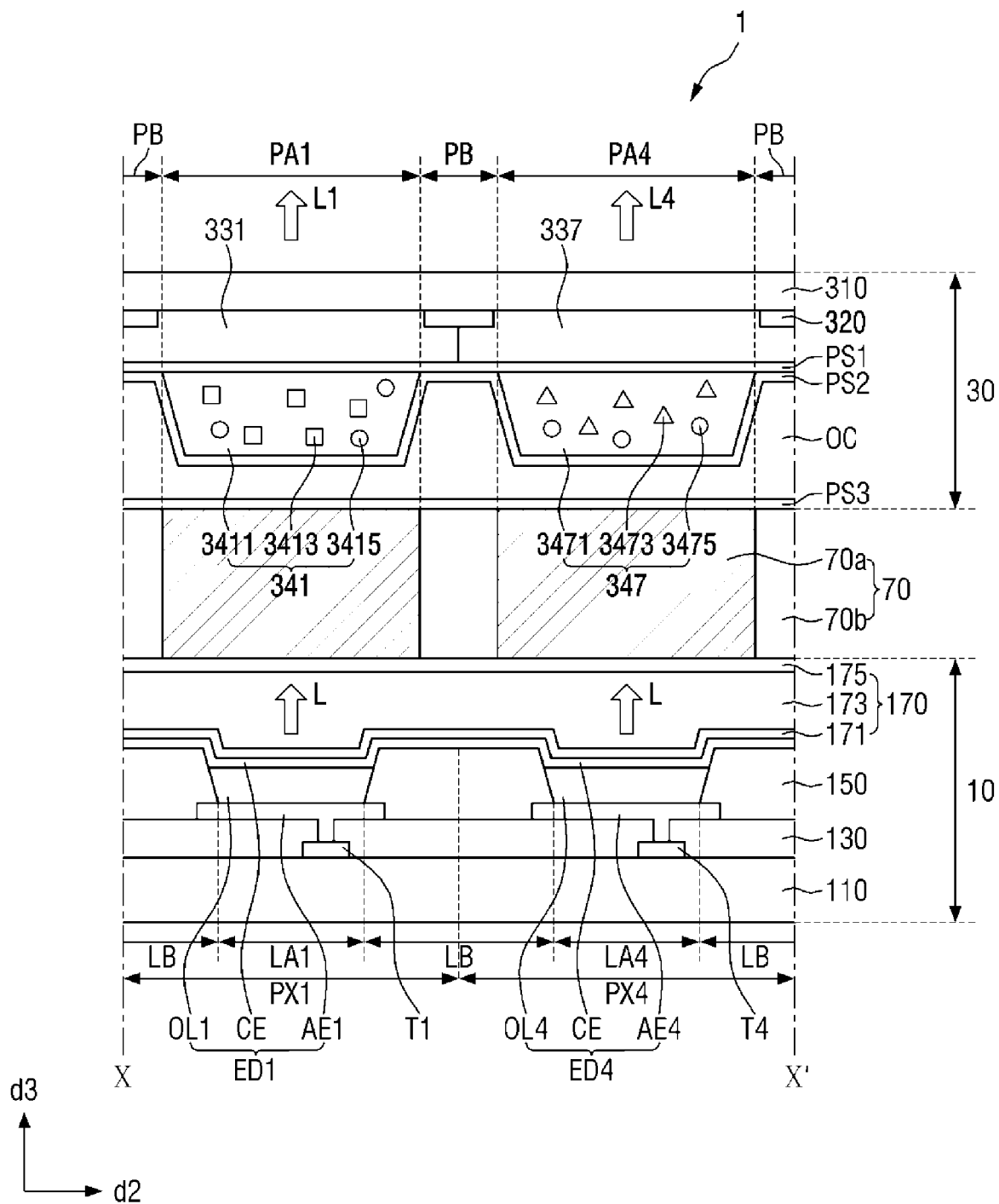
FIG. 10 is a cross-sectional view of the display device according to the embodiment, taken along line X-X' of FIG. 3.
Figure 11:
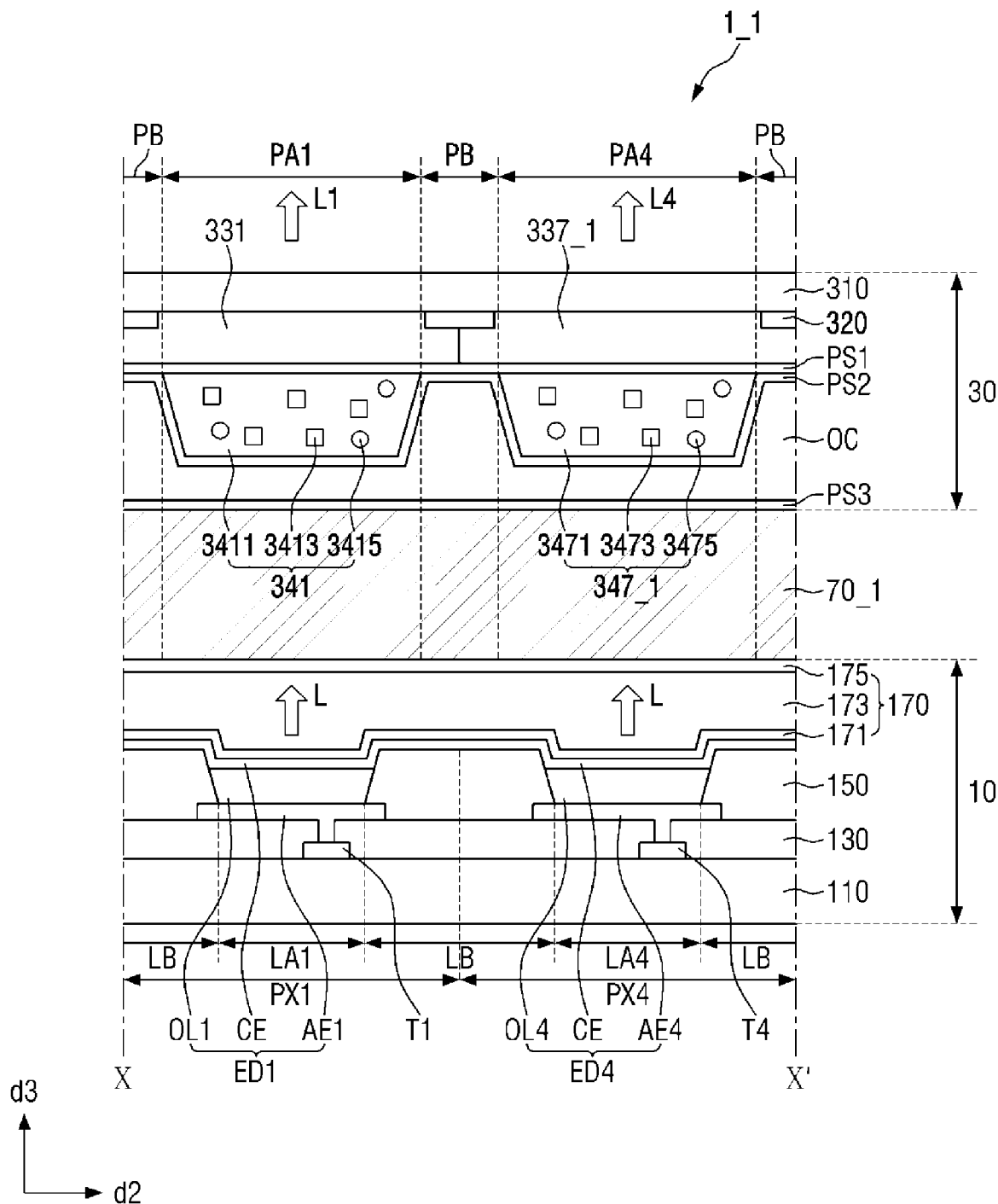
FIG. 11 is a cross-sectional view of a display device according to an embodiment, taken along the line X-X' of FIG. 3.

FIG. 10 is a cross-sectional view of the display device 1 according to the embodiment, taken along line X-X' of FIG. 3. FIG. 11 is a cross-sectional view of a display device 1_1 according to an embodiment, taken along the line X-X' of FIG. 3.

The cross-sectional view of FIG. 4 is a cross-sectional view taken along the line IV-IV' of the plan view of FIG. 3 in the first direction d1. On the other hand, the cross-sectional view of FIG. 10 is a cross-sectional view taken along the line X-X' of the plan view of FIG. 3 in the second direction d2 perpendicular (e.g., substantially perpendicular) to the first direction d1.

Referring to FIG. 10, the display device 1 may include the first substrate 10, the second substrate 30 facing the first substrate 10, and the filling pattern layer 70 between the first substrate 10 and the second substrate 30.

A fourth color filter 337 and a third wavelength conversion pattern 347 overlapping a fourth light outputting region PA4 in the second substrate 30 may be different from the first color filter 331 and the first wavelength conversion pattern 341 overlapping the first light outputting region PA1. For example, the first wavelength conversion pattern 341 in the first light outputting region PA1 may convert incident light into light of the first color, and the first color filter 331 may transmit the light of the first color. Therefore, the first light outputting region PA1 may be a region from which the light of the first color is output to the outside. However, the fourth light outputting region PA4 may be a region from which light of the second color or light of the third color other than the light of the first color is output to the outside. The fourth light outputting region PA4 will be described below as a region from which the light of the second color is output to the outside. However, the present disclosure is not limited to this case, and the fourth light outputting region PA4 may also be a region from which the light of the third color is output to the outside.

The third wavelength conversion pattern 347 of the fourth light outputting region PA4 may convert incident light into light of the second color. For example, the third wavelength conversion pattern 347 may be substantially the same as the second wavelength conversion pattern 343. The third wavelength conversion pattern 347 may include a fourth base resin 3471 and a third wavelength conversion material 3473 and a fourth scatterer 3475 dispersed in the fourth base resin 3471. The fourth color filter 337 may transmit the light of the second color output from the third wavelength conversion pattern 347 and block other light by absorbing the light.

Fourth light L4 output from the fourth light outputting region PA4 may be light of a color different from that of the first light L1 output from the first light outputting region PA1. For example, the filling pattern layer 70 may be patterned into the first portion 70a and the second pattern 70b as described above in order to prevent or reduce the color mixing between the first light outputting region PA1 and the fourth light outputting region PA4.

The filling pattern layer 70 may include the first pattern portion 70a and the second pattern portion 70b. The first pattern portion 70a may overlap each of the first light outputting region PA1 and the second light outputting region PA4, and the second pattern portion 70b may overlap the non-light outputting region PB.

Referring to the plan view of FIG. 3 and the cross-sectional view of FIG. 4 as well as the cross-sectional view of FIG. 10, the first pattern portion 70a may be located separately in each light outputting region. For example, the first pattern portions 70a respectively overlapping the light outputting regions may be spaced apart from each other. In other words, the first pattern portion 70a may be formed as an independent island in each light outputting region in a plan view.

The light L emitted from the first organic light emitting element ED1 and the fourth organic light emitting element ED4 may be incident on the filling pattern layer 70. As described above with reference to FIG. 9, some of the light L may not be transmitted to the second pattern portion 70b through total reflection at the optical interface between the first pattern portion 70a and the second pattern portion 70b, but may be concentrated on the first pattern portion 70a. For example, because the filling pattern layer 70 can concentrate light on the first pattern portion 70a corresponding to each light emitting region, an improved light emitting effect can be provided. In addition, since the filling pattern layer 70 minimizes or reduces dispersion of light to the second pattern portion 70b, the color mixing between the first light outputting region PA1 and the fourth light outputting region PA4 can be prevented or reduced.

The embodiment of FIG. 11 is different from the embodiment of FIG. 10 in that a filling pattern layer 70_1 is continuous in the second direction d2 without being patterned. Thus, differences from FIG. 10 will be mainly described below.

Referring to FIG. 11, the display device 1_1 may include a first substrate 10, a second substrate 30 facing the first substrate 10, and the filling pattern layer 70_1 between the first substrate 10 and the second substrate 30.

A fourth color filter 337_1 and a third wavelength conversion pattern 347_1 overlapping a fourth light outputting region PA4 in the second substrate 30 may be the same (e.g., substantially the same) as a first color filter 331 and a first wavelength conversion pattern 341 overlapping a first light outputting region PA1. For example, the first wavelength conversion pattern 341 in the first light outputting region PA1 may convert incident light into light of the first color, and the first color filter 331 may transmit the light of the first color. Therefore, the first light outputting region PA1 may be a region from which the light of the first color is output to the outside. In addition, the fourth light outputting region PA4 may be a region from which the light of the first color is output to the outside.

Fourth light L4 output from the fourth light outputting region PA4 may have the same (e.g., substantially the same) color as first light L1 output from the first light outputting region PA1. For example, because there is no (or substantially no) possibility of color mixing between the first light outputting region PA1 and the fourth light outputting region PA4, the filling pattern layer 70_1 may be formed to be continuous without being patterned.

The filling pattern layer 70_1 may overlap each of the light outputting regions PA1 and PA4 and a non-light outputting region PB between the first light outputting region PA1 and the fourth light outputting region PA4.

Referring to the plan view of FIG. 3 and the cross-sectional view of FIG. 4 as well as the cross-sectional view of FIG. 11, first pattern portions 70a may be spaced apart from each other in the first direction d1 but may be continuous in the second direction d2. In other words, the first pattern portions 70a may be formed in a stripe shape extending in the second direction d2 in a plan view.

A second pattern portion 70b may be in a non-light outputting region between the first pattern portions 70a formed in a stripe shape in order to prevent or reduce the color mixing between light outputting regions.

Various suitable planar forms of the filling pattern layer 70 will be described herein below with reference to FIGS. 28-32.

Figure 12:
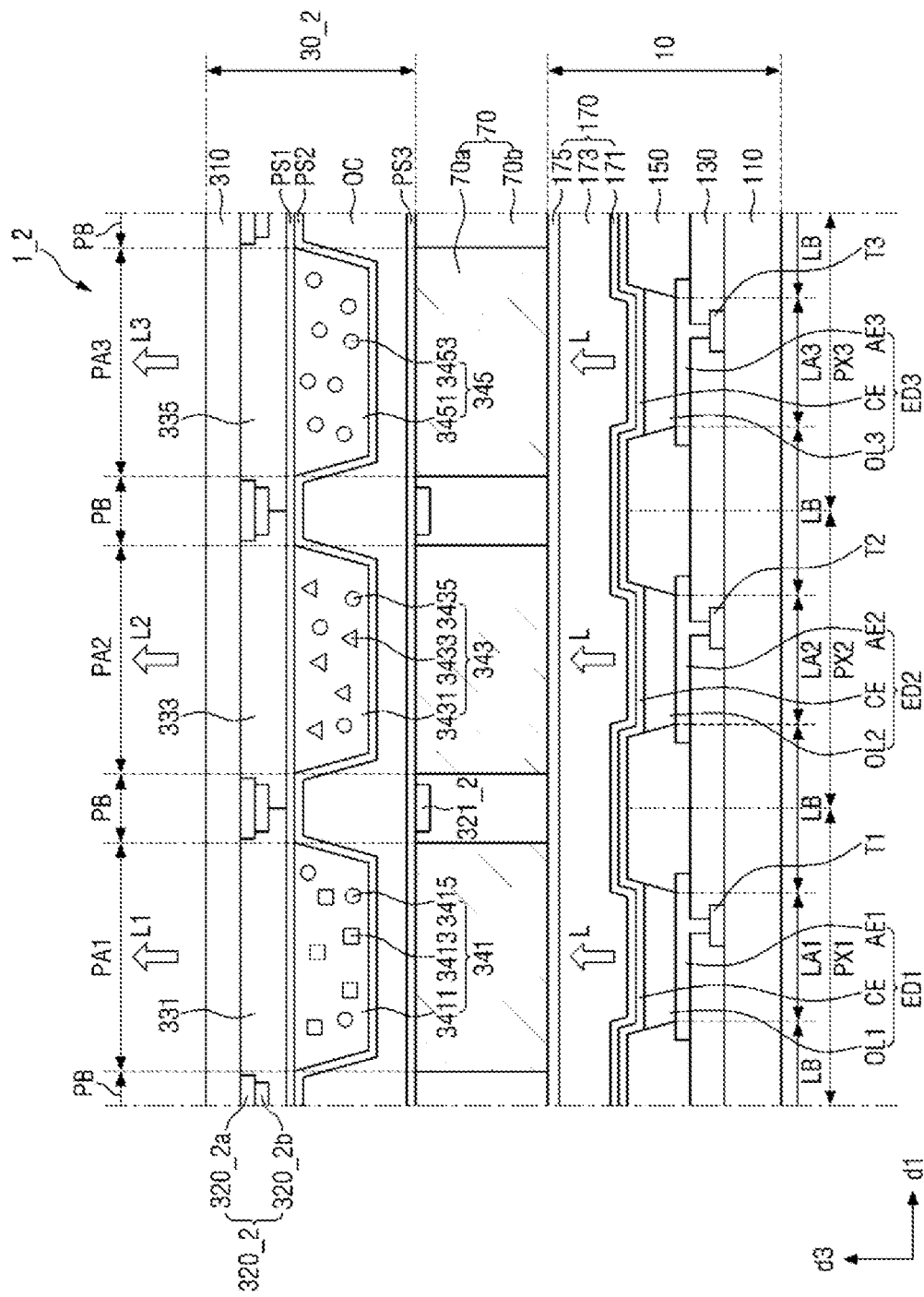
FIGS. 12-18 are cross-sectional views of display devices according to embodiments, taken along the line IV-IV' of FIG. 3.
Figure 13:
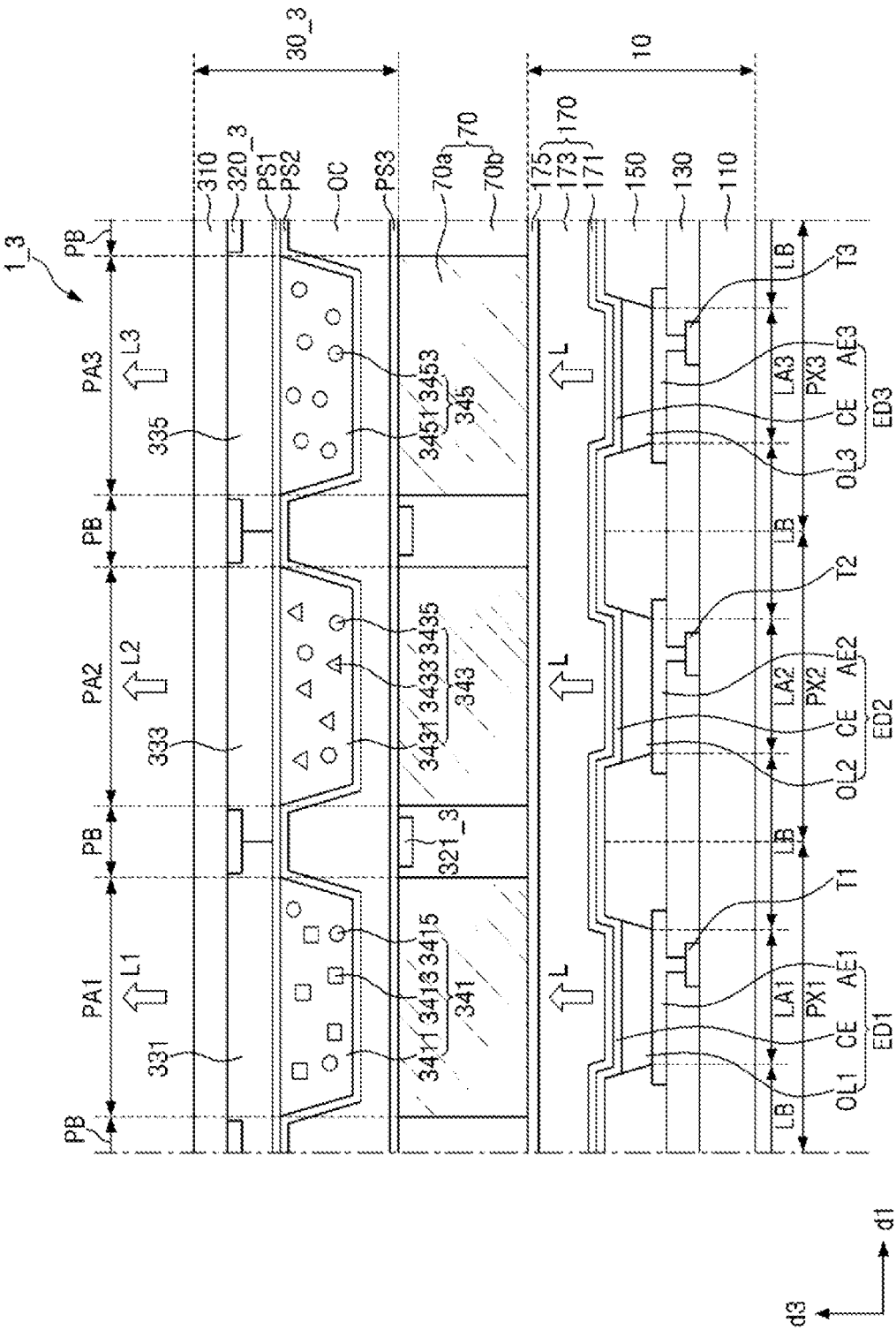
Figure 14:
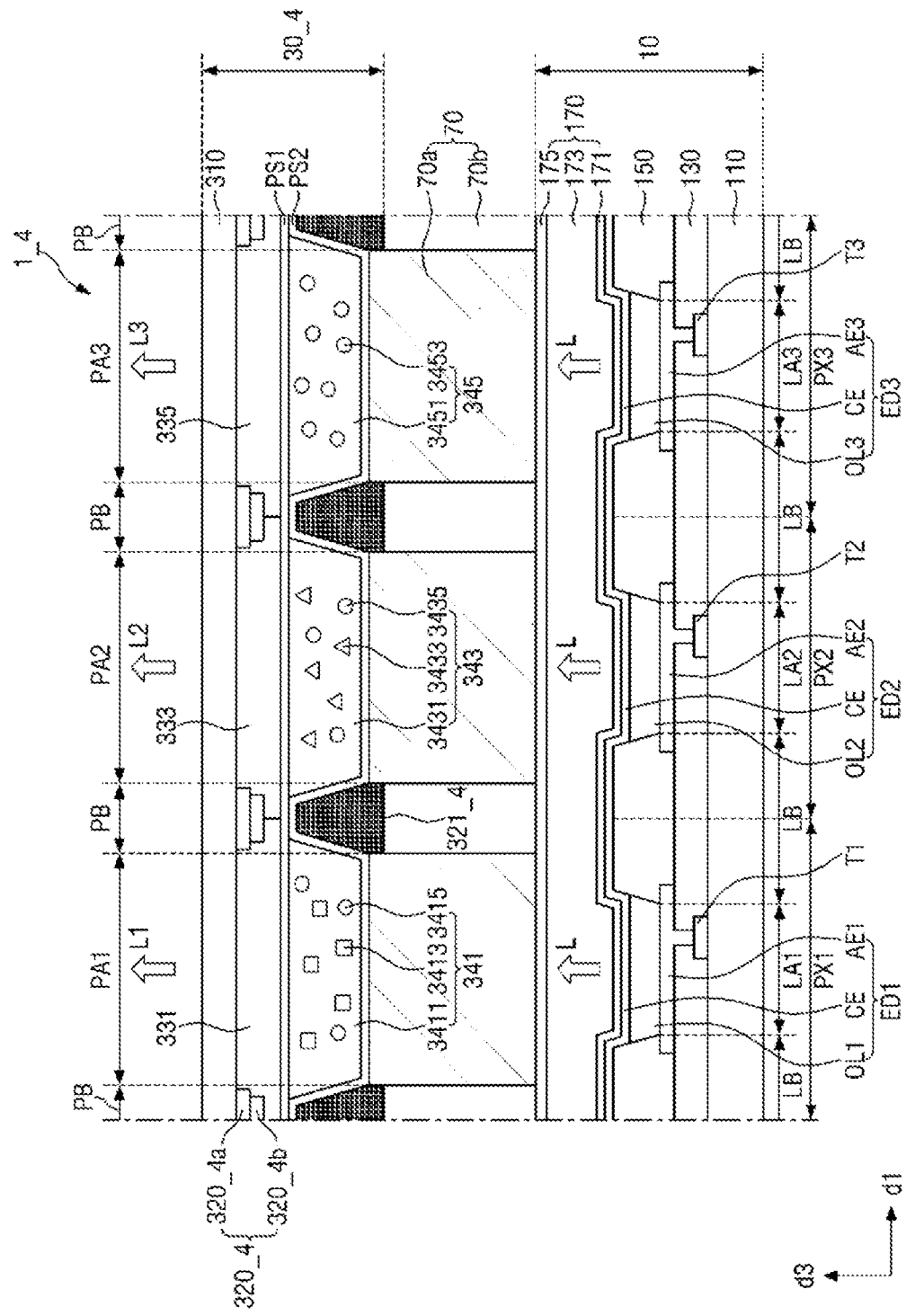

FIGS. 12-14 are cross-sectional views of display devices according to embodiments, taken along the line IV-IV' of FIG. 3.

Referring to FIG. 12, a display device 1_2 according to the current embodiment is substantially the same or similar to the display device 1 of FIG. 4 except that the configuration of a second substrate 30_2 is different from that of the second substrate 30 of the display device 1. Thus, differences will be mainly described below.

The second substrate 30_2, unlike the second substrate 30 of FIG. 4, may include a first light shielding member 320_2 and a second light shielding member 321_2. The first light shielding member 320_2 and the second light shielding member 321_2 may be located in a non-light outputting region PB and may not be located in a first light outputting region PA1, a second light outputting region PA2 and a third light outputting region PA3. For example, the first light shielding member 320_2 may be in a substantially lattice pattern in a plan view and prevent or reduce color mixing caused by the invasion of light between adjacent light outputting regions.

The first light shielding member 320_2 may include a color filter portion 320_2a and a light shielding portion 320_2b. The first light shielding member 320_2 may be between a boundary portion of each of the first color filter 331, the second color filter 333, and the third color filter 335 and a second base 310.

The color filter portion 320_2a may be on a surface of the second base 310. In an embodiment, the color filter portion 320_2a may be substantially the same color filter as a third color filter 335. For example, the color filter portion 320_2a may transmit light of the third color and block light of the first color and light of the second color by absorbing the light of the first color and the light of the second color. Therefore, the color filter portion 320_2a may be an absorptive filter as well as a blue color filter that transmits blue light and blocks red light and green light by absorbing the red light and the green light and may further include a blue colorant.

The light shielding portion 320_2b may overlap the color filter portion 320_2a. The light shielding portion 320_2b may block transmission of incident light by absorbing or reflecting the incident light. The width of the light shielding portion 320_2b may be smaller than that of the color filter portion 320_2a. The light shielding portion 320_2b may be made of an organic material or a metal material including chromium. For example, the light shielding portion 320_2b may be carbon black or an organic black matrix.

As described above, the areas of the first light outputting region PA1, the second light outputting region PA2, and the third light outputting region PA3 may be different from each other. When the areas of the first light outputting region PA1, the second light outputting region PA2, and the third light outputting region PA3 are different, reflected light due to external light may not be seen as neutral black. For example, when the area of the third light outputting region PA3 which outputs blue light is small, the amount of blue light reflected by external light may also be small. That is, in some embodiments, when blue light is lacking in reflected light, red light and green light may be seen relatively more than the blue light. Accordingly, the reflected light may be, on the whole, yellowish black.

Of external light incident on the first light shielding member 320_2, only blue light may be transmitted through the color filter portion 320_2a, and light of other colors may be absorbed. The blue external light transmitted through the color filter portion 320_2a may be incident on the light shielding portion 320_2b. The blue external light incident on the light shielding portion 320_2b may be absorbed by the light shielding portion 320_2b, but some of the blue external light may be reflected without being absorbed by the light shielding portion 320_2b. For example, the amount of blue light reflected to the outside by external light may be increased. Accordingly, the color of the reflected light can be adjusted.

Like the first light shielding member 320_2, the second light shielding member 321_2 may overlap the non-light outputting region PB to prevent or reduce the color mixing between the first light outputting region PA1, the second light outputting region PA2, and the third light outputting region PA3. However, while the first light shielding member 320_2 is between the second base 310 and the first wavelength conversion pattern 341 and the second wavelength conversion pattern 343 and between the second base 310 and a light transmission pattern 345, the second light shielding member 321_2 may be between the first wavelength conversion pattern 341 and the second wavelength conversion pattern 343 and the light transmission pattern 345 and the first organic light emitting element ED1, the second organic light emitting element ED2, and the third organic light emitting element ED3. The thickness of the second light shielding member 321_2 may be, but is not limited to, smaller than the thickness of each of the first wavelength conversion pattern 341 or the second wavelength conversion pattern 343 and the thickness of the light transmission pattern 345.

The second light shielding member 321_2 may be on a surface of a third capping layer PS3 different from a surface of the third capping layer PS3 which covers a planarization layer OC. However, the position of the second light shielding member 321_2 is not limited to this example. In an embodiment, the second light shielding member 321_2 may be on a thin-film encapsulation layer 170 of a first substrate 10. In some embodiments, the second light shielding member 321_2 may be located within a second pattern portion 70b.

The second light shielding member 321_2 may block the transmission of light of all colors by absorbing or reflecting the light. The second light shielding member 321_2 may be in a substantially lattice pattern in a plan view and prevent or reduce color mixing caused by the invasion of light between adjacent ones of the first light outputting region PA1, the second light outputting region PA2, and the third light outputting region PA3. For example, the display device 1_2 according to the current embodiment can prevent or reduce color mixing more effectively by including the first light shielding member 320_2 and the second light shielding member 321_2, unlike the display devices according to the above-described embodiments.

The second light shielding member 321_2 may be made of any one of the materials mentioned in relation to the light shielding portion 320_2b of the first light shielding member 320_2. In some embodiments, the second light shielding member 321_2 may be made of the same (e.g., substantially the same) material as the light shielding portion 320_2b.

In summary, in the embodiment of FIG. 12 as compared with the embodiment of FIG. 4, the color of reflected light due to external light can be adjusted by the first light shielding member 320_2 including the color filter portion 320_2a, and the color mixing between the first light outputting region PA1, the second light outputting region PA2, and the third light outputting region PA3 can be prevented or reduced more effectively by the second light shielding member 321_2.

Referring to FIG. 13, a display device 1_3 according to the current embodiment is substantially the same or similar to the display device 1_2 of FIG. 12 except that the configuration of a first light shielding member 320_3 is different from that of the first light shielding member 320_2 of the display device 1_2. Thus, differences will be mainly described below.

The first light shielding member 320_3 may be formed as a single layer, unlike the first light shielding member 320_2 of FIG. 12. For example, the first light shielding member 320_3 may not include a color filter and may include only a light shielding portion. In some embodiments, the first light shielding member 320_3 may be made of an organic material. For example, the first light shielding member 320_3 may be made of an organic material containing a black dye.

A second light shielding member 321_3, like the second light shielding member 321_2 of FIG. 12, may be on a third capping layer PS3 to prevent or reduce color mixing between light outputting regions.

Referring to FIG. 14, a display device 1_4 according to the current embodiment is substantially the same or similar to the display device 1_2 of FIG. 12 except that the configuration of a second substrate 30_4 is different from that of the second substrate 30_2 of the display device 1_2. Thus, differences will be mainly described below.

The second substrate 30_4, unlike the second substrate 30_2 of FIG. 12, may not include a planarization layer OC and a third capping layer PS3 and may include a second light shielding member 321_4 filling a space between the first wavelength conversion pattern 341 and the second wavelength conversion pattern 343 and a space between each of the first wavelength conversion pattern 341 or the second wavelength conversion pattern 343 and a light transmission pattern 345.

A first light shielding member 320_4 may include a color filter portion 320_4a and a light shielding portion 320_4b, like the first light shielding member 320_2 of FIG. 12.

The color filter portion 320_4a may be the same (e.g., substantially the same) blue color filter as the color filter portion 320_2a of FIG. 12. However, in some embodiments, the color filter portion 320_4a may be a color filter having a larger color gamut than the color filter portion 320_2a of FIG. 12.

The light shielding portion 320_4b may be made of an organic material. For example, the light shielding portion 320_4b may be made of an organic material containing a black dye.

The second light shielding member 321_4 may overlap a non-light outputting region PB. The display device 1_4 may not include a planarization layer. For example, the second light shielding member 321_4 may fill the space between the first wavelength conversion pattern 341 and the second wavelength conversion pattern 343 and the space between each of the first wavelength conversion pattern 341 or the second wavelength conversion pattern 343 and the light transmission pattern 345.

The second light shielding member 321_4 may be on a second capping layer PS2. The second capping layer PS2 may include an inorganic material. In some embodiments, the second capping layer PS2 may include silicon oxynitride (SiON). When the second capping layer PS2 includes SiON, its adhesion to the second light shielding member 321_4 and its spreadability may be improved.

The second light shielding member 321_4 may be made of, but not necessarily, the same (e.g., substantially the same) material as the light shielding portion 320_4b of the first light shielding member 320_4.

In some embodiments, a capping layer may be further on the second light shielding member 321_4. The capping layer may be on the whole of the second substrate 30_4 to cover the second light shielding member 321_4 and the second capping layer PS2. However, the present disclosure is not limited to this case, and the capping layer may also be formed to cover only the second light shielding member 321_4.

When the display device 1_4 does not include a planarization layer as in the embodiment of FIG. 14, it may have a feature of thinning the display device 1_4. In addition, since the second light shielding member 321_4 having a light shielding property is between the first wavelength conversion pattern 341 and the second wavelength conversion pattern 343 and between each of the first wavelength conversion pattern 341 or the second wavelength conversion pattern 343 and the light transmission pattern 345 instead of a planarization layer having a light transmitting property, the height of the second substrate 30_4 can be made generally uniform. Further, the second light shielding member 321_4 may block light emitted from respective side portions of the first wavelength conversion pattern 341 and the second wavelength conversion pattern 343 and the light transmission pattern 345, thereby more effectively preventing or reducing color mixing between the first light outputting region PA1, the second light outputting region PA2, and the third light outputting region PA3.

Figure 15:
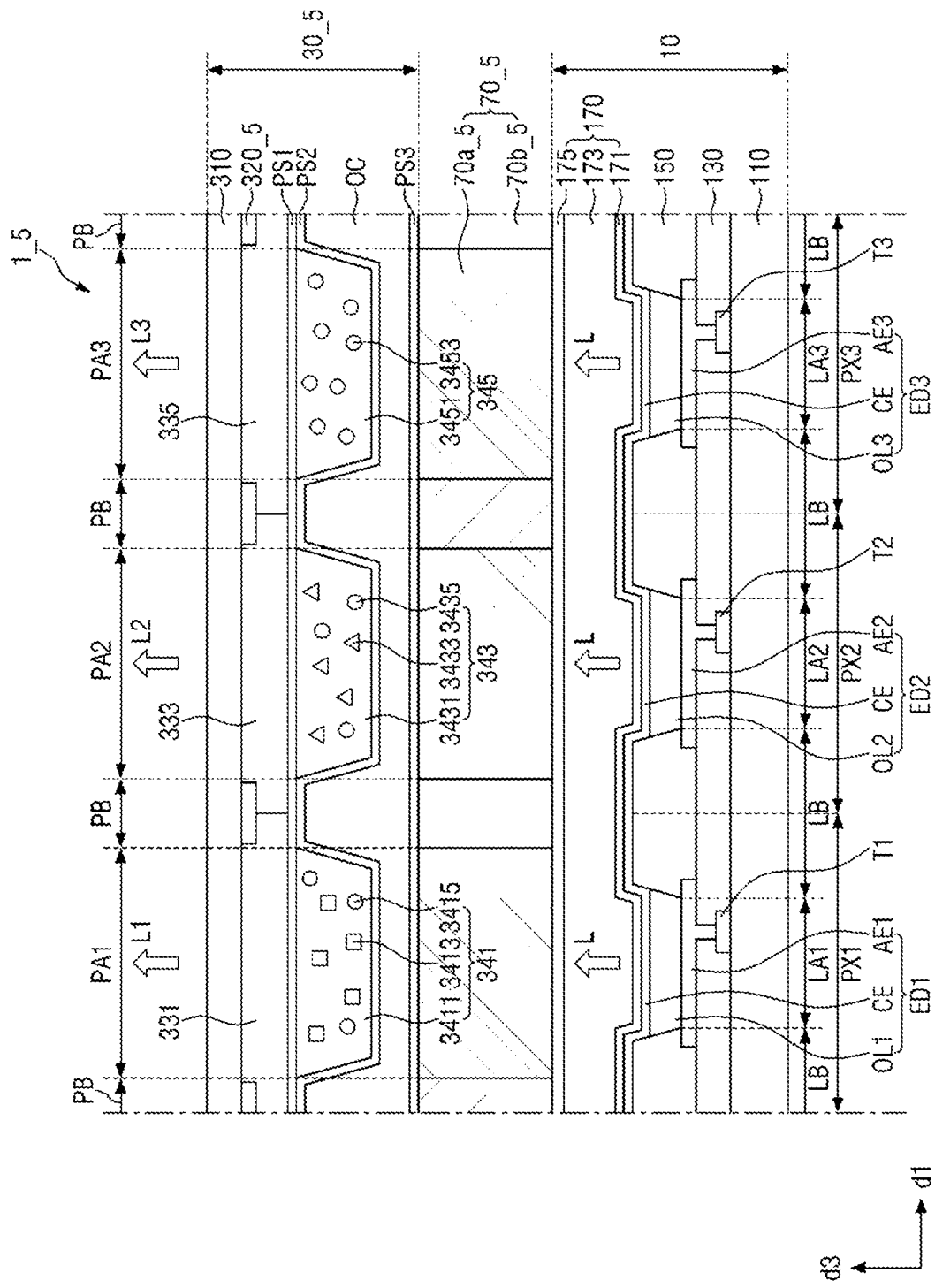

FIG. 15 is a cross-sectional view of a display device 1_5 according to an embodiment, taken along the line IV-IV' of FIG. 3.

Referring to FIG. 15, the display device 1_5 according to the current embodiment is substantially the same or similar to the display device 1 of FIG. 4 except that the configuration of a filling pattern layer 70_5 is different from that of the filling pattern layer 70 of the display device 1. Thus, differences will be mainly described below.

The filling pattern layer 70_5 may include a first pattern portion 70a_5 and a second pattern portion 70b_5. The first pattern portion 70a_5 may overlap each of the first light outputting region PA1, the second light outputting region PA2, and the third light outputting region PA3, and the second pattern portion 70b_5 may overlap a non-light outputting region PB.

The second pattern portion 70b_5 may be a low refractive material layer including a material having a lower refractive index than the first pattern portion 70a_5. For example, the second pattern portion 70b_5 may include, but is not limited to, ethylhexyl acrylate, pentafluoropropyl acrylate, polyethylene glycol dimethacrylate, and/or ethylene glycol dimethacrylate.

In order for effective total reflection at a boundary surface between the first pattern portion 70a_5 and the second pattern portion 70b_5, the difference in refractive index between the first pattern portion 70a_5 and the second pattern portion 70b_5 may be at least 0.3. For example, when the refractive index of the second pattern portion 70b_5 is 1.3, the refractive index of the first pattern portion 70a_5 may be 1.6 or more.

When the second pattern portion 70b_5 is filled with a low refractive material layer as in the current embodiment, instead of an air layer or a gas layer, the filling pattern layer 70_5 can more effectively serve as a buffer between the first substrate 10 and the second substrate 30_5 as compared with those of the above-described embodiments.

Figure 16:
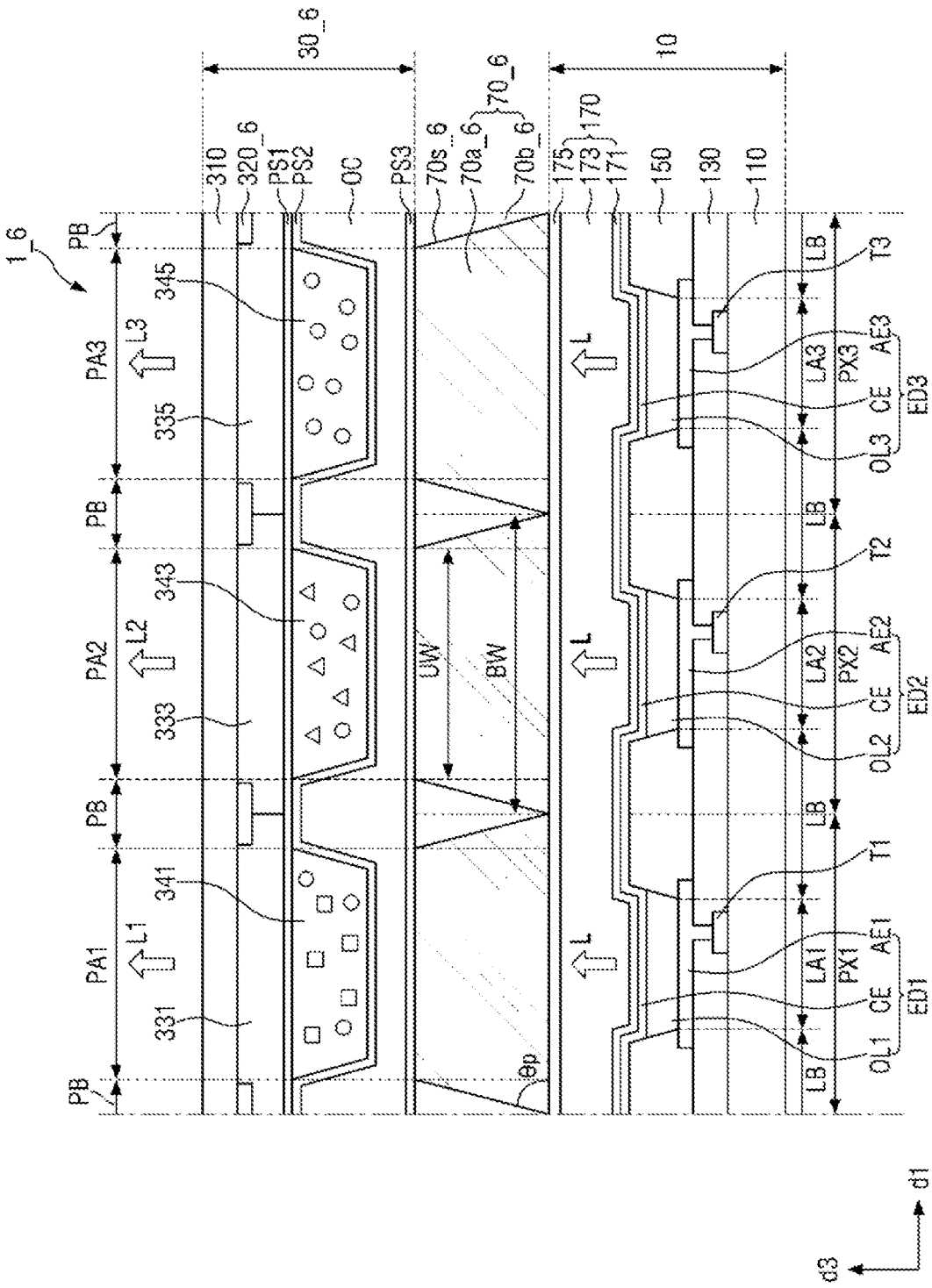
Figure 17:
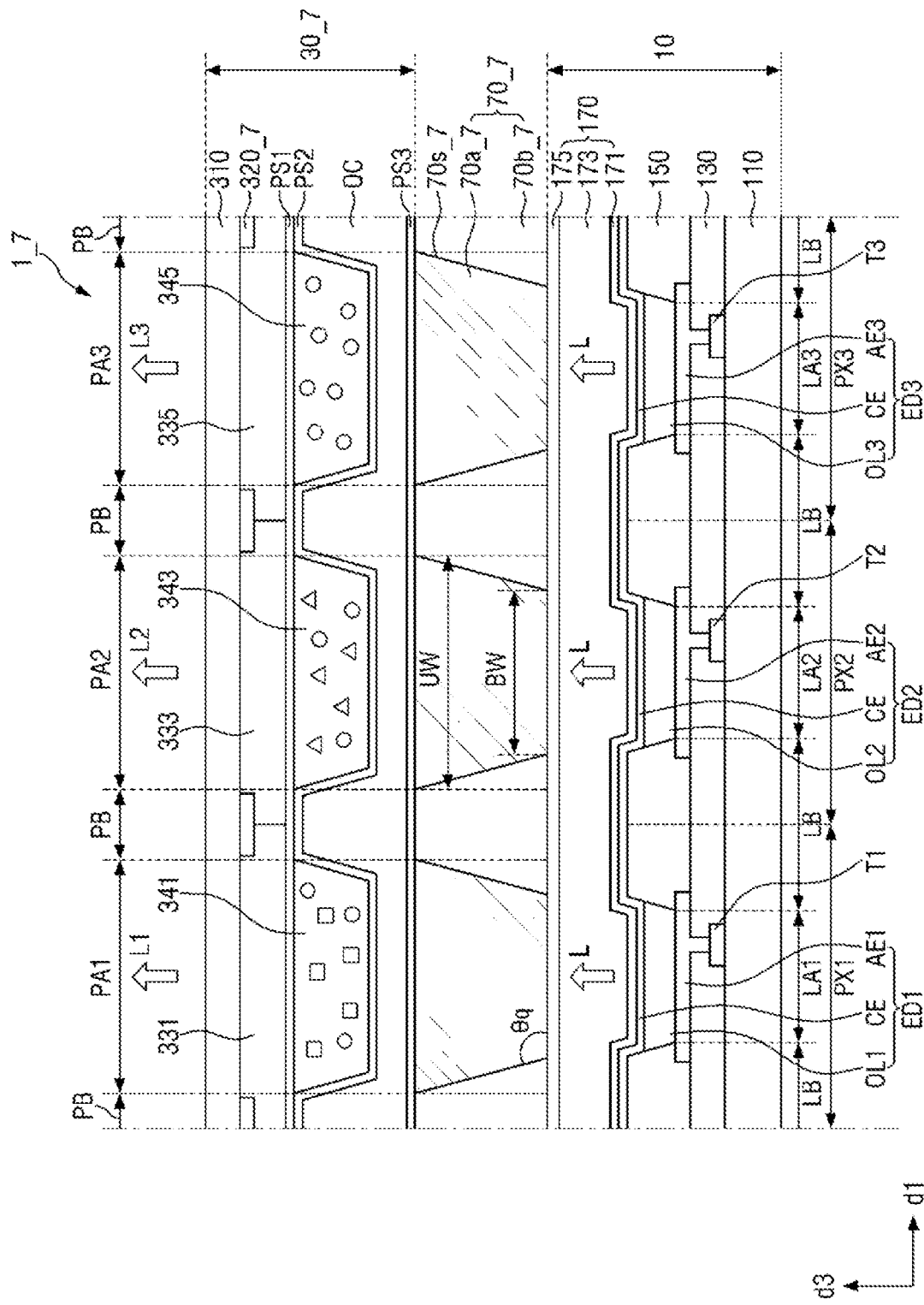
Figure 18:
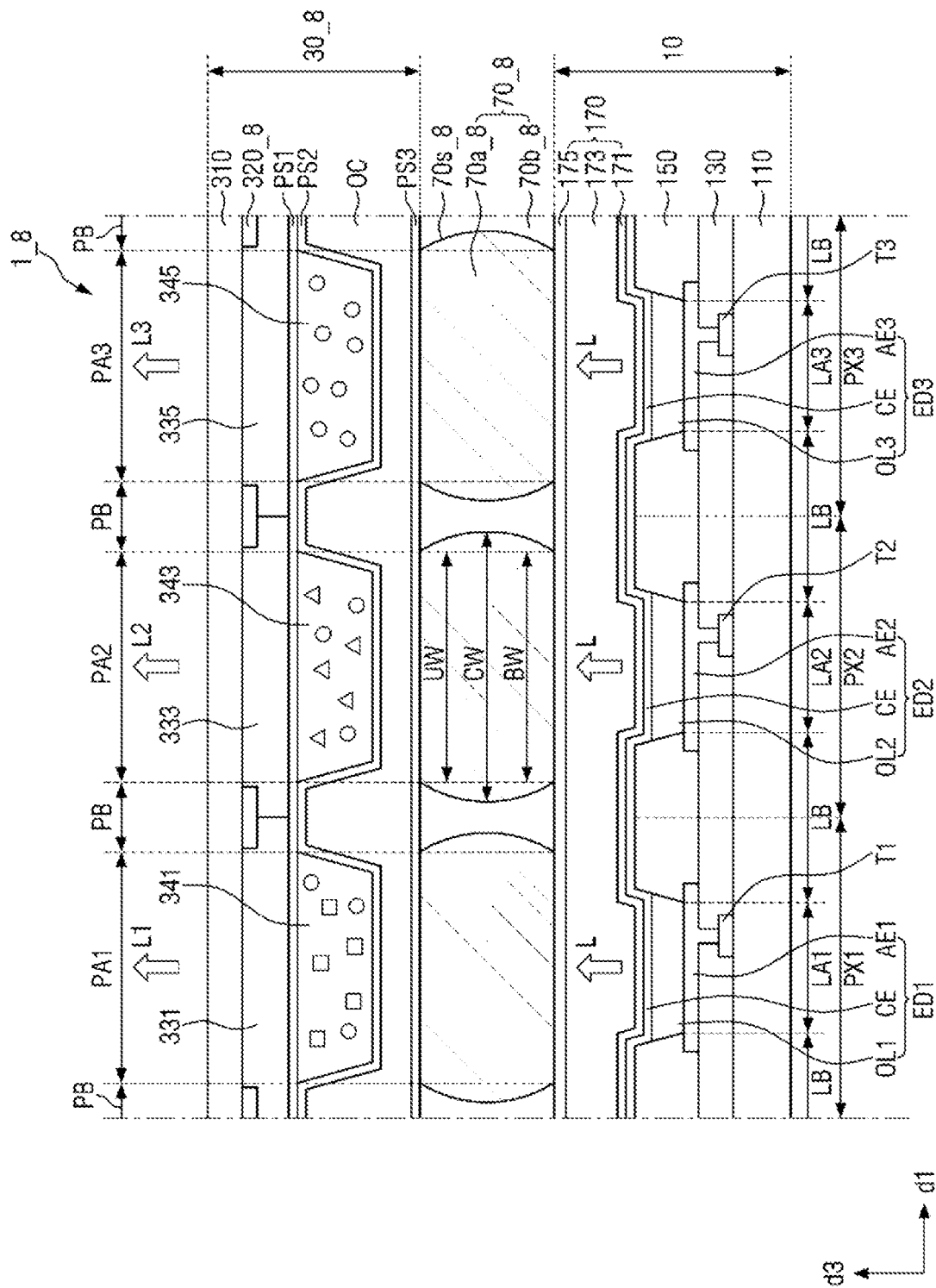

FIGS. 16-18 are cross-sectional views of display devices according to embodiments, taken along the line IV-IV' of FIG. 3.

Referring to FIG. 16, a display device 1_6 according to the current embodiment is substantially the same or similar to the display device 1 of FIG. 4 except that the shape of a filling pattern layer 70_6 is different from that of the filling pattern layer 70 of the display device 1. Thus, differences will be mainly described below.

The filling pattern layer 70_6 may include a first pattern portion 70a_6 and a second pattern portion 70b_6.

The first pattern portion 70a_6 may generally overlap each of the first light outputting region PA1, the second light outputting region PA2, and the third light outputting region PA3 and include a first attachment surface BW and a second attachment surface UW. The first attachment surface BW is a contact surface with a first substrate 10, and the second attachment surface UV is a contact surface with a second substrate 30_6. The first attachment surface BW and the second attachment surface UW may be, but not necessarily, parallel (e.g., substantially parallel) to each other. The area of the first attachment surface BW of the first pattern portion 70a_6 may be larger than that of the second attachment surface UW. For example, the first pattern portion 70a_6 may be trapezoidal in cross section. Therefore, a first angle θp formed by a boundary surface 70s_6 between the first pattern portion 70a_6 and the second pattern portion 70b_6 and the first attachment surface BW in cross section may be an acute angle smaller than 90 degrees.

The area of the first attachment surface BW in a plan view may be larger than that of each of the first light outputting region PA1, the second light outputting region PA2, and the third light outputting region PA3. The first pattern portions 70a_6 respectively in the first light outputting region PA1, the second light outputting region PA2, and the third light outputting region P3 may be coupled to each other in a region adjacent to the first attachment surface BW, but may also be spaced apart from each other. In addition, the second attachment surface UW may overlap each of the first light outputting region PA1, the second light outputting region PA2, and the third light outputting region PA3, but may not overlap a non-light outputting region PB. However, the present disclosure is not limited to this case, and the second attachment surface UW may also overlap a portion of the non-light outputting region PB.

When the area of the first attachment surface BW is larger than that of each of the first light outputting region PA1, the second light outputting region PA2, and the third light outputting region PA3, more emitted light L may be incident on the first pattern portion 70a_6. For example, more emitted light L may be reflected to the outside at the boundary surface 70s_6 between the first pattern portion 70a_6 and the second pattern portion 70b_6.

As described above, the boundary surface 70s_6 between the first pattern portion 70a_6 and the second pattern portion 70b_6 may form the first angle θp with the first attachment surface BW. If the first angle θp is formed smaller than a certain value in the process of forming the filling pattern layer 70_6, light emitted from each light emitting region LA1, LA2 or LA3 may be refracted and transmitted without being totally reflected at the boundary surface 70s_6. For example, light transmitted through the boundary surface 70s_6 may be incident on an adjacent light outputting region, causing color mixing.

The critical angle of the first angle θp for allowing light emitted from the first light emitting region LA1, the second light emitting region LA2, or the third light emitting region LA3 to be totally reflected at the boundary surface 70s_6 may be determined by refractive indices of the first pattern portion 70a_6 and the second pattern portion 70b_6. When the second pattern portion 70b_6 is an air layer (e.g., a layer including atmospheric air), the refractive index of the air layer may be 1.

For example, the first pattern portion 70a_6 may be made of a high refractive organic material as described above. In an embodiment, the refractive index of the first pattern portion 70a_6 may be 1.4 to 1.8. As the refractive index of the organic material contained in the first pattern portion 70a_6 increases gradually, the difference in refractive index between the first pattern portion 70a_6 and the second pattern portion 70b_6 increases, thus, gradually reducing the critical angle of the first angle θp.

Referring to FIG. 17, a display device 1_7 according to the current embodiment is substantially the same or similar to the display device 1 of FIG. 4 except that the shape of a filling pattern layer 70_7 is different from that of the filling pattern layer 70 of the display device 1. Thus, differences will be mainly described below.

The filling pattern layer 70_7 may include a first pattern portion 70a_7 and a second pattern portion 70b_7.

The first pattern portion 70a_7 may generally overlap each of the first light outputting region PA1, the second light outputting region PA2, and the third light outputting region PA3, and the area of a first attachment surface BW which is a contact surface with a first substrate 10 may be smaller than that of a second attachment surface UW which is a contact surface with a second substrate 30_7. For example, the first pattern portion 70a_7 may be shaped like an inverted trapezoid in cross section. Therefore, a second angle θq formed by a boundary surface 70s_7 between the first pattern portion 70a_7 and the second pattern portion 70b_7 and the first attachment surface BW in cross section may be an obtuse angle larger than 90 degrees.

When the second angle θq formed by the boundary surface 70s_7 between the first pattern portion 70a_7 and the second pattern portion 70b_7 and the first attachment surface BW is an obtuse angle larger than 90 degrees, an incident angle at which light L emitted from the first organic light emitting element ED1, the second organic light emitting element ED2, or the third organic light emitting element ED3 is incident on the boundary surface 70s_7 may be increased. Therefore, more emitted light L may be totally reflected at the boundary surface 70s_7 between the first pattern portion 70a_7 and the second pattern portion 70b_7 and output to the outside.

Referring to FIG. 18, a display device 1_8 according to the current embodiment is substantially the same or similar to the display device 1 of FIG. 4 except that the shape of a filling pattern layer 70_8 is different from that of the filling pattern layer 70 of the display device 1. Thus, differences will be mainly described below.

The filling pattern layer 70_8 may include a first pattern portion 70a_8 and a second pattern portion 70b_8.

The first pattern portion 70a_8 may generally overlap each of the first light outputting region PA1, the second light outputting region PA2, and the third light outputting region PA3, and the second pattern portion 70b_8 may overlap a non-light outputting region PB.

Side surfaces 70s_8 of the first pattern portion 70a_8 may protrude toward the non-light outputting region PB. For example, the area of a central portion CW of the first pattern portion 70a_8 may be larger than those of a first attachment surface BW and a second attachment surface UW. In addition, the side surfaces 70s_8 of the first pattern portion 70a_8 may be curved. In other words, a boundary surface 70s_8 between the first pattern portion 70a_8 and the second pattern portion 70b_8 may be curved.

The first pattern portions 70a_8 may be spaced apart from each other. However, the present disclosure is not limited to this case. In some embodiments, the side surfaces 70s_8 of the first pattern portions 70a_8 may at least partially contact each other in the non-light outputting region PB.

The side surfaces 70s_8 of the first pattern portions 70a_8 may be curved and protrude toward the non-light outputting region PB as a first substrate 10 and a second substrate 30 are bonded together in the process of forming the filling pattern layer 70_8. This will be described herein with reference to FIG. 22.

Hereinafter, methods of manufacturing the display devices according to the various embodiments described above will be described with reference to FIGS. 4 and 19-27. The basic configuration of a display device is the same as that of the display device 1 of FIG. 4, and a brief description of elements identical to those of display device 1 may be provided, or a duplicative description thereof may not be repeated.

FIGS. 19-23 illustrate a method of manufacturing a display device by forming a filling pattern layer on a first substrate and then bonding the first substrate and a second substrate together.

Figure 19:
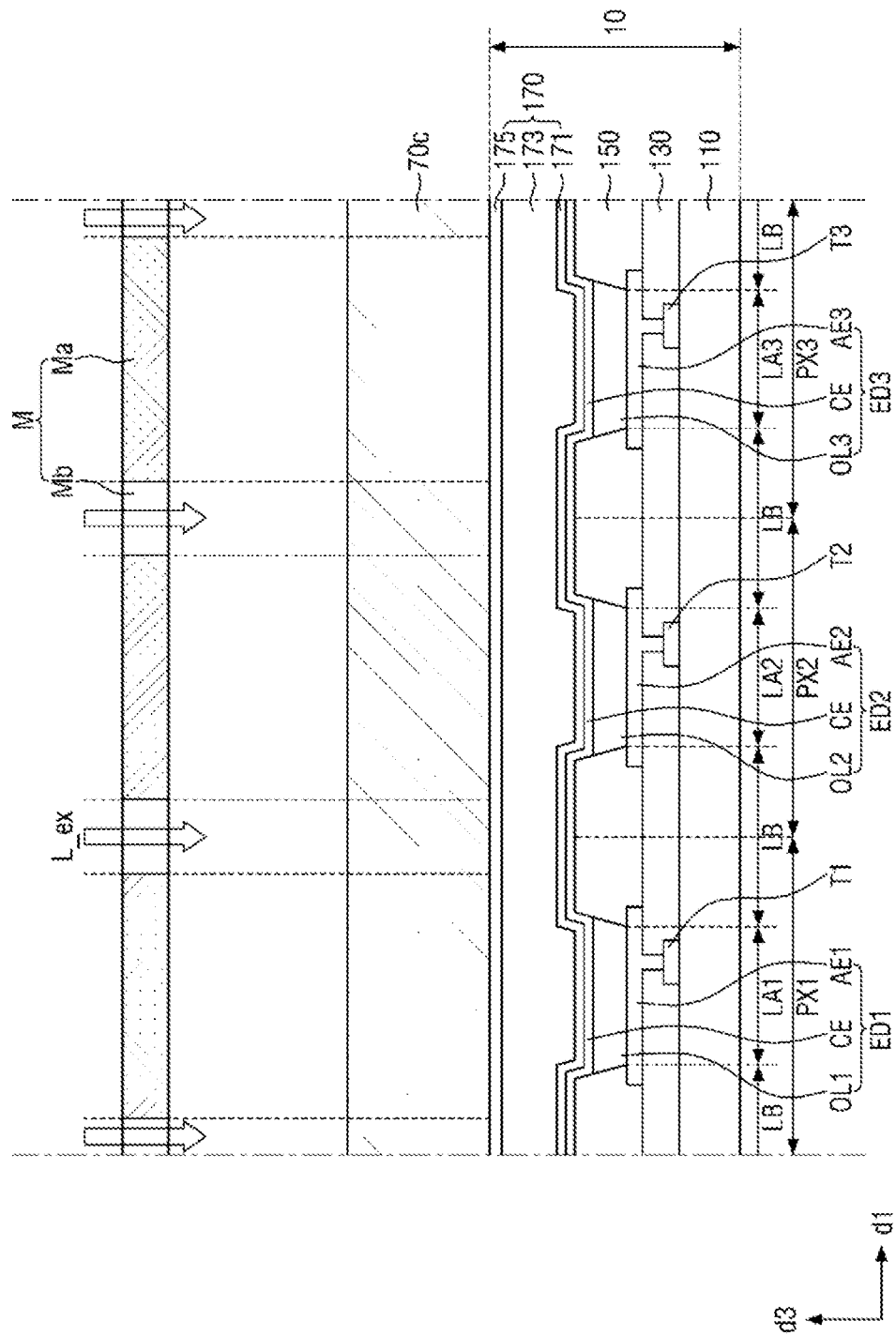
FIGS. 19-23 illustrate a method of manufacturing a display device by forming a filling pattern layer on a first substrate and then bonding the first substrate and a second substrate together.

FIG. 19 illustrates an operation of forming a filling pattern layer 70 on a first substrate 10. Referring to FIG. 19, a filler 70c may be placed on the first substrate 10. A mask M may be placed above the first substrate 10 and the filler 70c.

The filling pattern layer 70 may be formed by patterning the filler 70c using a photolithography process. However, the method of forming the filling pattern layer 70 is not limited to the photolithography process. In an embodiment, the filling pattern layer 70 may be formed by an inkjet process. A case where the filling pattern layer 70 is formed by the photolithography process will be described herein below.

The filler 70c may be placed on the whole of the first substrate 10 as a base material for forming the filling pattern layer 70. The filler 70c may be placed to a generally uniform thickness. The filler 70c may be coated by, but not limited to, a spin coating method.

The filler 70c may be made of the same (e.g., substantially the same) material as the first pattern portions 70a of FIG. 4. The filler 70c may be made of a high refractive organic material such as, but not limited to, a silicon-based organic material, an epoxy-based organic material, and/or an epoxy-acrylic based organic material. In some embodiments, the first pattern portions 70a may be silicone rubber.

The mask M may be placed and aligned above the first substrate 10. The mask M may include light shielding portions Ma which block all light (e.g., substantially all visible light) and light transmitting portions Mb which transmit all light (e.g., transmit substantially all visible light). The light shielding portions Ma may respectively overlap the first organic light emitting element ED1, the second organic light emitting element ED2, and the third light emitting element ED3 of the first substrate 10. The cross-sectional area of each of the light shielding portions Ma may be equal to that of each of the first light outputting region PA1, the second light outputting region PA2, and the third light outputting region PA3. The light transmitting portions Mb may overlap a bank layer 150 of the first substrate 10. The cross-sectional area of each of the light transmitting portions Mb may be equal to that of a non-light outputting region PB.

During the formation of the filling pattern layer 70, exposure light L_ex may be irradiated to the first substrate 10 from above the mask M. Some of the exposure light L_ex may be blocked by the light shielding portions Ma of the mask M, and the other exposure light L_ex may be transmitted through the light transmitting portions Mb and irradiated to the filler 70c on the first substrate 10. For example, the exposure light L_ex may be selectively irradiated to the filler 70c by the mask M.

In regions irradiated with the exposure light L_ex through the light transmitting portions Mb, a polymer bond in the filler 70c may be broken. For example, the filler 70c in the regions irradiated with the exposure light L_ex may be removed through a subsequent process. Regions which are overlapped by the light shielding portions Ma and in which the filler 70c is not irradiated with the exposure light L_ex may become the first pattern portion 70a, and regions which are overlapped by the light transmitting portions Mb and in which the filler 70c is irradiated with the exposure light L_ex may become the second portion 70b.

Unlike in the above method, the filler 70c in the regions not irradiated with the exposure light L_ex may be removed. In this case, the positions of the light shielding portions Ma and the light transmitting portions Mb of the mask M may be reversed.

Figure 20:
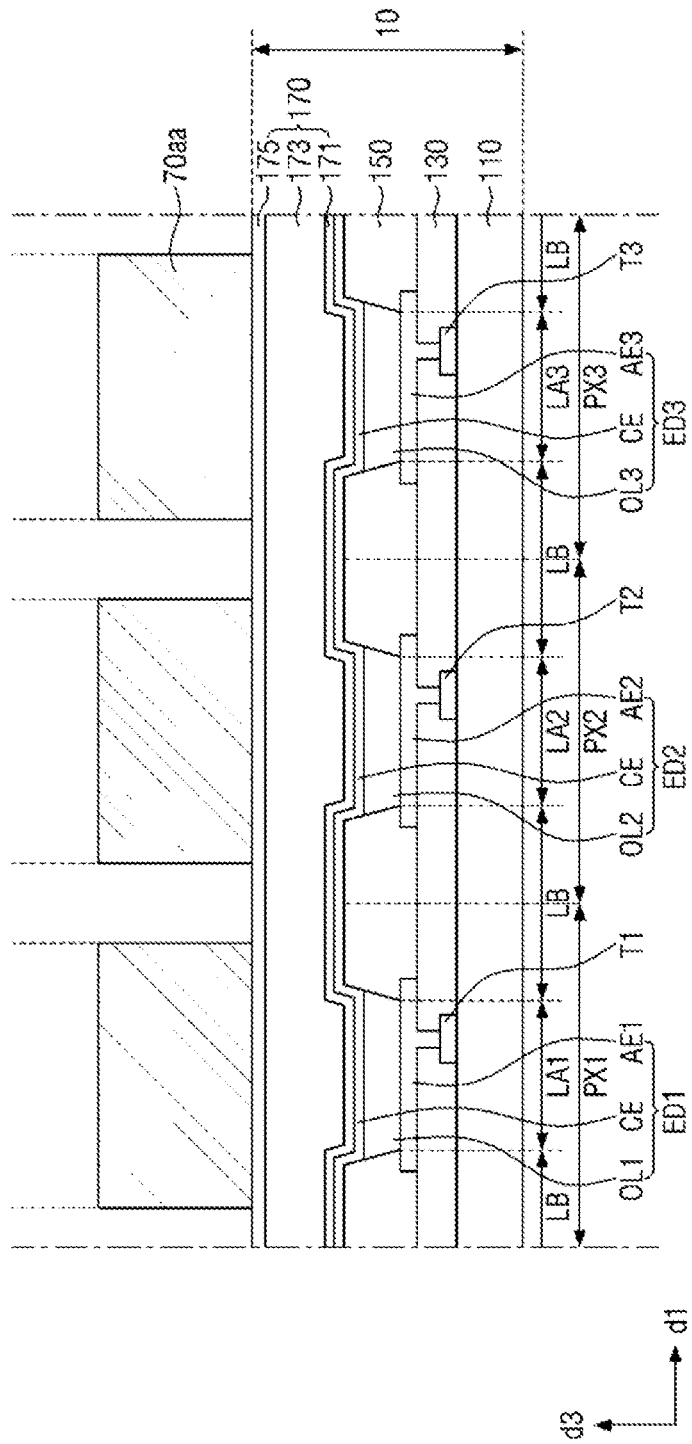
Figure 21:
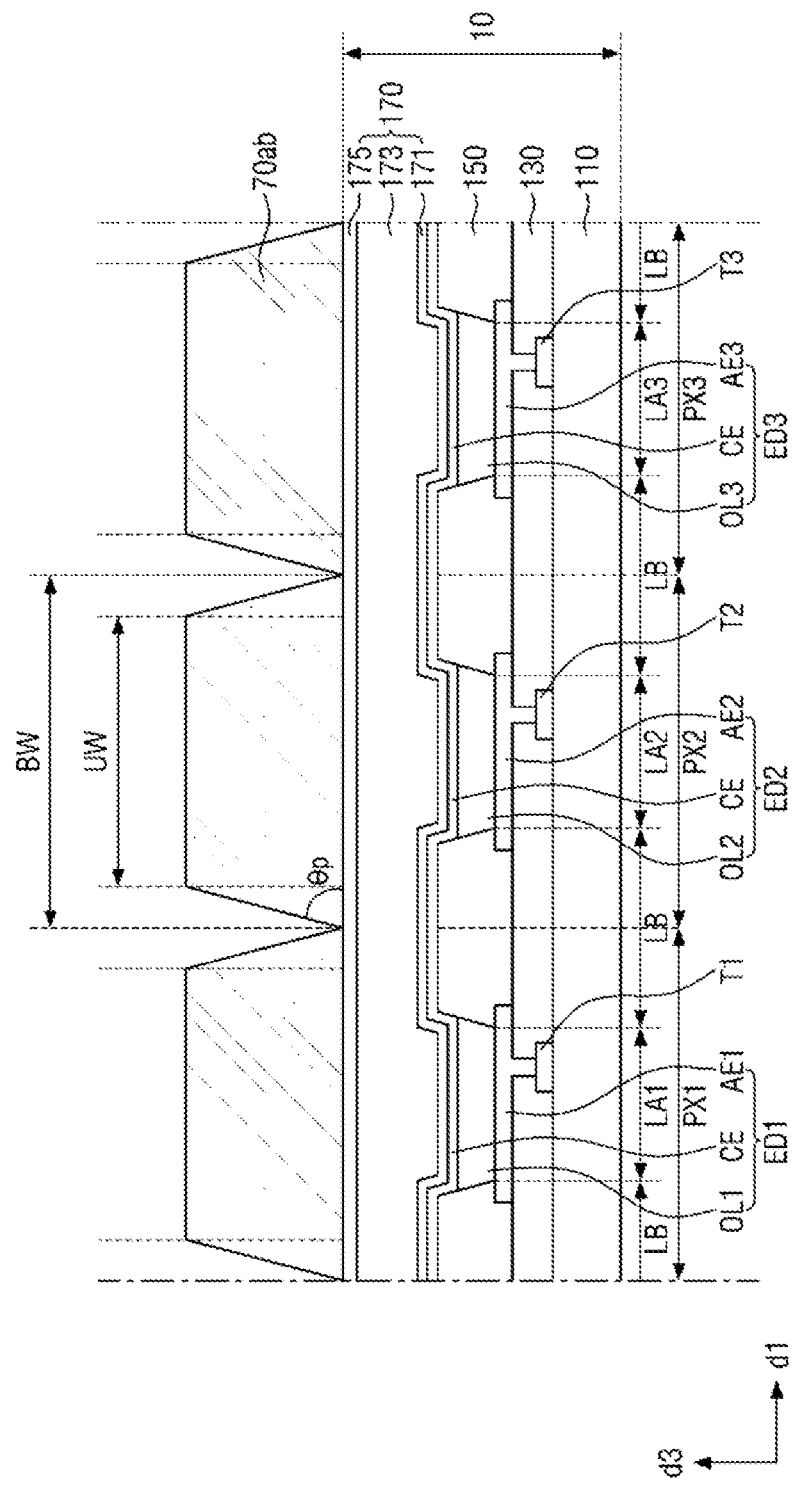

FIGS. 20 and 21 illustrate embodiments of a filling pattern layer formed according the filling pattern layer forming method of FIG. 19.

FIG. 20 illustrates first pattern portions 70aa of a filling pattern layer formed by removing the filler 70c in the regions to which the exposure light L_ex is irradiated through the light transmitting portions Mb as described in FIG. 19. When the filler 70c in the regions irradiated with the exposure light L_ex is completely removed, the first pattern portions 70aa having a rectangular cross-sectional shape may be formed as illustrated in FIG. 20. The first pattern portions 70aa may respectively overlap the first organic light emitting element ED1, the second organic light emitting element ED2, and the third organic light emitting element ED3. A space between the first pattern portions 70aa may subsequently become a second pattern portion.

FIG. 21 illustrates first pattern portions 70ab of a filling pattern layer formed by removing the filler 70c in the regions to which the exposure light L_ex is irradiated through the light transmitting portions Mb as described in FIG. 19. When the filler 70c in the regions irradiated with the exposure light L_ex is partially removed, the first pattern portions 70ab having a trapezoidal cross-sectional shape may be formed as illustrated in FIG. 21. A portion to be removed in each region irradiated with the exposure light L_ex may be determined by adjusting the intensity of the exposure light L_ex. For example, the higher the intensity of the exposure light L_ex, the larger the angle θp formed between a side surface of each first pattern portion 70ab and an attachment surface of the first pattern portion 70ab to the first substrate 10.

Figure 22:
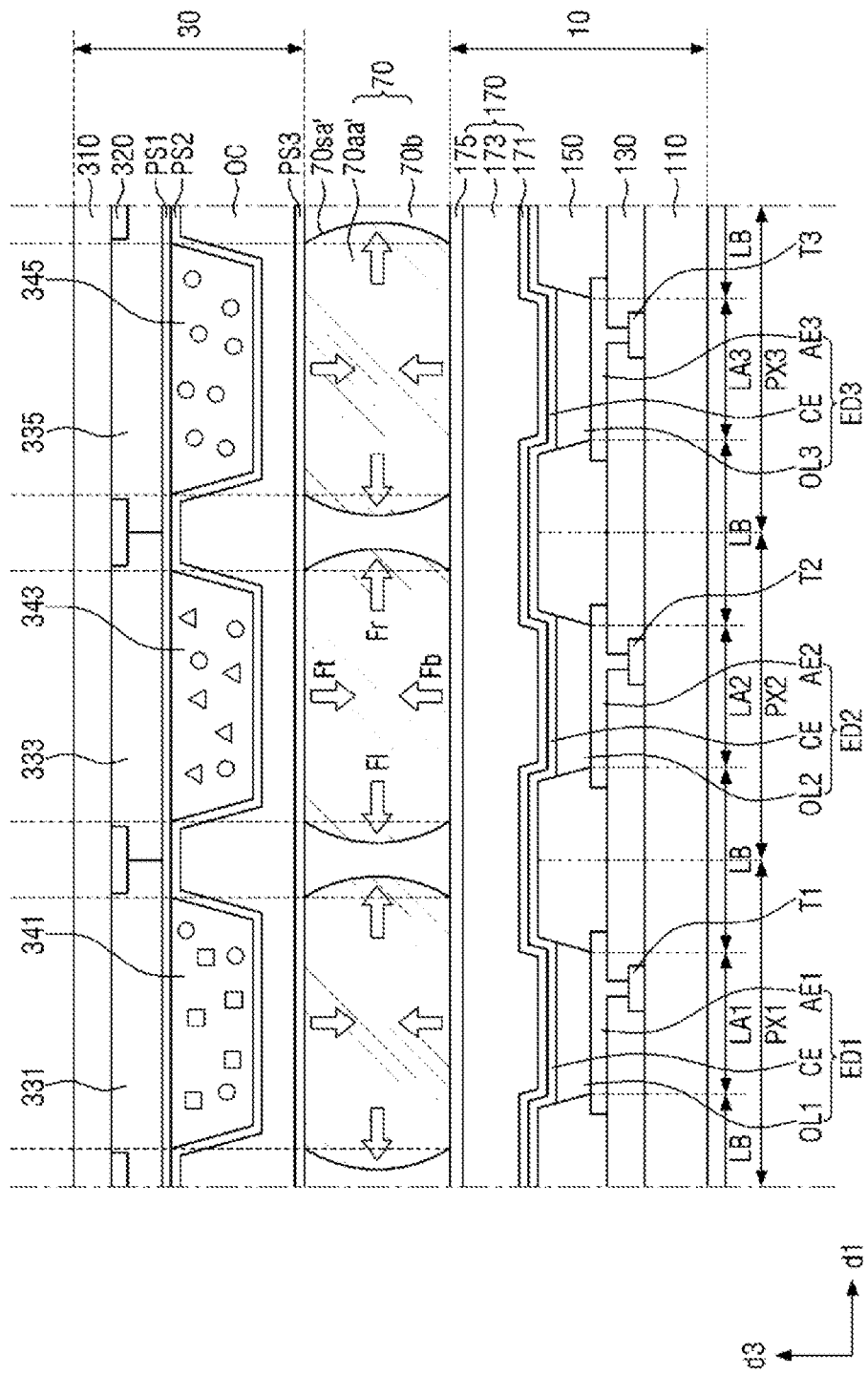
Figure 23:
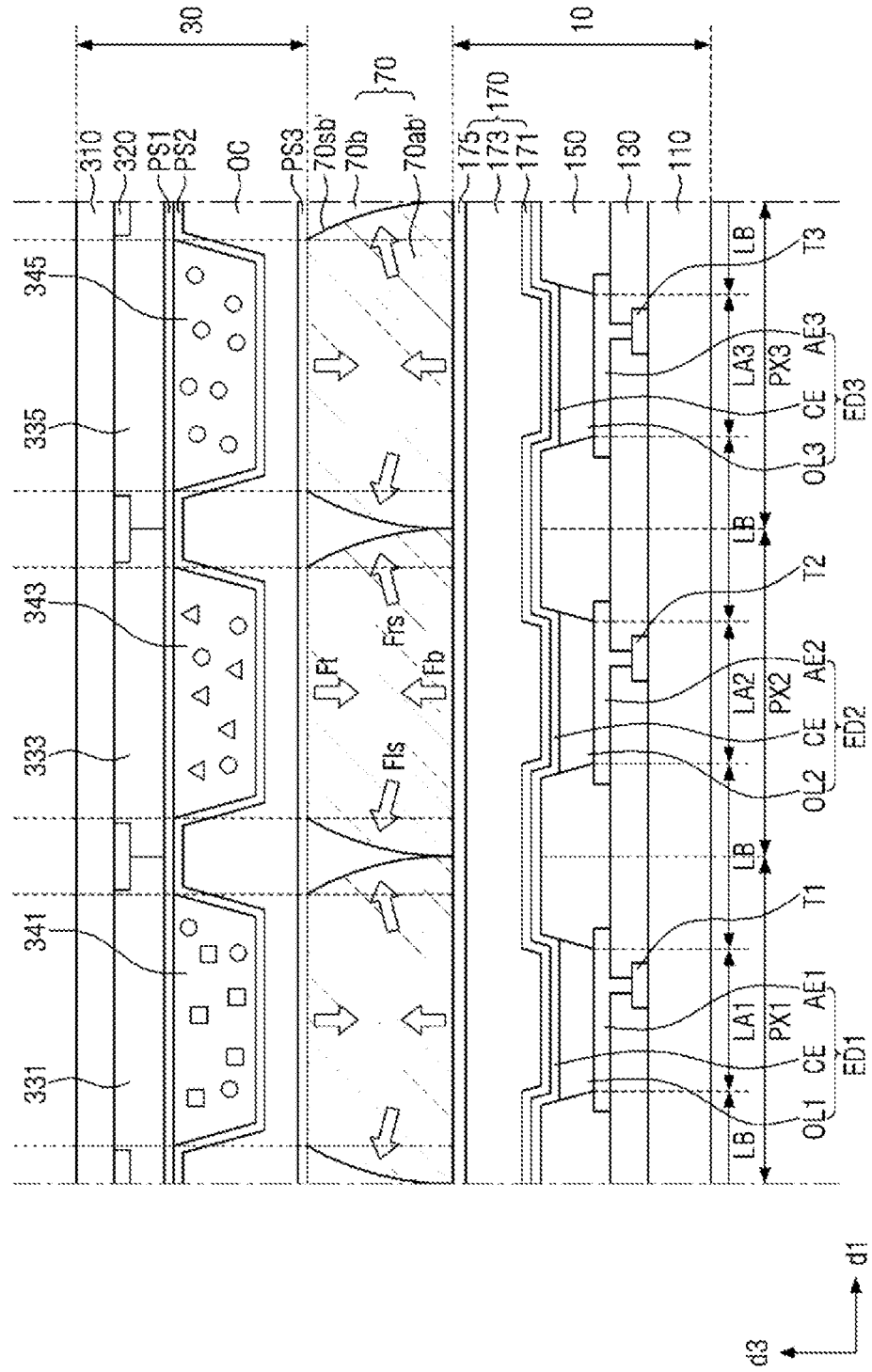

FIGS. 22 and 23 are cross-sectional views illustrating an operation of bonding the first substrate and the second substrate together.

Referring to FIG. 22, the second substrate 30 may be bonded onto the first substrate 10 and the filling pattern layer 70 formed on the first substrate 10. The first substrate 10 and the second substrate 30 may be bonded by, but not limited to, a vacuum assembly system (VAS).

The shape of the filling pattern layer 70 after the bonding process may be the same (e.g., substantially the same) as that of the filling pattern layer 70 before the bonding process. However, the shape of the filling pattern layer 70 can be changed during the bonding process by the VAS. For example, first pattern portions 70aa' of the filling pattern layer 70 of FIG. 22 may be a changed form of the first pattern portions 70aa described in FIG. 20. In the process of bonding the first substrate 10 and the second substrate 30, the first pattern portions 70aa' may receive downward pressure Ft and upward pressure Fb. The downward pressure Ft and the upward pressure Fb applied to the first pattern portions 70aa' may be dispersed as lateral pressures Fl and Fr. For example, side surfaces 70sa' of the first pattern portions 70aa' may be forced to protrude outward by the lateral pressures Fl and Fr. Accordingly, the side surfaces 70sa' of the first pattern portions 70aa' may be curved. The display device 1_8 described in the embodiment of FIG. 18 may be formed through the above process.

FIG. 23 illustrates a change in the shape of the filling pattern layer 70 during the bonding process by the VAS, like FIG. 22 described above.

Referring to FIG. 23, the second substrate 30 may be bonded onto the first substrate 10 and the filling pattern layer 70 formed on the first substrate 10. First pattern portions 70ab' of the filling pattern layer 70 may be a changed form of the first pattern portions 70ab described in FIG. 21. In the process of bonding the first substrate 10 and the second substrate 30, the first pattern portions 70ab' may receive downward pressure Ft and upward pressure Fb. The downward pressure Ft and the upward pressure Fb applied to the first pattern portions 70ab' may be dispersed as lateral pressures Fls and Frs. For example, side surfaces 70sb' of the first pattern portions 70ab' may be forced to protrude outward by the lateral pressures Fls and Frs. Accordingly, the side surfaces 70sb' of the first pattern portions 70ab' forced to protrude by the lateral pressures Fls and Frs may be curved.

FIGS. 24-27 illustrate a method of manufacturing a display device by forming a filling pattern layer on a second substrate and then bonding a first substrate and the second substrate together. The embodiment of FIGS. 24-27 is different from the embodiment of FIGS. 19-23 in that a display device is manufactured by forming a filling pattern layer not on a first substrate but on a second substrate and then bonding the first substrate and the second substrate together. Thus, differences from the above-described embodiment will be mainly described below.

Figure 24:
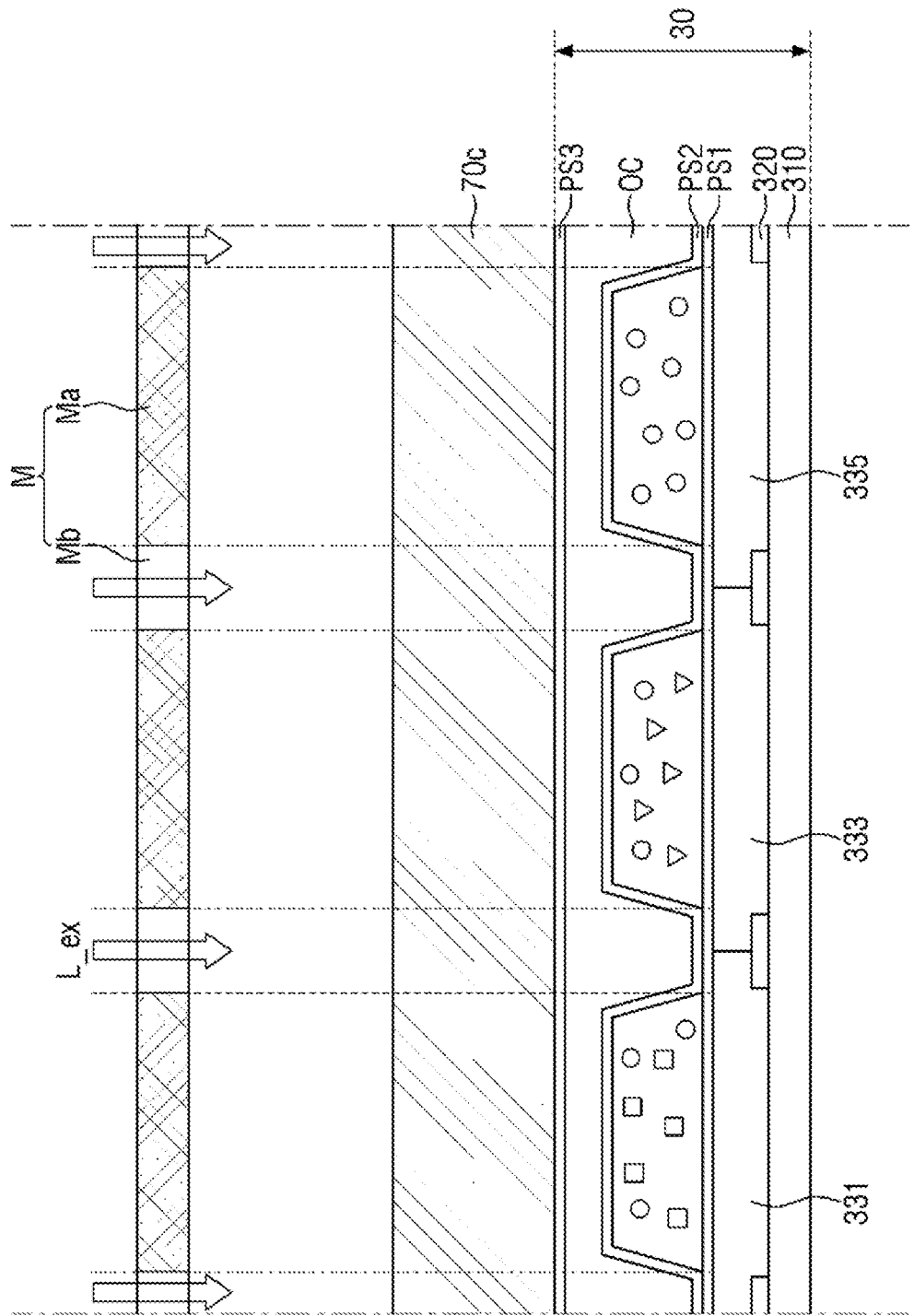
FIGS. 24-27 illustrate a method of manufacturing a display device by forming a filling pattern layer on a second substrate and then bonding a first substrate and the second substrate together.

FIG. 24 illustrates an operation of forming a filling pattern layer on a second substrate. Referring to FIG. 24, a filler 70c may be placed on a second substrate 30. A mask M may be placed above the second substrate 30 and the filler 70c.

The mask M may be placed and aligned above the second substrate 30. Exposure light L_ex may be irradiated to the second substrate 30 from above the mask M. Some of the exposure light L_ex may be blocked by light shielding portions Ma of the mask M, and the other exposure light L_ex may be transmitted through light transmitting portions Mb and irradiated to the filler 70c on the second substrate 30. Regions which are overlapped by the light shielding portions Ma and in which the filler 70c is not irradiated with the exposure light L_ex may become first pattern portions, and regions which are overlapped by the light transmitting portions Mb and in which the filler 70c is irradiated with the exposure light L_ex may become second portions. However, the opposite may also be the case as described above in FIG. 19.

Figure 25:
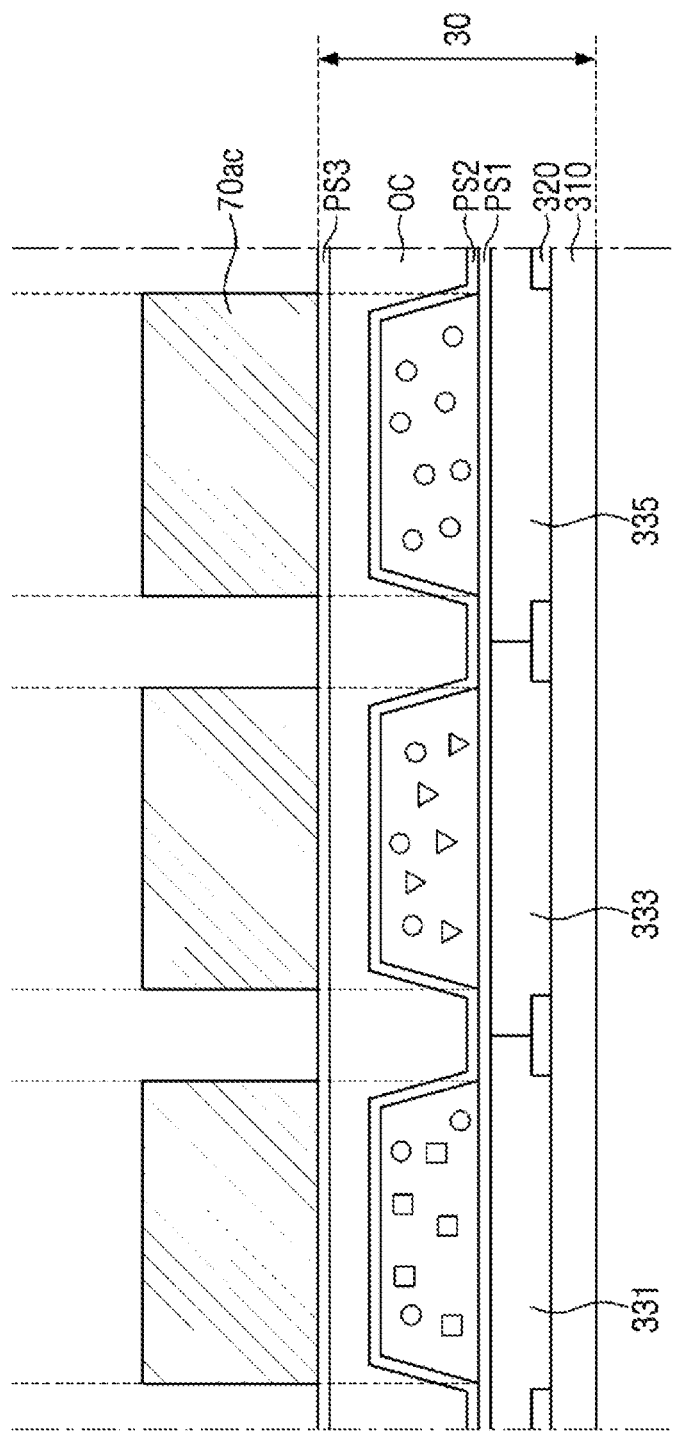
Figure 26:
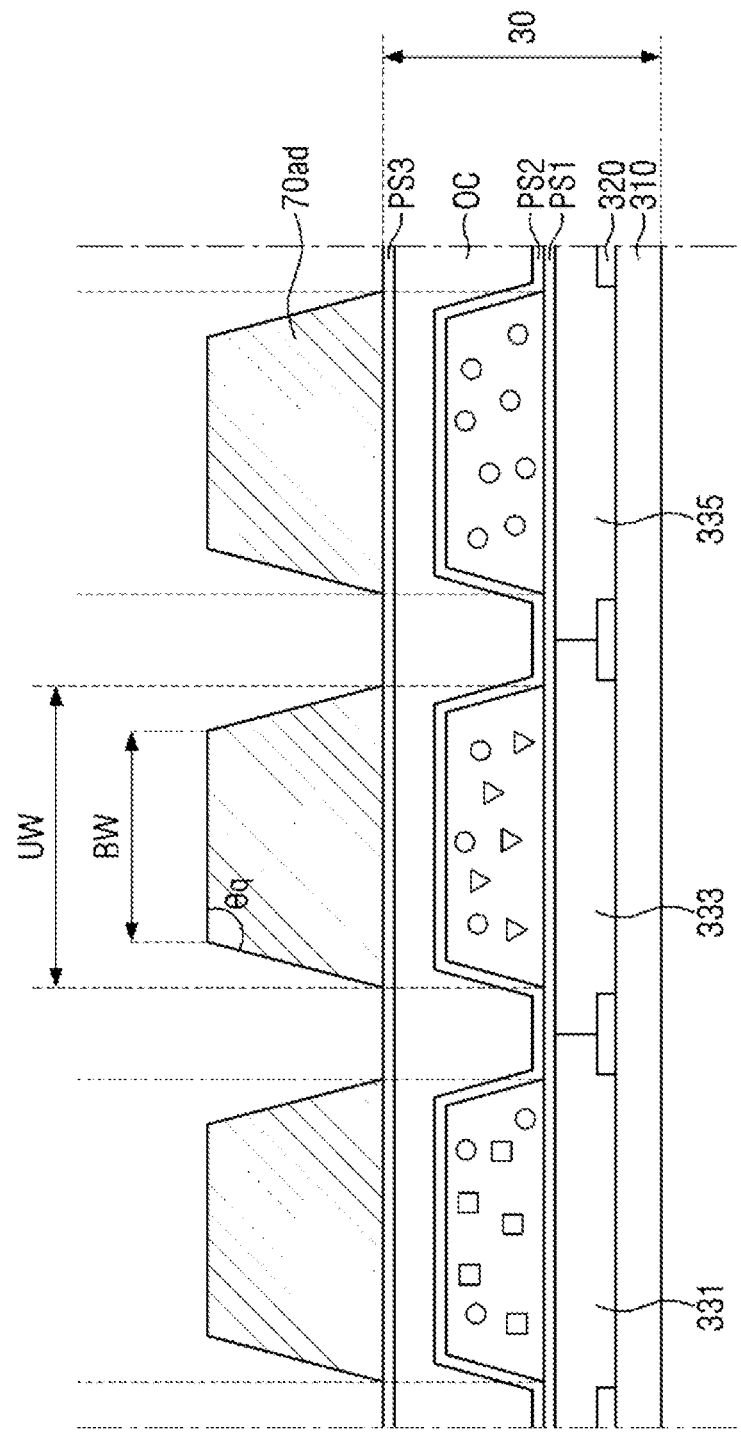

FIGS. 25 and 26 illustrate embodiments of a filling pattern layer formed according the filling pattern layer forming method of FIG. 24.

FIG. 25 illustrates first pattern portions 70ac of a filling pattern layer formed by removing the filler 70c in the regions to which the exposure light L_ex is irradiated through the light transmitting portions Mb as described in FIG. 24. When the filler 70c in the regions irradiated with the exposure light L_ex is completely removed, the first pattern portions 70ac having a rectangular cross-sectional shape may be formed as illustrated in FIG. 25.

FIG. 26 illustrates first pattern portions 70ad of a filling pattern layer formed by removing the filler 70c in the regions to which the exposure light L_ex is irradiated as described in FIG. 24. When the filler 70c in the regions irradiated with the exposure light L_ex is partially removed, the first pattern portions 70ad having a trapezoidal cross-sectional shape may be formed as illustrated in FIG. 26.

Figure 27:
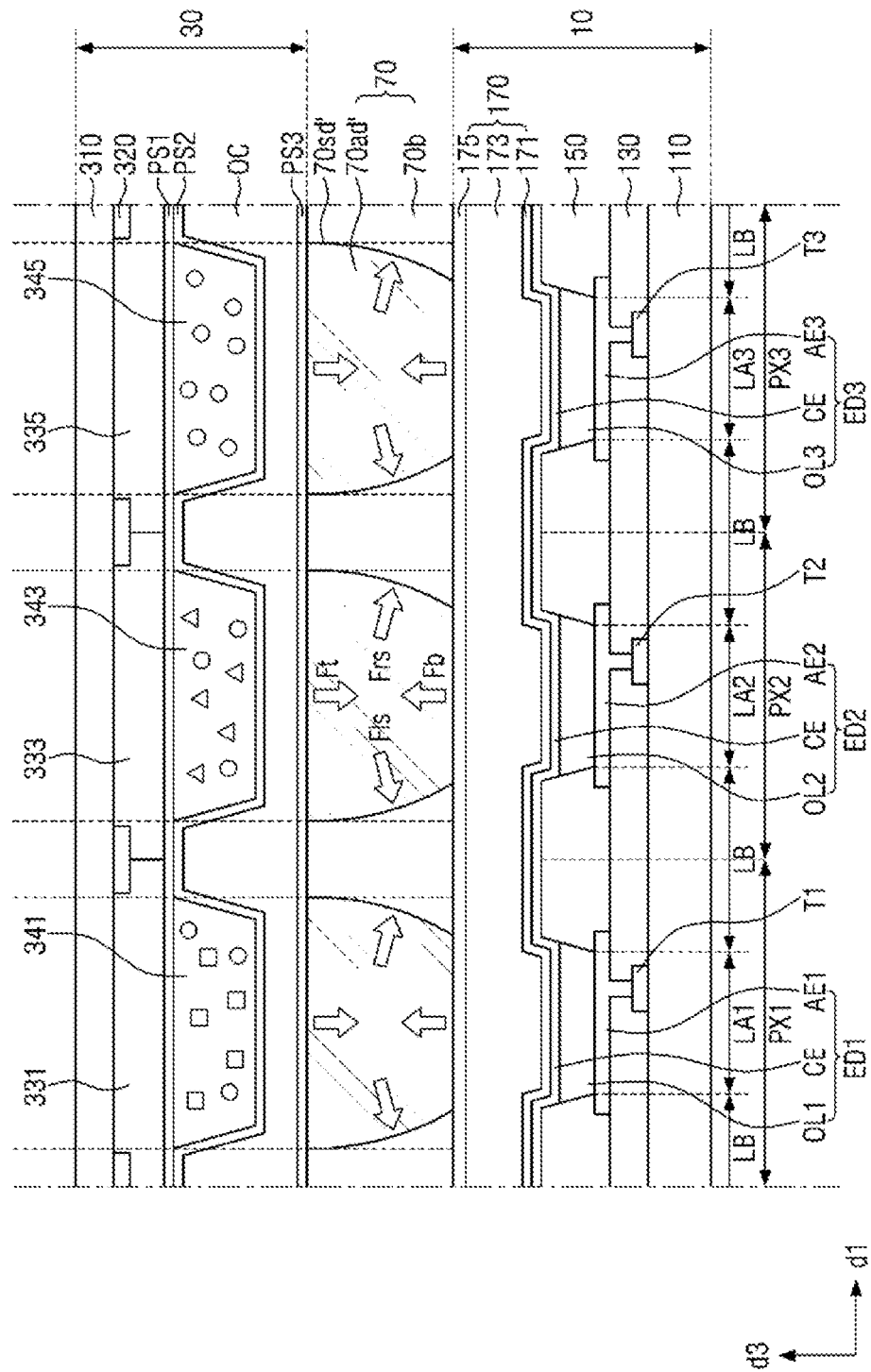

FIG. 27 is a cross-sectional view illustrating an operation of bonding the first substrate and the second substrate together.

Referring to FIG. 27, a first substrate 10 may be bonded onto the second substrate 30 and the filling pattern layer 70 formed on the second substrate 30. The first substrate 10 and the second substrate 30 may be bonded by a VAS.

The shape of the filling pattern layer 70 can be changed during the bonding process by the VAS. For example, first pattern portions 70ad' of the filling pattern layer 70 of FIG. 27 may be a changed form of the first pattern portions 70ad described in FIG. 26. In the process of bonding the first substrate 10 and the second substrate 30, the first pattern portions 70ad' may receive downward pressure Ft and upward pressure Fb. The downward pressure Ft and the upward pressure Fb applied to the first pattern portions 70ad' may be dispersed as lateral pressures Fls and Frs. For example, side surfaces 70sd' of the first pattern portions 70ad' may be forced to protrude outward by the lateral pressures Fls and Frs. Accordingly, the side surfaces 70sd' of the first pattern portions 70ad' may be curved.

FIGS. 28-32 are plan views of first substrates and filling pattern layers formed on the first substrates according to various embodiments. The materials of the filling pattern layers are the same (e.g., substantially the same) as those of the above-described embodiments, and thus, a duplicative description thereof will not be repeated here. The planar shapes and arrangements of first and second pattern portions of the filling pattern layers will be described below.

Referring to FIG. 28, a filling pattern layer 70_9 may be formed on a first substrate 10_9. The filling pattern layer 70_9 may include first pattern portions 70a_9 and second pattern portions 70b_9. For example, FIG. 28 may be a plan view of the display device 1 illustrated in FIG. 10.

The first pattern portions 70a_9 may be substantially rectangular and in a first pixel PX1, a second pixel PX2, a third pixel PX3, and a fourth pixel PX4, respectively. The first pattern portions 70a_9 may overlap and cover a first light emitting region LA1, a second light emitting region LA2, a third light emitting region LA3, and a third light emitting region, respectively. For example, the area of each of the first pattern portions 70a_9 in a plan view may be larger than that of each of the first light emitting region LA1, the second light emitting region LA2, the third light emitting region LA3, and the fourth light emitting region LA4. The first pattern portions 70a_9 may be spaced apart from each other. For example, the first pattern portions 70a_9 may be arranged as islands.

The second pattern portions 70b_9 may be in regions other than the regions in which the first pattern portions 70a_9 are located. For example, the second pattern portions 70b_9 may be between the first pattern portions 70a_9. In addition, the second pattern portions 70b_9 may be between a sealing portion 50 (see FIG. 2) in a non-display area NDA and the first pattern portions 70a_9. However, the present disclosure is not limited thereto. For example, the first pattern portions 70a_9 and the sealing portion 50 (see FIG. 2) may also contact each other.

Figure 29:
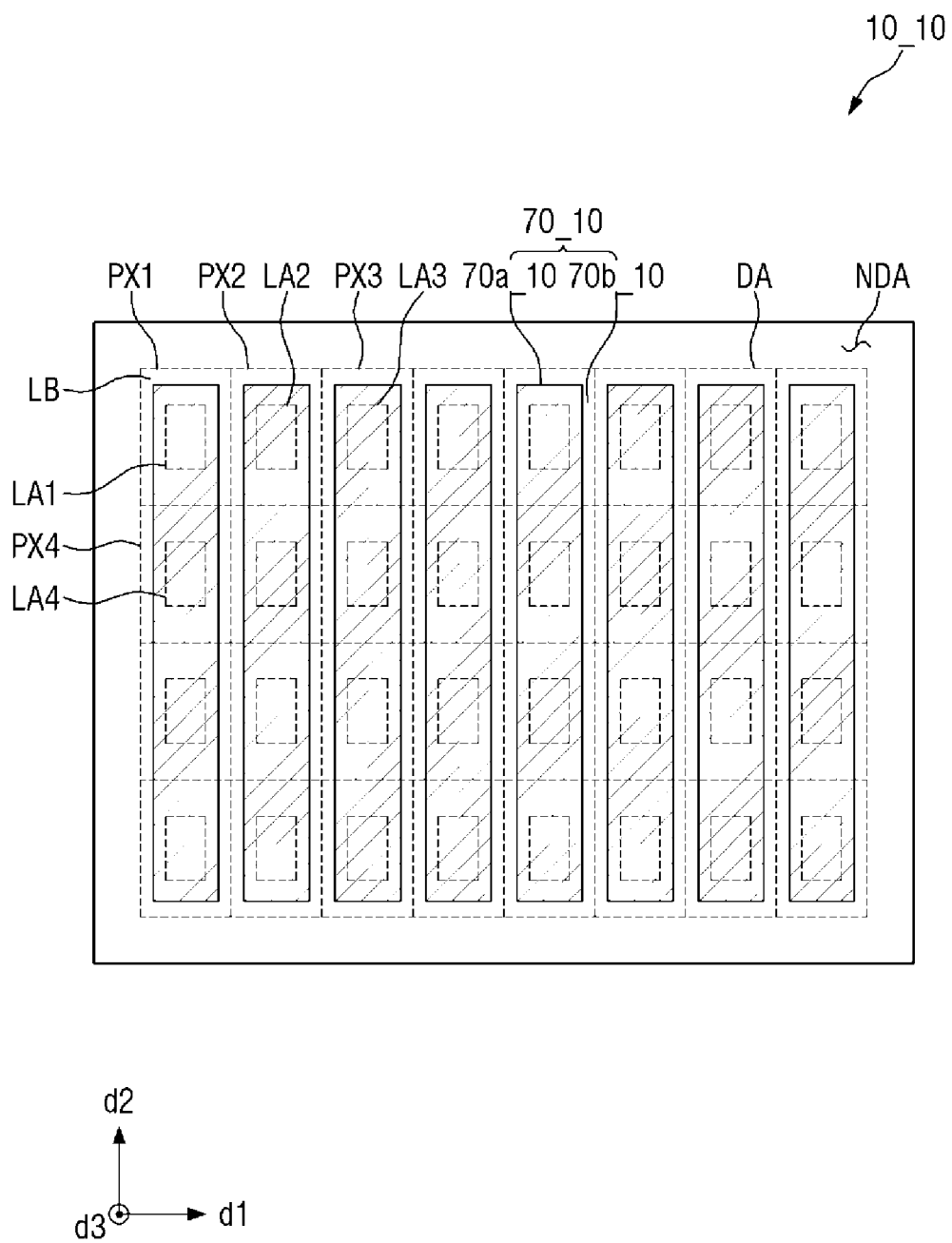

The embodiment of FIG. 29 is different from the embodiment of FIG. 28 in that first pattern portions 70a_10 extend in a direction. For example, FIG. 29 may be a plan view of the display device 1_1 illustrated in FIG. 11.

Referring to FIG. 29, the first pattern portions 70a_10 may extend in the second direction d2. However, the present disclosure is not limited to this case, and the first pattern portions 70a_10 may also extend in the first direction d1. When there is no possibility of color mixing between the first pixel PX1, the second pixel PX2, the third pixel PX3, and the fourth pixel PX4, in other words, when the first pixel PX1, the second pixel PX2, the third pixel PX3, and the fourth pixel PX4 respectively covered by the first pattern portions 70a_10 emit light of the same (e.g., substantially the same) color, the first pattern portions 70a_10 may be formed in an elongated shape to prevent or reduce color mixing between the pixels PX. For example, the first pixel PX1 and the fourth pixel PX4 may be pixels that emit light of the first color. The second pixel PX2 may emit light of the second color, and the third pixel PX3 may emit light of the third color. For example, the first pattern portions 70a_10 in the first pixel PX1 and the fourth pixel PX4 may be spaced apart from the first pattern portions 70a_10 in the second pixel PX2 and the third pixel PX3.

Figure 30:
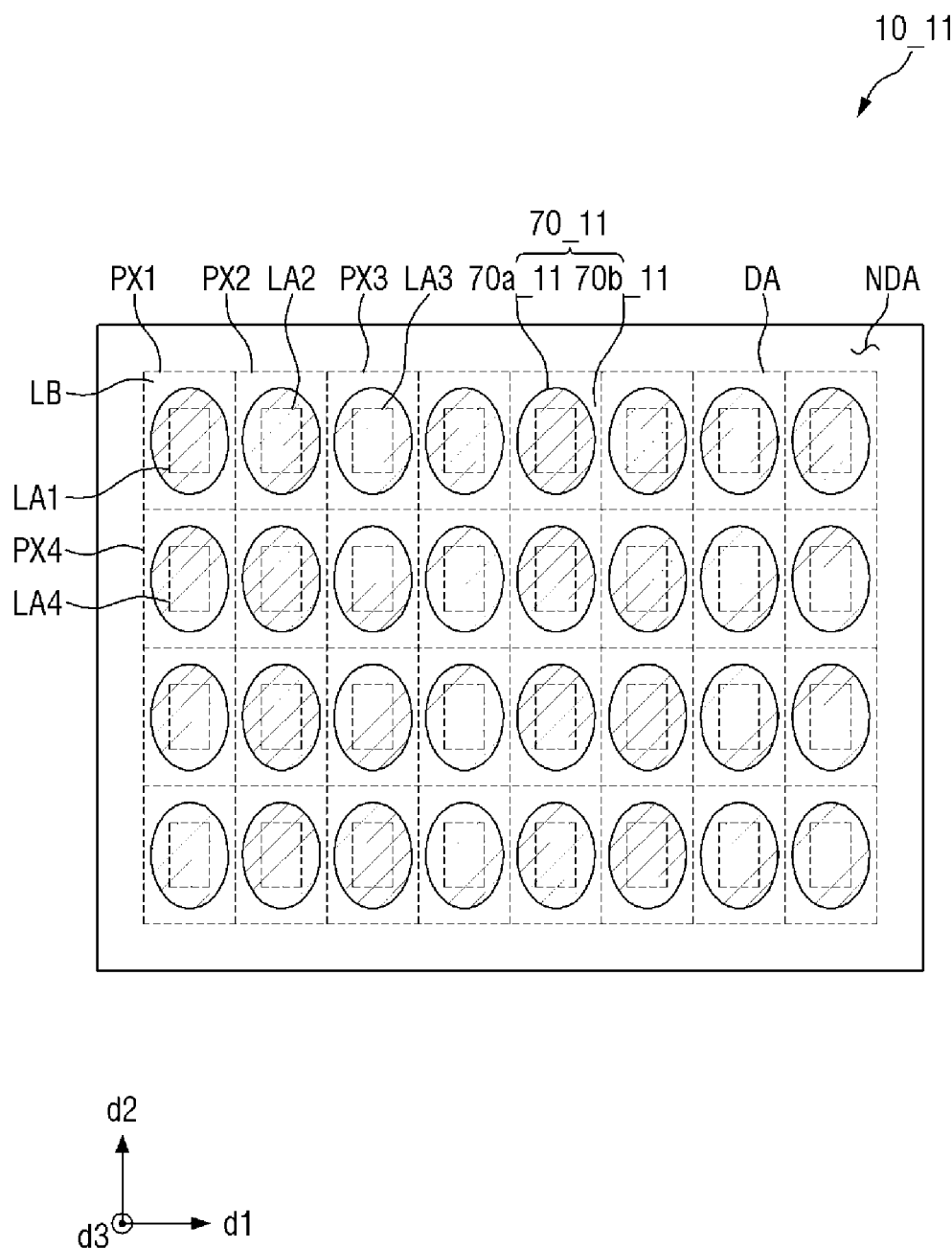
Figure 31:
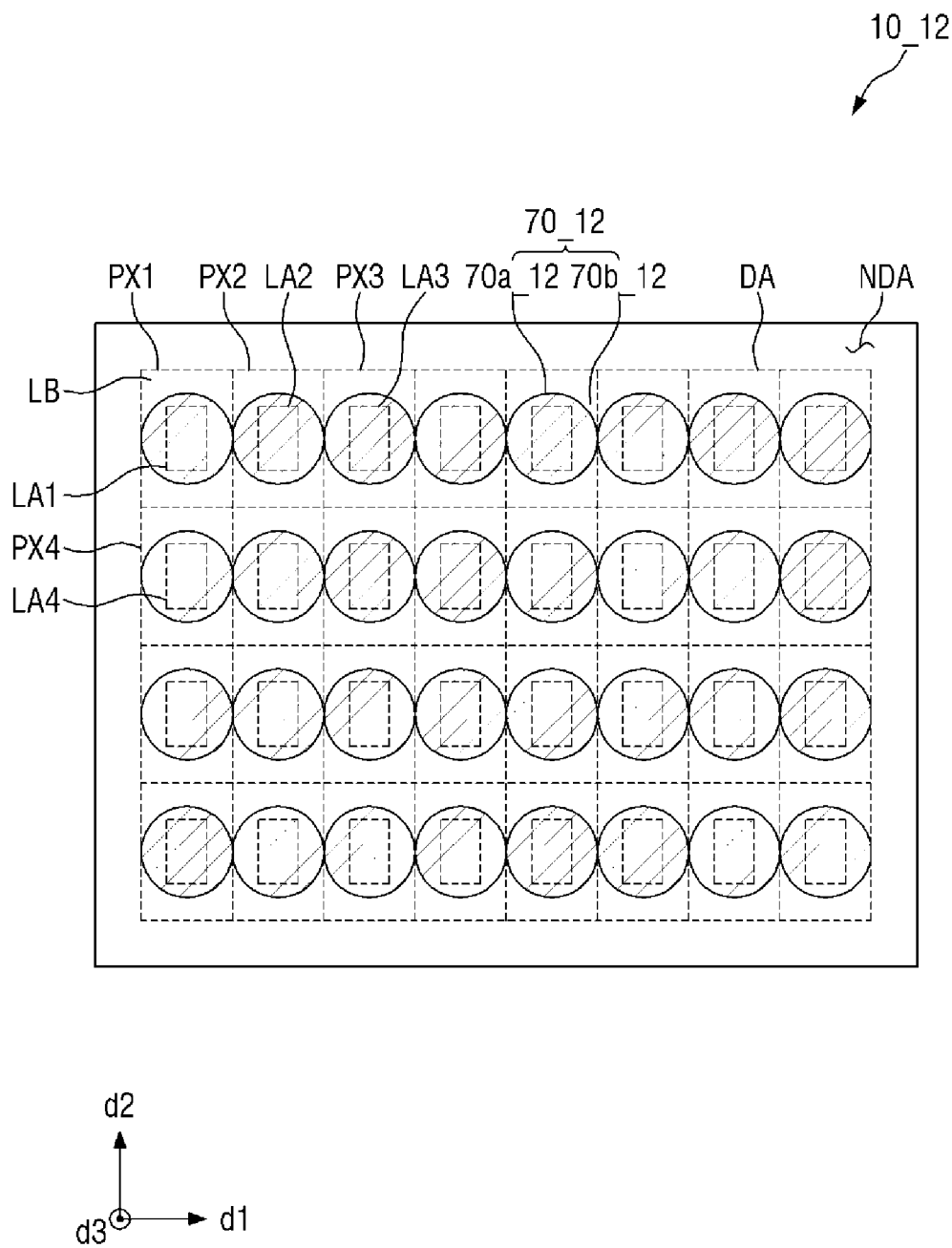

The embodiments of FIGS. 30 and 31 are different from the embodiment of FIG. 28 in that first pattern portions 70a_11 and 70a_12 include curved surfaces in a plan view.

Referring to FIG. 30, the first pattern portions 70a_11 may be in the first pixel PX1, the second pixel PX2, the third pixel PX3, and the fourth pixel PX4, respectively. At least one surface of each of the first pattern portions 70a_11 may be curved. Although the first pattern portions 70a_11 are elliptical in a plan view in FIG. 30, the shape of the first pattern portions 70a_11 is not limited to the elliptical shape. For example, when the first pattern portions 70a_11 are formed by an inkjet process, they may be formed in a circular shape due to surface tension of a composition for forming filling patterns.

The first pattern portions 70a_11 may be spaced apart from each other, but the present disclosure is not limited to this case. For example, referring to FIG. 31, the first pattern portions 70a_12 located respectively in the first pixel PX1, the second pixel PX2, the third pixel PX3, and the fourth pixel PX4 may at least partially overlap each other.

Figure 32:
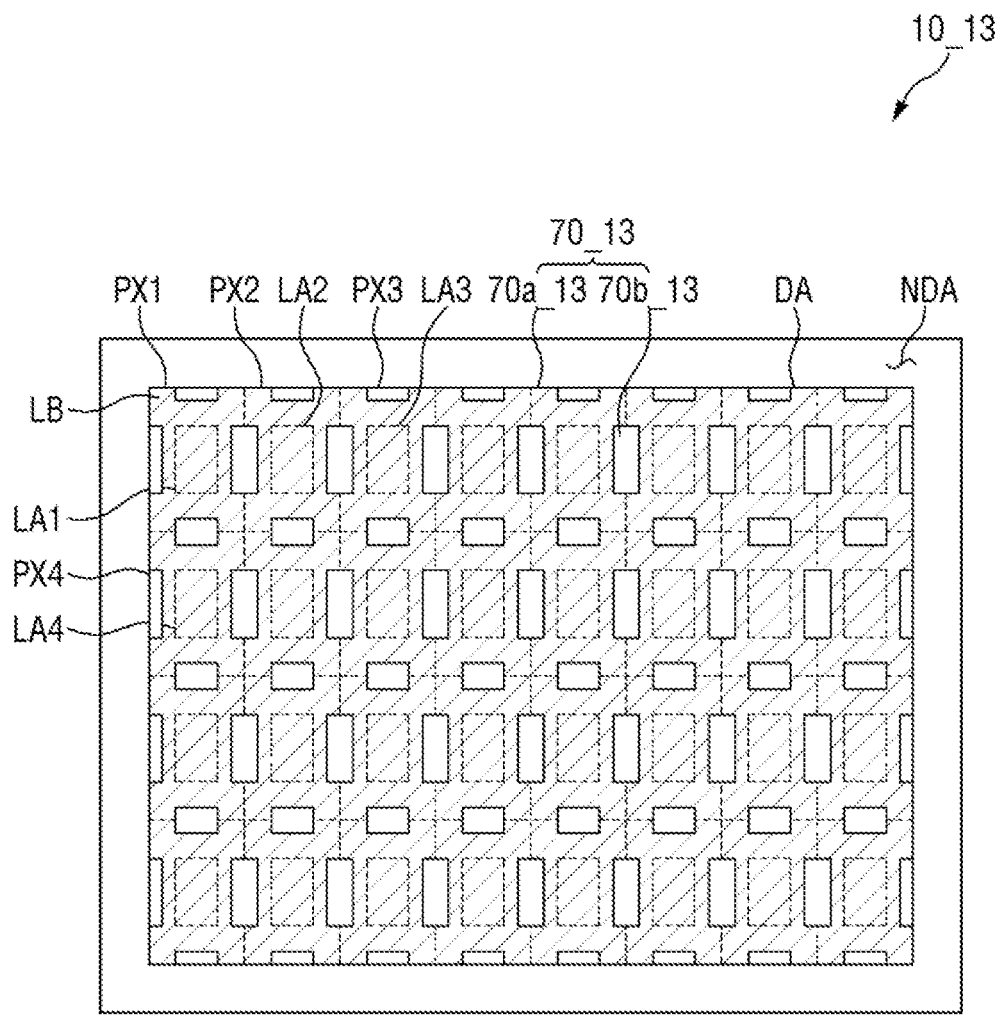

The embodiment of FIG. 32 is different from the above-described embodiments in that first pattern portions are not spaced apart from each other but are entirely in a display area and a second pattern portion is adjacent to each light emitting region. For example, the first pattern portions are coupled to each other, and the second pattern portions may be spaced apart from each other.

Referring to FIG. 32, first pattern portions 70a_13 may be on the whole of a display area DA of a first substrate 10_13. For example, the first pattern portions 70a_13 may be coupled to each other, unlike in the above-described embodiments. Second pattern portions 70b_13 may be between the first light emitting region LA1, the second light emitting region LA2, and the third light emitting region LA3 and spaced apart from each other. When the second pattern portions 70b_13 are spaced apart from each other, some of the light emitted from the first light emitting region LA1, the second light emitting region LA2, the third light emitting region LA3, or the fourth light emitting region LA4 may be output to a space between the second pattern portions 70b_13. However, since the second pattern portions 70b_13 are on all sides of each of the first light emitting region LA1, the second light emitting region LA2, the third light emitting region LA3, or the fourth light emitting region LA4, most of the light may be totally reflected, reflected or refracted at boundary surfaces between the first and second pattern portions 70a_13 and 70b_13. Accordingly, this prevents or reduces the color mixing between pixels.

A display device according to an embodiment can have improved luminance and color reproducibility by preventing or reducing color mixing between subpixels.

A display device according to an embodiment can have improved luminous efficiency.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

However, the effects of the embodiments of the present disclosure are not restricted to the one set forth herein. The above and other effects of the embodiments will become more apparent to one of daily skill in the art to which the embodiments pertain by referencing the claims, and equivalents thereof.

In concluding the detailed description, those skilled in the art will appreciate that many variations and modifications can be made to the disclosed embodiments without substantially departing from the principles of the present disclosure. Therefore, the disclosed embodiments of the present disclosure are used in a generic and descriptive sense only and not for purposes of limitation.

What is claimed is:

1. A display device comprising:
    a plurality of pixels;
    a first base;
    an organic light emitting element on the first base and in each of the pixels;
    a second base facing the first base; and
    a filling pattern layer between the organic light emitting elements and the second base, the filling pattern layer comprising a first pattern portion and a second pattern portion alternately arranged along a same direction in a plan view,
    wherein the first pattern portion is in each of the pixels, the second pattern portion is at a boundary of each of the pixels and contacts the first pattern portion,
    wherein a refractive index of the second pattern portion is smaller than that of the first pattern portion, and
    wherein the second pattern portion comprises a layer comprising air.

2. The display device of claim 1, wherein the pixels comprise a first pixel configured to emit light of a first color, a second pixel configured to emit light of a second color, and a third pixel configured to emit light of a third color.

3. The display device of claim 2, further comprising:
    a first wavelength conversion pattern between the second base and the filling pattern layer in the first pixel;
    a second wavelength conversion pattern between the second base and the filling pattern layer in the second pixel; and
    a light transmission pattern between the second base and the filling pattern layer in the third pixel.

4. The display device of claim 3, wherein the organic light emitting elements comprise a first organic light emitting element in the first pixel and configured to emit light of the third color, a second organic light emitting element in the second pixel and configured to emit light of the third color, and a third organic light emitting element in the third pixel and configured to emit light of the third color.

5. The display device of claim 4, wherein the light of the first color has a peak wavelength in a range of 610 nm to 670 nm, the light of the second color has a peak wavelength in a range of 510 nm to 550 nm, and the light of the third color has a peak wavelength in a range of 440 nm to 470 nm.

6. The display device of claim 5, further comprising:
    a first color filter between the first base and the first wavelength conversion pattern and configured to transmit the light of the first color while blocking the light of the second color and the light of the third color;
    a second color filter between the first base and the second wavelength conversion pattern and configured to transmit the light of the second color while blocking the light of the first color and the light of the third color; and
    a third color filter between the first base and the light transmission pattern and configured to transmit the light of the third color while blocking the light of the first color and the light of the second color.

7. The display device of claim 3, wherein each of the first wavelength conversion pattern, the second wavelength conversion pattern, and the light transmission pattern comprises a base resin and a scatterer dispersed in the base resin,
    wherein the first wavelength conversion pattern comprises a first wavelength conversion material, and
    wherein the second wavelength conversion pattern comprises a second wavelength conversion material.

8. The display device of claim 7, wherein the scatterer comprises at least one selected from titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$).

9. The display device of claim 1, wherein a difference in refractive index between the first pattern portion and the second pattern portion is 0.3 or more.

10. The display device of claim 1, further comprising a light shielding member on the second base,
    wherein the light shielding member is at the boundary of each of the pixels, and at least partially overlaps the second pattern portion, and
    wherein the light shielding member comprises an organic material.

11. The display device of claim 10, wherein the light shielding member comprises a color filter portion and a light shielding portion on the color filter portion, and wherein the color filter portion is configured to transmit blue light while blocking a first color light and a second color light, and the light shielding portion blocks all light.

12. The display device of claim 10, wherein the first pattern portion comprises a first attachment surface attached to the first base and a second attachment surface parallel to the first attachment surface and attached to the second base.

13. The display device of claim 12, wherein the area of the first attachment surface is equal to that of the second attachment surface.

14. The display device of claim 13, wherein at least a portion of the first pattern portion overlaps the light shielding member, and side surfaces of the first pattern portion are curved.

15. The display device of claim 12, wherein the area of the first attachment surface is larger than that of the second attachment surface, a cross section of the first pattern portion is trapezoidal, and an angle formed by the first attachment surface and each side surface of the first pattern portion in cross section is an acute angle.

16. The display device of claim 15, wherein at least one of the side surfaces of the first pattern portion is curved.

17. The display device of claim 10, wherein a shortest distance between the first pattern portion is the same as or less than width of the light shielding member.

18. A display device comprising:
- a first substrate comprising an organic light emitting element;
- a second substrate facing the first substrate and having a first light outputting region and a non-light outputting region; and
- a filling pattern layer between the first substrate and the second substrate, wherein the second substrate comprises a first wavelength conversion pattern in the first light outputting region that is configured to wavelength-convert light of a first color into light of a second color, wherein the filling pattern layer comprises a first pattern portion overlapping the first wavelength conversion pattern and a second pattern portion that surrounds the first pattern portion and is in the non-light outputting region, and wherein the second pattern portion comprises a layer comprising air.

19. The display device of claim 18, wherein a second light outputting region is defined in a first direction of the first light outputting region, the second substrate comprises a second wavelength conversion pattern configured to wavelength-convert the light of the first color into light of a third color, the first pattern portion overlaps the second wavelength conversion pattern, a third light outputting region is defined in the first direction of the second light outputting region, the second substrate comprises a light transmission pattern in the third light outputting region, and the first pattern portion overlaps the light transmission pattern.

20. The display device of claim 19, wherein a fourth light outputting region is defined in a second direction of the first light outputting region, the second substrate comprises a third wavelength conversion pattern in the fourth light outputting region, the third wavelength conversion pattern is configured to wavelength-convert the light of the first color into the light of the second color, and the first pattern portion is in the non-light outputting region between the first light outputting region and the fourth light outputting region, and wherein the second direction is perpendicular to the first direction in a plan view.

21. The display device of claim 19, wherein a shortest distance between the first pattern portion is the same as or less than a distance between the first light outputting region and the second light outputting region.

* * * * *